United States Patent
Koyama

(10) Patent No.: US 7,197,203 B2
(45) Date of Patent: Mar. 27, 2007

(54) OPTICAL ELEMENT, OPTICAL MODULE, AND OPTICAL TRANSMISSION DEVICE

(75) Inventor: Tomoko Koyama, Hara-mura (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 11/288,461

(22) Filed: Nov. 29, 2005

(65) Prior Publication Data
US 2006/0126695 A1 Jun. 15, 2006

(30) Foreign Application Priority Data
Dec. 15, 2004 (JP) ............................ 2004-363244

(51) Int. Cl.
*G02B 6/12* (2006.01)
(52) U.S. Cl. ..................... 385/14; 372/50.124
(58) Field of Classification Search ............... 385/14; 372/50.124
See application file for complete search history.

(56) References Cited

U.S. PATENT DOCUMENTS

| | | | |
|---|---|---|---|
| 5,568,574 A * | 10/1996 | Tanguay et al. ............... 385/14 |
| 6,222,202 B1 | 4/2001 | Babic et al. |
| 6,574,383 B1 * | 6/2003 | Erchak et al. ................. 385/15 |
| 6,804,283 B2 * | 10/2004 | Scherer ..................... 372/50.21 |
| 2005/0017178 A1 * | 1/2005 | Ogawa et al. ......... 250/339.07 |
| 2005/0047702 A1 * | 3/2005 | Parker et al. ................... 385/1 |
| 2006/0091409 A1 * | 5/2006 | Epler et al. ..................... 257/95 |
| 2006/0097334 A1 * | 5/2006 | Suzuki et al. ................ 257/431 |
| 2006/0202125 A1 * | 9/2006 | Suhami ....................... 250/368 |

FOREIGN PATENT DOCUMENTS

| | | |
|---|---|---|
| JP | 11-004046 | 1/1999 |
| JP | 2000-114658 | 4/2000 |
| JP | 2004-109737 | 4/2004 |

OTHER PUBLICATIONS

M. Notomi, et al., "Lasing Action due to the Two-Dimensional Quasiperiodicity of Photonic Quasicrystals with a Penrose Lattice", Physical Review Letters, The American Physical Society, vol. 92, No. 12, pp. 123906-1-123906-4 (2004).

* cited by examiner

*Primary Examiner*—Ellen E. Kim
(74) *Attorney, Agent, or Firm*—Harness, Dickey & Pierce, P.L.C.

(57) ABSTRACT

An optical element includes a substrate, a surface-emitting type semiconductor laser above the substrate and including a first mirror, an active layer and a second mirror formed in this order from the substrate side, a first optical detection section formed above the substrate, a second optical detection section above the substrate and having a second photoabsorption layer, and an isolation layer between the surface-emitting type semiconductor laser and at least one of the first optical detection section and the second optical detection section. The first optical detection section includes a first photoabsorption layer above the substrate and a photonic crystal section above or below the first photoabsorption layer. The photonic crystal section has a one or a two dimensional photonic crystal structure having a periodic refractive index distribution in a plane that intersects a direction of light incident upon the first optical detection section.

19 Claims, 34 Drawing Sheets

US 7,197,203 B2

OPTICAL ELEMENT, OPTICAL MODULE, AND OPTICAL TRANSMISSION DEVICE

The entire disclosure of Japanese Patent Application No. 2004-363244, filed Dec. 15, 2004 is expressly incorporated by reference herein.

BACKGROUND

1. Technical Field

The present invention relates to optical elements, optical modules, and optical transmission devices.

2. Related Art

Surface-emitting type semiconductor lasers have a characteristic in that their optical output changes according to the surrounding temperature. For this reason, an optical module using a surface-emitting type semiconductor laser may be provided with an optical detection function that detects a part of laser light emitted from the surface-emitting type semiconductor laser to monitor its light output value. For example, an optical detection device such as a photo diode may be provided on a surface-emitting type semiconductor laser, whereby a part of laser light emitted from the surface-emitting type semiconductor laser can be monitored within the same device. For example, such a technique is described in JP-A-2000-114658.

Also, photonic ICs are being developed for conducting two-way communications with a single optical fiber by using a structure similar to the aforementioned structure in which a photodiode is laminated on a surface-emitting type semiconductor laser. For example, such a technology is described in J-A-11-4046.

SUMMARY

In accordance with an advantage of some aspects of the present invention, there is provided an optical element that includes a surface-emitting type semiconductor laser and an optical detection section with a high level of photo-responsiveness in detecting received light. Also, in accordance with an aspect of the invention, an optical module and an optical transmission device including the optical element are provided.

In accordance with an embodiment of the invention, an optical element includes a substrate, a surface-emitting type semiconductor laser that is provided above the substrate and includes a first mirror, an active layer and a second mirror formed in this order from the substrate side, a first optical detection section formed above the substrate, a second optical detection section that is formed above the substrate and has a second photoabsorption layer, and an isolation layer formed between the surface-emitting type semiconductor laser and at least one of the first optical detection section and the second optical detection section.

According to an aspect of the embodiment, the first optical detection section includes a first photoabsorption layer formed above the substrate and a photonic crystal section formed above or below the first photoabsorption layer, wherein the photonic crystal section has a one-dimensional or a two-dimensional photonic crystal structure having a periodic refractive index distribution in a plane that intersects a direction of light incident upon the first optical detection section, wherein at least a part of the light incident upon the first optical detection section is distributed in a plane of the first photoabsorption layer and propagates therein.

The first optical detection section may function as a photodetecting element for reception for two-way communications, and the second optical detection section may function as a photodetecting element for monitoring for the surface-emitting type semiconductor laser. Alternatively, the first optical detection section may function as a photodetecting element for monitoring for the surface-emitting type semiconductor laser, and the second optical detection section may function as a photodetecting element for reception for two-way communications.

According to the optical element described above, in the photonic crystal section, at least a part of incident light with a predetermined wavelength that is to be absorbed by the first photoabsorption layer propagates while being distributed in a plane thereof. This causes a state in which the incident light spreads in a plane of the first photoabsorption layer. As a result, the first photoabsorption layer can effectively absorb light.

It is noted that, in the present embodiment, a specific object (hereafter referred to as "B") formed above another specific object (hereafter referred to as "A") includes B directly formed on A, and B formed above A through another object on A. Also, in the present specification, forming B above A includes a case of forming B directly on A, and a case of forming B above A through another object on A.

Also, in the present embodiment, the term "periodic" refers to a concept including "psuedoperiodic." In other words, a photonic crystal section in the present embodiment includes a section having a periodic photonic crystal structure and a section having a psuedoperiodic photonic crystal structure. As the psuedoperiodic photonic crystal structure, for example, a photonic quasicrystal structure (for example, see M. Notomi, H. Suzuki, T. Tamamura, and K. Edagawa, Phys. Rev. Lett. 92 (2004) 123906.) or a circle coordinate photonic crystal structure (for example, see JP-A-2004-109737) can be enumerated.

In the present embodiment, the Al composition of an AlGaAs layer is a composition of aluminum (Al) with respect to the group III elements. The Al composition of an AlGaAs layer in the present embodiment may range from 0 to 1. In other words, an AlGaAs layer may include a GaAs layer (with the Al composition being 0) and an AlAs layer (with the Al composition being 1).

In the optical element in accordance with an aspect of the embodiment, the first optical detection section may further include a first contact layer formed below the first photoabsorption layer, and a second contact layer formed above the photoabsorption layer, wherein the first photoabsorption layer may be formed from a semiconductor and the second conductive layer may have the photonic crystal section.

In the optical element in accordance with an aspect of the present embodiment, the first optical detection section may include a base section that is formed below the first photoabsorption layer and has a concave section, a first electrode formed at least inside the concave section, a second electrode formed above the first photoabsorption layer, and a charge transfer layer formed at least one of spaces between the first electrode and the first photoabsorption layer and between the second electrode and the first photoabsorption layer, wherein the first photoabsorption layer may be formed from an organic material, and the charge transfer layer may have the photonic crystal section.

In accordance with another embodiment of the invention, an optical element includes a substrate, a surface-emitting type semiconductor laser that is provided above the substrate and includes a first mirror, an active layer and a second mirror formed in this order from the substrate side, a first optical detection section that is formed above the substrate and has a first photoabsorption layer, a second optical detection section that is formed above the substrate and has a second photoabsorption layer, and an isolation layer formed between the surface-emitting type semiconductor laser and at least one of the first optical detection section and the second optical detection section.

According to an aspect of the present embodiment, the first optical detection section has a photonic crystal section, wherein the photonic crystal section has a one-dimensional or a two-dimensional photonic crystal structure having a periodic refractive index distribution in a plane that intersects a direction of light incident upon the first optical detection section, wherein at least a part of the light incident upon the first optical detection section is distributed in a plane of the first photoabsorption layer and propagates therein.

The first optical detection section may function as a photodetecting element for reception for two-way communications, and the second optical detection section may function as a photodetecting element for monitoring for the surface-emitting type semiconductor laser. Alternatively, the first optical detection section may function as a photodetecting element for monitoring for the surface-emitting type semiconductor laser, and the second optical detection section may function as a photodetecting element for reception for two-way communications.

According to the optical element described above, in the photonic crystal section, at least a part of incident light with a predetermined wavelength that is to be absorbed by the first photoabsorption layer propagates while being distributed in a plane therein. This causes a state in which the incident light spreads in a plane of the first photoabsorption layer. As a result, the first photoabsorption layer can effectively absorb light.

In the optical element in accordance with an aspect of the present embodiment, the first optical detection section may include a base section that is formed below the first photoabsorption layer and has a concave section, a first electrode formed at least inside the concave section, and a second electrode formed above the first photoabsorption layer, wherein the concave section may have a bottom surface with a plurality of protruded sections that are periodically arranged, and the first photoabsorption layer may be formed from an organic material to cover the plurality of protruded sections.

In the optical element in accordance with an aspect of the present embodiment, the first optical detection section may be formed above the second mirror, and the second optical detection section may be formed above the second mirror.

The optical element in accordance with an aspect of the present embodiment may further include an isolation layer formed between the first optical detection section and the second optical detection section, wherein the surface-emitting type semiconductor laser may be formed above the second optical detection section, the isolation layer may be formed between the surface-emitting type semiconductor laser and the second optical detection section, the first optical detection section may function as a photodetecting element for reception for two-way communications, and the second optical detection section may function as a photodetecting element for monitoring for the surface-emitting type semiconductor laser.

In the optical element in accordance with an aspect of the present embodiment, the photonic crystal section may have at least one of a set of grooves, a set of holes and a set of columnar protrusions, which are periodically arranged.

In the optical element in accordance with an aspect of the present embodiment, the second optical detection section may include another photonic crystal section that is formed above or below the second photoabsorption layer, wherein the other photonic crystal section may have a one-dimensional or a two-dimensional photonic crystal structure having a periodic refractive index distribution in a plane that intersects a direction of light incident upon the second optical detection section, wherein at least a part of the light incident upon the second optical detection section is distributed in a plane of the second photoabsorption layer and propagates therein.

In the optical element in accordance with an aspect of the present embodiment, the second optical detection section may further include a third contact layer formed below the second photoabsorption layer, and a fourth contact layer formed above the second photoabsorption layer, wherein the second photoabsorption layer is formed from a semiconductor, and the third contact layer may have the other photonic crystal section.

In the optical element in accordance with an aspect of the present embodiment, the second optical detection section may further include a base section that is formed below the second photoabsorption layer and has a concave section, a third electrode formed at least inside the concave section, a fourth electrode formed above the second photoabsorption layer, and a charge transfer layer formed in at least one of spaces between the third electrode and the second photoabsorption layer and between the fourth electrode and the second photoabsorption layer, wherein the second photoabsorption layer is formed from an organic material, and the charge transfer layer may have the photonic crystal section.

In the optical element in accordance with an aspect of the present embodiment, the second photoabsorption layer may have another photonic crystal section, wherein the other photonic crystal section may have a one-dimensional or a two-dimensional photonic crystal structure having a periodic refractive index distribution in a plane that intersects a direction of light incident upon the second optical detection section, wherein at least a part of the light incident upon the second optical detection section is distributed in a plane of the second photoabsorption layer and propagates therein.

In the optical element in accordance with an aspect of the present embodiment, the second optical detection section may include a base section that is formed below the second photoabsorption layer and has a concave section, a third electrode formed at least inside the concave section, and a fourth electrode formed above the second photoabsorption layer, wherein the concave section may have a bottom surface with a plurality of protruded sections that are periodically arranged, and the second photoabsorption layer may be formed from an organic material to cover the plurality of protruded sections.

In the optical element in accordance with an aspect of the present embodiment, the other photonic crystal section may have at least one of a set of grooves, a set of holes and a set of columnar protrusions, which are periodically arranged.

The optical element in accordance with an aspect of the present embodiment may further include at least one of a first optical reflection layer that is formed above or below the first photoabsorption layer on a side opposite to the side in which light is incident upon the first photoabsorption layer and a second optical reflection layer that is formed above or below the second photoabsorption layer on a side opposite to the side in which light is incident upon the second photoabsorption layer, wherein the first optical reflection layer may be a laminate layer that is composed of a plurality of semiconductor layers having different refractive indexes and can reflect light that passes through the first photoabsorption layer, and the second optical reflection layer may be a laminate layer that is composed of a plurality of semiconductor layers having different refractive indexes and can reflect light that passes through the second photoabsorption layer.

The optical element in accordance with an aspect of the present embodiment may further include at least one of a first non-reflecting coat layer that is formed above or below the first photoabsorption layer on a side where light is incident upon the first photoabsorption layer, and a second non-reflecting coat layer that is formed above or below the second photoabsorption layer on a side where light is incident upon the second photoabsorption layer.

The optical element in accordance with an aspect of the present embodiment may further include a lens section formed by a droplet discharge method above at least one of the first optical detection section and the second optical detection section.

An optical module in accordance with an embodiment of the invention includes any one of the optical elements described above, and an optical waveguide.

An optical transmission in accordance with an embodiment of the invention includes the optical module described above.

DESCRIPTION OF EXEMPLARY EMBODIMENTS

Preferred embodiments of the invention are described below with reference to the accompanying drawings.

1. First Embodiment 1-1. Structure of Optical Element

Figure 1:
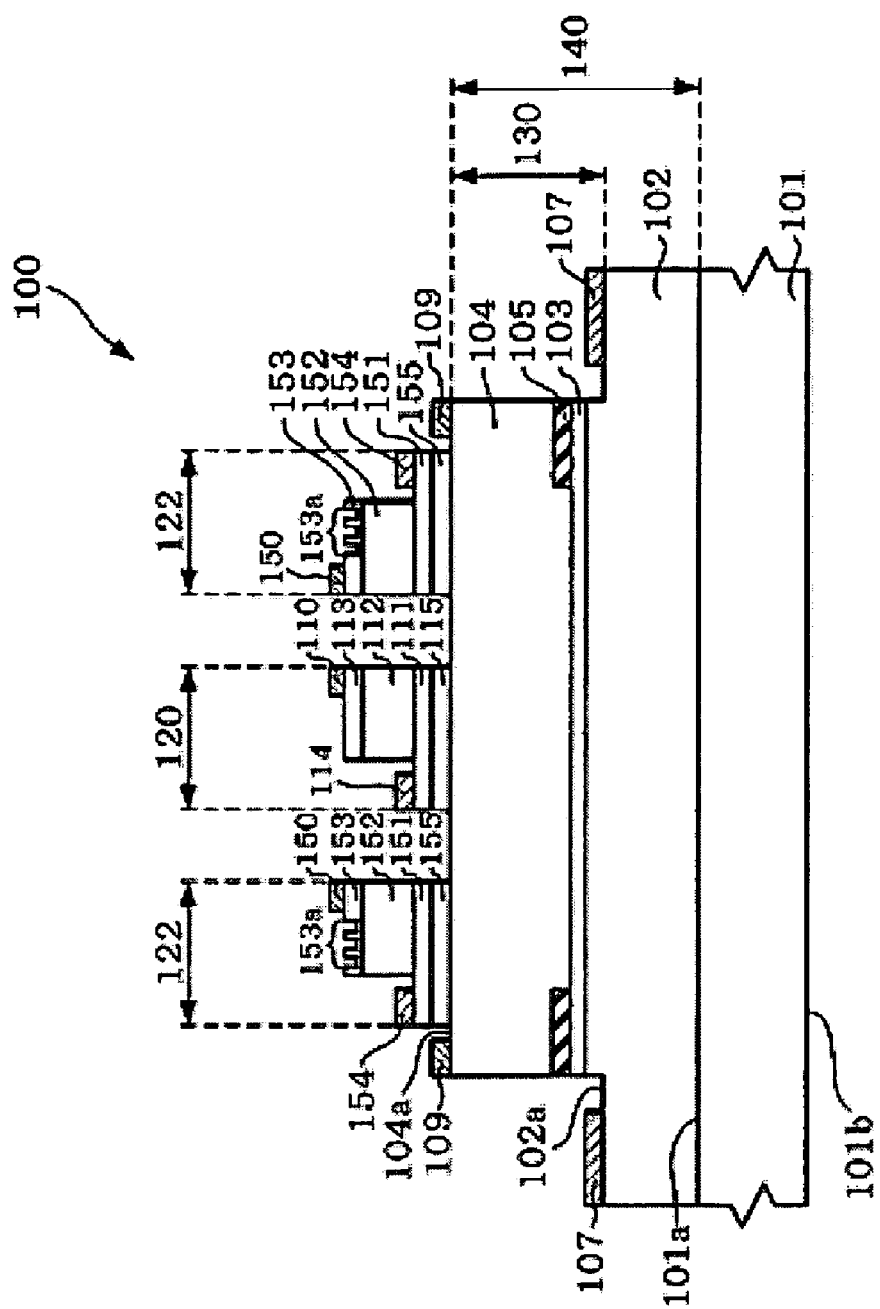
FIG. 1 is a cross-sectional view schematically showing an optical element in accordance with a first embodiment of the invention.
Figure 2:
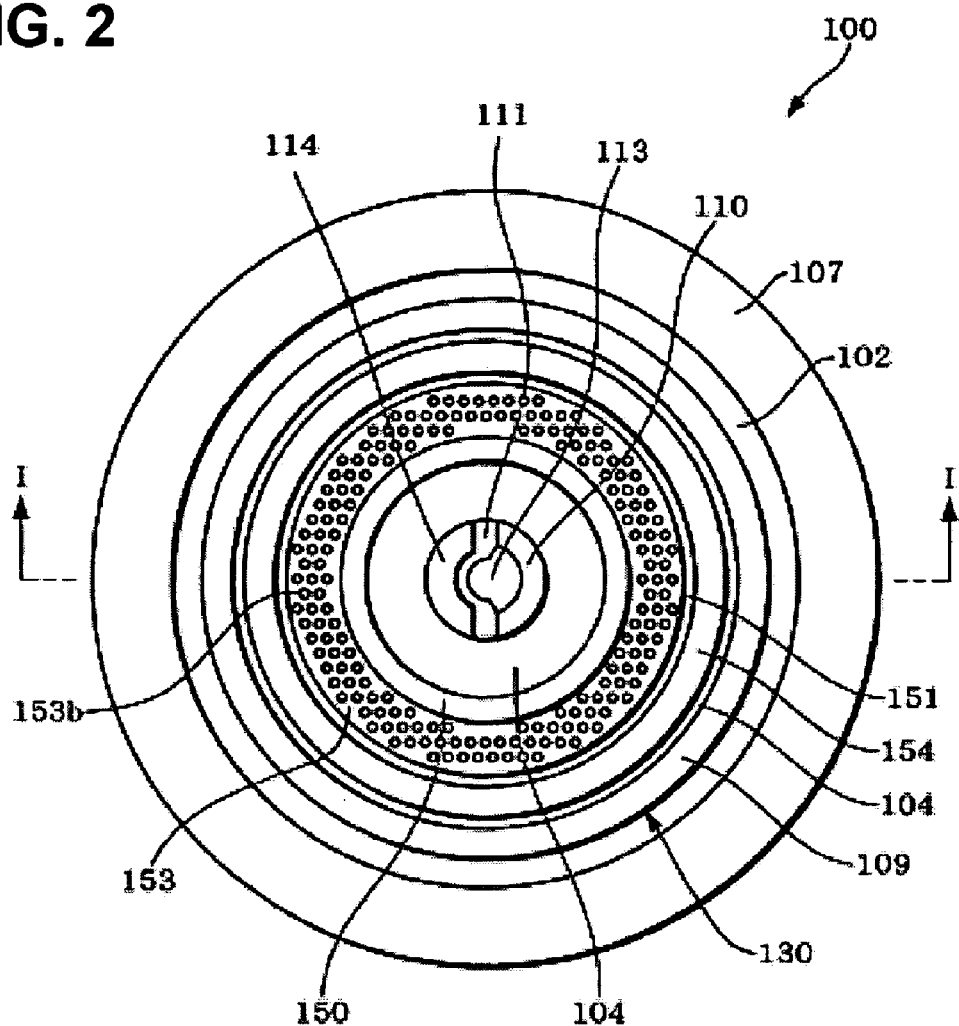
FIG. 2 is a plan view schematically showing the optical element in accordance with the first embodiment.

FIG. 1 schematically shows a cross-sectional view of an optical element 100 in accordance with a first embodiment of the invention. FIG. 2 schematically shows a plan view of the optical element 100 shown in FIG. 1. It is noted that FIG. 1 is a view showing a cross section taken along a line I—I of FIG. 2.

The optical element 100 of the present embodiment includes, as shown in FIG. 1, a substrate (an n-type GaAs substrate that is a semiconductor substrate, in the present embodiment) 101, a surface-emitting type semiconductor laser (hereafter referred to as a "surface-emitting laser") 140, a first isolation layer 155, a second isolation layer 115, a first optical detection section 122, and a second optical detection section 120.

The surface-emitting laser 140 is provided on the substrate 101. The surface-emitting laser 140 has a vertical resonator. The surface-emitting laser 140 may include a columnar semiconductor laminated body (hereafter referred to as a "columnar section") 130.

The surface-emitting laser 140 is formed from, for example, a first mirror 102 that is a distributed Bragg reflection type (DBR) mirror composed of 40 pairs of semiconductor multilayer films of alternately laminated n-type $Al_{0.9}Ga_{0.1}As$ layers and n-type $Al_{0.15}Ga_{0.85}As$ layers, an active layer 103 composed of GaAs well layers and $Al_{0.3}Ga_{0.7}As$ barrier layers in which the well layers include a quantum well structure composed of three layers, and a second mirror 104 that is a distributed Bragg reflection type (DBR) mirror composed of semiconductor multilayer films of 25 pairs of alternately laminated p-type $Al_{0.9}Ga_{0.1}As$ layers and p-type $Al_{0.15}Ga_{0.85}As$ layers, which are successively stacked in layers. It is noted that the uppermost layer of the second mirror 104 may be composed of a layer with a smaller Al composition, in other words, a p-type $Al_{0.15}Ga_{0.85}As$ layer. It is also noted that the composition of each of the layers and the number of layers forming the first mirror 102, the active layer 103 and the second mirror 104 are not particularly limited to those described above.

The second mirror 104 may be formed to be p-type, for example, by doping carbon (C) or the like, and the first mirror 102 may be formed to be n-type, for example, by doping silicon (Si) or the like. Accordingly, the p-type second mirror 104, the active layer 103 in which no impurity is doped, and the n-type first mirror 102 form a pin diode.

A portion among the surface-emitting laser 140 extending from the second mirror 104 to an intermediate point of the first mirror 102 is etched in a circular shape, as viewed toward an upper surface 104a of the second mirror 104, whereby the columnar section 130 is formed. It is noted that, in the present embodiment, the columnar section 130 has a plane configuration that is circular, but can have any arbitrary configuration.

Further, an oxidized constricting layer 105 that is obtained by oxidizing an AlGaAs layer from its side surface is formed in a region near the active layer 103 among the layers composing the second mirror 104. The oxidized constricting layer 105 is formed in a ring shape. In other words, the oxidized constricting layer 105 has a cross-sectional shape, as being cut in a plane parallel with a surface 101a of the substrate 101 shown in FIG. 1, which is a ring shape concentric with the circular shape of the plane configuration of the columnar section 130.

Further, the surface-emitting laser 140 is provided with a first electrode 107 and a second electrode 109. The first electrode 107 and the second electrode 109 are used for driving the surface-emitting laser 140.

More concretely, as shown in FIG. 1, the first electrode 107 is provided on an upper surface 102a of the first mirror 102. The first electrode 107 has a plane configuration in a ring shape, as shown in FIG. 2. Therefore the first electrode 107 is provided in a manner to surround mainly the columnar section 130. In other words, the columnar section 130 is provided inside the first electrode 107. The second electrode 109 is provided on an upper surface 104a of the surface-emitting laser 140. The second electrode 109 has a plane configuration in a ring shape, as shown in FIG. 2. Therefore the second electrode 109 is provided in a manner to surround the first optical detection section 122. In other words, the first optical detection section 122 is provided inside the second electrode 109.

It is noted that the present embodiment is described as to the case in which the first electrode 107 is provided on the first mirror 102. However, the first electrode 107 may be provided on a back surface 101b of the substrate 101.

The first electrode 107 is formed from a multilayer film of, for example, gold (Au) and an alloy of gold (Au) and germanium (Ge). Also, the second electrode 109 is formed from a multilayer film of, for example, platinum (Pt), titanium (Ti) and gold (Au). An electric current is injected into the active layer 103 by the first electrode 107 and the second electrode 109. It is noted that the materials for forming the first electrode 107 and the second electrode 109 are not limited to those described above, but other materials, such as, for example, an alloy of gold (Au) and zinc (Zn) can be used.

It the optical element 100 of the present embodiment, the first isolation layer 155 and the second isolation layer 115 are formed on the surface-emitting laser 140. The first isolation layer 155 is provided between the surface-emitting laser 140 and the first optical detection section 122. The second isolation layer 115 is provided between the surface-emitting laser 140 and the second optical detection section 120. More concretely, as shown in FIG. 1, the first isolation layer 155 is provided between the second mirror 104 and a first contact layer 151 to be described below, and the second isolation layer 115 is provided between the second mirror 104 and a third contact layer 111 to be described below.

The first isolation layer 155 has a plane configuration in a circular ring shape. In the illustrated example, the plane configuration of the first isolation layer 155 has the same plane configuration as that of the first contact layer 151. The plane configuration of the first isolation layer 155 may be formed to be greater than the plane configuration of the first contact layer 151. Also, the second isolation layer 115 has a plane configuration in a circular shape. In the illustrated example, the plane configuration of the second isolation layer 115 has the same plane configuration as that of the third contact layer 111. The plane configuration of the second isolation layer 115 may be formed to be greater than the plane configuration of the third contact layer 111.

As the first isolation layer 155 and the second isolation layer 115, for example, an AlGaAs layer without an impurity being doped may be used. It is noted that the first isolation layer 155 is not limited to any particular material, as long as the material can electrically isolate the second mirror 104 from the first contact layer 151. Further, the second isolation layer 115 is not limited to any particular material, as long as the material can electrically isolate the second mirror 104 from the third contact layer 111.

In the optical element 100 of the present embodiment, the first optical detection section 122 is formed on the first isolation layer 155, and the second optical detection section 120 is formed on the second isolation layer 115. As shown in FIG. 1 and FIG. 2, the first optical detection section 122 is formed in a manner to surround the second optical detection section 120. In other words, the second optical detection section 120 is formed inside the first optical detection section 122. The first optical detection section 122 and the second optical detection section 120 are formed in a manner not to contact each other, and electrically isolated from each other.

The first optical detection section 122 includes a first contact layer 151 formed on the first isolation layer 155, a first photoabsorption layer 152 formed on the first contact layer 151, and a second contact layer 153 formed on the first photoabsorption layer 152. The first contact layer 151 has a plane configuration that is formed greater than the plane configuration of the first photoabsorption layer 152 and the second contact layer 153 (see FIG. 1 and FIG. 2). The second contact layer 153 and the first photoabsorption layer 152 compose a columnar semiconductor laminated body.

The first contact layer 151 may be formed from, for example, an n-type GaAs layer, the first photoabsorption layer 152 may be formed from, for example, a GaAs layer without an impurity being doped, and the second contact layer 153 may be formed from, for example, a p-type GaAs layer. More concretely, the first contact layer 151 is made to be n-type by doping, for example, silicon (Si), and the second contact layer 153 is made to be p-type by doping, for example, carbon (C). Accordingly, the p-type second contact layer 153, the first photoabsorption layer 152 without an impurity being doped and the n-type first contact layer 151 form a pin diode.

A photonic crystal section 153a is formed in the second contact layer 153, as shown in FIG. 1. The photonic crystal section 153a has a two-dimensional photonic crystal structure having a periodic refractive index due to a refractive index difference between the material of the second contact layer 153 and a medium (air or the like) within holes 153 in a plane that intersects a propagation direction of light incident upon the first optical detection section 122. The photonic crystal section 153a may be achieved by, for example, providing holes 153b periodically arranged at an interval of about a wavelength of the light incident upon the first optical detection section 122. Also, the photonic crystal section 153a may be formed such that at least a portion of the light incident upon the first optical detection section 122 becomes diffracted light, distributed in plane of the first photoabsorption layer 152, and propagates in the first optical detection section 122. For example, when the photonic crystal section 153a has a one-dimensional photonic crystal structure composed of a medium with a refractive index $n_1$ and a medium with a refractive index $n_2$, a periodic interval D of the refractive index distribution may be formed to be $D=\lambda/(2n_1)+\lambda/(2n_2)$, where $\lambda$ is an absorption wavelength of the first photoabsorption layer 152. Also in the case of a two-dimensional photonic crystal structure, a refractive index distribution can be formed at about the same periodic interval.

Also, the holes 153b may be arranged in, for example, a triangular lattice configuration or a square lattice configuration. In the illustrated example, the holes 153b are arranged in a triangular lattice configuration. Also, the cross-sectional shape of each of the holes 153b is not limited to a symmetrical shape that is, for example, a cylindrical shape, but may be an asymmetrical shape, such as, for example, a shape with a taper, which may be, for example, a conical shape. Also, the plane shape of each of the holes 153b is not limited to a circular shape, but may be a polygonal shape.

Further, when the photonic crystal section 153a has a one-dimensional photonic crystal structure, grooves may be formed instead of the holes 153b. More specifically, the second contact layer 153 may be patterned in the form of slits, such that the photonic crystal section 153a functions as a diffraction grating.

The first optical detection section 122 is provided with a third electrode 154 and a fourth electrode 150. The third electrode 154 and the fourth electrode 150 are used to drive the first optical detection section 122. More concretely, as shown in FIG. 1 and FIG. 2, the third electrode 154 is formed above the first contact layer 151, in a manner not to contact the first photoabsorption layer 152. As shown in FIG. 2, the third electrode 154 has a plane configuration in a ring shape. The fourth electrode 150 is formed above the second contact layer 153, as shown in FIG. 1 and FIG. 2. As shown in FIG. 2, the fourth electrode 150 has a plane configuration in a ring shape.

In the optical element 100 of the present embodiment, the third electrode 154 can be formed with the same material as that of the first electrode 107, and the fourth electrode 150 can be formed with the same material as that of the second electrode 109.

Because the first optical detection section 122 is formed above the columnar section 130, the first optical detection section 122 can be made closer to the optical axis, for example, when the optical element 100 is optically coupled to a waveguide (for example, see a fourth embodiment below).

The second optical detection section 120 includes a third contact layer 111 formed on the second isolation layer 115, a second photoabsorption layer 112 formed on the third contact layer 111, and a fourth contact layer 113 formed on the second photoabsorption layer 112. The third contact layer 111 has a plane configuration formed to be greater than the plane configuration of the second photoabsorption layer 112 and the fourth contact layer 113 (see FIG. 1 and FIG. 2). The fourth contact layer 113 and the second photoabsorption layer 112 compose a columnar semiconductor laminated body.

The third contact layer 111 may be formed from, for example, an n-type GaAs layer, the second photoabsorption layer 112 may be formed from, for example, a GaAs layer without an impurity being doped, and the fourth contact layer 113 may be formed from, for example, a p-type GaAs layer. Accordingly, the p-type fourth contact layer 113, the second photoabsorption layer 112 without an impurity being doped and the n-type third contact layer 111 form a pin diode.

The second optical detection section 120 is provided with a fifth electrode 114 and a sixth electrode 110. The fifth electrode 114 and the sixth electrode 110 are used to drive the second optical detection section 120. More concretely, as shown in FIG. 1 and FIG. 2, the fifth electrode 114 is formed above the third contact layer 111, in a manner not to contact the second photoabsorption layer 112. As shown in FIG. 2, the fifth electrode 114 has a configuration in which a portion of a ring shape is removed. The sixth electrode 110 is formed above the fourth contact layer 113, as shown in FIG. 1 and FIG. 2. As shown in FIG. 2, the sixth electrode 110 has a configuration in which a portion of a ring is removed.

Also, in the optical element 100 in accordance with the present embodiment, the fifth electrode 114 can be formed with the same material as that of the first electrode 107, and the sixth electrode 110 can be formed with the same material as that of the second electrode 109.

In the optical element 100 in accordance with the present embodiment, an npnp structure is formed as a whole by the n-type first mirror 102 and the p-type second mirror 104 of the surface-emitting laser 140, and the n-type first contact layer 151 and the p-type second contact layer 153 of the first optical detection section 122. Similarly, an npnp structure is formed as a whole by the n-type first mirror 102 and the p-type second mirror 104 of the surface-emitting laser 140, and the n-type third contact layer 111 and the p-type fourth contact layer 113 of the second optical detection section 120.

It is noted that the present embodiment is described as to the case in which the first optical detection section 122 and the second optical detection section 120 function as pin type photodiodes. However, the invention is applicable to other light receiving elements other than pin type photodiodes. As such light receiving elements, for example, avalanche type photodiodes or MSM type photodiodes can be enumerated. This similarly applies to first photodetecting sections and second photodetecting sections in accordance with second through seventh embodiments to be described below.

Also, the first photoabsorption layer 152 is not limited to a single semiconductor layer, but may be a quantum well structure in which semiconductor layers of a plurality of different kinds are laminated (including a multiple quantum well structure and a super lattice structure). This similarly applies to the second photoabsorption layer 112, and also similarly applies to first photoabsorption layers and second photoabsorption layers in accordance with second through seventh embodiments to be described below.

1-2. Operations of Optical Element

General operations of the optical element 100 in accordance with the present embodiment are described below. It is noted that the method of driving the optical element 100 described below is an example, and many modifications can be made without departing from the subject matter of the invention.

The second optical detection section 120 functions as an optical detection element for monitoring the surface-emitting laser 140. In other words, the second optical detection section 120 has a function to monitor an output of light generated at the surface-emitting laser 140. More concretely, the second optical detection section 120 converts light generated by the surface-emitting laser 140 into an electrical current. By the current value, the light output generated by the surface-emitting laser 140 is detected. More specifically, the following operations take place.

First, when a voltage is applied in a forward direction to the pin diode by the first electrode 107 and the second electrode 109, recombinations of electrons and holes occur in the active layer 103 of the surface-emitting laser 14, thereby causing emission of light due to the recombinations. Stimulated emission occurs during the period the generated light reciprocates between the second mirror 104 and the first mirror 102, whereby the light intensity is amplified. When the optical gain exceeds the optical loss, laser oscillation occurs, whereby laser light is emitted from an upper surface 104a of the second mirror 104. The laser light includes light that is emitted from the upper surface 104a of the second mirror 104 to the outside of the optical element 100, and light that enters the second isolation layer 115. The laser light that has entered the second isolation layer 115 is then incident upon the third contact layer 111 of the second optical detection section 120.

Then, the laser light that has entered the third contact layer 111 then enters the second photoabsorption layer 112 in the second optical detection section 120. A part of the incident light is absorbed by the second photoabsorption layer 112. As a result, photoexcitation occurs in the second photoabsorption layer 112, whereby electrons and holes are generated. Then, by an electric field applied externally of the element, the electrons migrate to the fifth electrode 114, and the holes migrate to the sixth electrode 110. As a result, at the second optical detection section 120, a current (a photoelectric current) occurs in a direction from the third contact layer 111 to the fourth contact layer 113. By measuring the value of the current, an optical output of the surface-emitting laser 140 can be detected. It is noted that the laser light that has not been absorbed by the second photoabsorption layer 112 and entered the fourth contact layer 113 is emitted externally from the upper surface of the fourth contact layer 113.

Also, the optical output of the surface-emitting laser 140 is mainly decided by the bias voltage applied to the surface-emitting laser 140. In particular, the optical output of the surface-emitting laser 140 is considerably changed by the surrounding temperature of the surface-emitting laser 140 and the life of the surface-emitting laser 140. For this reason, it is necessary to maintain the surface-emitting laser 140 at a predetermined level of optical output.

In the optical element 100 in accordance with the present embodiment, by monitoring the optical output of the surface-emitting laser 140 and adjusting the voltage value to be applied to the surface-emitting laser 140 based on the current value generated at the second optical detection section 120, the value of a current flowing in the surface-emitting laser 140 can be adjusted. Accordingly, the surface-emitting laser 140 can maintain the optical output at a predetermined level. The control to feedback the optical output of the surface-emitting laser 140 to the voltage value to be applied to the surface-emitting laser 140 can be conducted by using an external electronic circuit (a drive circuit (not shown)).

Also, the first optical detection section 122 functions as an optical detection element for two-way communications. In other words, the first optical detection section 122 has a function to convert light that enters the first photoabsorption layer 152 from outside of the optical element 100 to electrical current. Optical signals from outside of the optical element 100 are detected based on the electrical signals. More concrete operations in this case are described below in a fifth embodiment.

As described above, the first optical detection section 122 functions as an optical detection element for reception for two-way communications, and the second optical detection section 120 functions as an optical detection element for monitoring for the surface-emitting laser 140. This similarly applies to first optical detection sections and second optical detection sections in accordance with second through seventh embodiments to be described below.

1-3. Method for Manufacturing Optical Element

Next, an example of a method for manufacturing the optical element 100 in accordance with the first embodiment is described with reference to FIG. 1 through FIG. 10. FIG. 3 through FIG. 10 are cross-sectional views schematically showing a process for manufacturing the optical element 100 shown in FIG. 1 and FIG. 2, and correspond to the cross-sectional view in FIG. 1, respectively.

Figure 3:
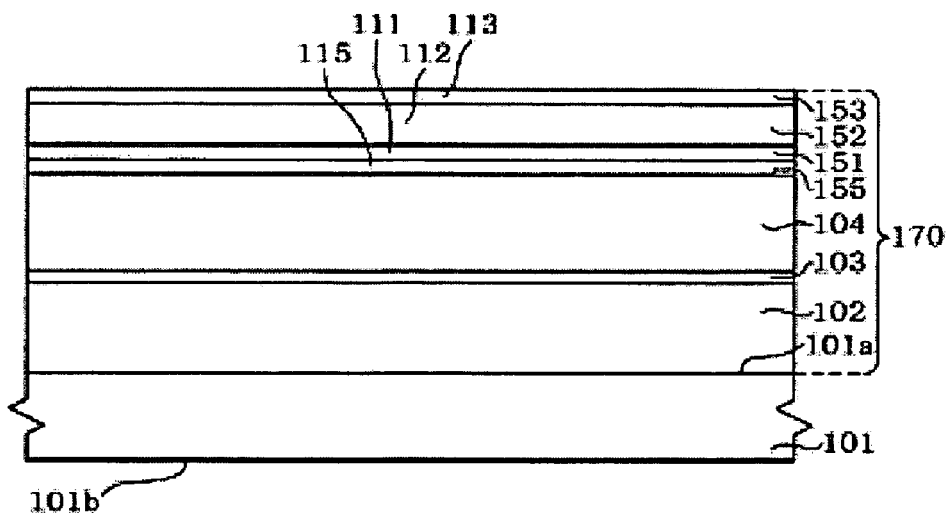
FIG. 3 is a cross-sectional view schematically showing a method for manufacturing the optical element in accordance with the first embodiment.

(1) First, on a surface 101a of a substrate 101 composed of n-type GaAs, a semiconductor multilayer film 170 is formed by epitaxial growth while modifying its composition, as shown in FIG. 3. It is noted here that the semiconductor multilayer film 170 is formed from, for example, a first mirror 102 of 40 pairs of alternately laminated n-type $Al_{0.9}Ga_{0.1}As$ layers and n-type $Al_{0.15}Ga_{0.85}As$ layers, an active layer 103 composed of GaAs well layers and $Al_{0.3}Ga_{0.7}As$ barrier layers in which the well layers include a quantum well structure composed of three layers, a second mirror 104 of 25 pairs of alternately laminated p-type $Al_{0.9}Ga_{0.1}As$ layers and p-type $Al_{0.15}Ga_{0.8}As$ layers, a first isolation layer 155 and a second isolation layer 115, each composed of an AlGaAs layer without an impurity being doped, a first contact layer 151 and a third contact layer 111, each composed of an n-type GaAs layer, a first photoabsorption layer 152 and a second photoabsorption layer 112, each composed of a GaAs layer without an impurity being doped, and a second contact layer 153 and a fourth contact layer 113, each composed of a p-type GaAs layer. These layers are successively laminated on the substrate 101 to thereby form the semiconductor multilayer film 170.

As the first isolation layer 155 and the second isolation layer 115, layers with an etching rate to a first etchant to be described below that is smaller than the etching rate of the first contact layer 151 and the third contact layer 111 to the first etchant can be used. More specifically, for example, the first isolation layer 155 and the second isolation layer 115 can be composed of AlGaAs layers with an Al composition greater than the Al composition of the first contact layer 151 and the third contact layer 111. In this case, the Al composition of the first contact layer 151 and the third contact layer 111 can be made smaller, such that ohmic contact between the first contact layer 151 and a third electrode 154 and ohmic contact between the third contact layer 111 and a fifth electrode 114 can be readily made.

As the first isolation layer 155 and the second isolation layer 115, layers with an etching rate to a second etchant to be described below that is greater than the etching rate of the upper most layer of the second mirror 104 to the second etchant can be used. More concretely, for example, the first isolation layer 155 and the second isolation layer 115 can be composed of AlGaAs layers with an Al composition greater than the Al composition of the uppermost layer of the second mirror 104. In this case, the Al composition of the uppermost layer of the second mirror 104 can be made smaller, such that ohmic contact between the uppermost layer of the second mirror 104 and a second electrode 109 can be readily made.

When growing the second mirror 104, at least one layer thereof adjacent to the active layer 103 may be formed as a layer that is later oxidized and becomes an oxidized constricting layer 105 (see FIG. 8). More concretely, the layer that becomes the oxidized constricting layer 105 may be formed to be an AlGaAs layer (including an AlAs layer) with an Al composition greater than the Al composition of the first isolation layer 155 and the second isolation layer 115. In other words, the first isolation layer 155 and the second isolation layer 115 can be formed to be AlGaAs layers with an Al composition smaller than that of the oxidized constricting layer 105. By this, in an oxidation step to be described below for forming the oxidized constricting layer 105, oxidation of the first isolation layer 155 and the second isolation layer 115 can be controlled. By controlling oxidation of the first isolation layer 155 and the second isolation layer 115, the strength of the layers can be prevented from being reduced by oxidation. Also, by controlling oxidation of the first isolation layer 155 and the second isolation layer 115, the refractive index of the layers can be prevented from being lowered by oxidation. As a result, when the first isolation layer 155 and the second isolation layer 155 function as a part of distributed Bragg reflection type mirrors, to be described below, their reflection coefficient can be prevented from being deteriorated.

When the designed wavelength of the surface-emitting laser 140 is $\lambda$, the optical film thickness of the first isolation layer 155 and the second isolation layer 115 can be an odd-number multiplication of $\lambda/4$. By this, the second mirror 104, the first isolation layer 155 and the second isolation layer 115 in the surface-emitting laser 140 can function as a distributed Bragg reflection type mirror above the active layer 103 without adversely affecting the characteristics of the surface-emitting laser 140. It is noted that, in the embodiment, the designed wavelength may be a wavelength of light having the maximum intensity among light that is generated by the surface-emitting laser 140 at a specified operation temperature. Further, in the present embodiment, the optical film thickness may be a value obtained by multiplying the actual film thickness of a layer by a refractive index of the material composing the layer.

Also, the sum of the optical film thicknesses of the first contact layer 151, the first photoabsorption layer 152 and the second contact layer 153, in other words, the total optical film thickness of the first optical detection section 122 (see FIG. 1) may be, for example, an odd number multiplication of $\lambda/4$. By this, the entire first optical detection section 122 can function as a distributed Bragg reflection type mirror without adversely affecting the characteristics of the surface-emitting laser 140. Similarly, the sum of the optical film thicknesses of the third contact layer 111, the second photoabsorption layer 112 and the fourth contact layer 113, in other words, the total optical film thickness of the second optical detection section 120 (see FIG. 1) may be, for example, an odd number multiplication of $\lambda/4$. By this, the entire second optical detection section 120 can function as a distributed Bragg reflection type mirror without adversely affecting the characteristics of the surface-emitting laser 140.

Also, when a first electrode 107 is formed in a later step, it is desirable that at least an area of the first mirror 102 adjacent to a portion thereof that comes in contact with the first electrode 107 may be made to have a high carrier density such that the first mirror 102 can readily make ohmic contact with the first electrode 107. Similarly, it is desirable that at least an area of the second mirror 104 adjacent to a portion thereof that comes in contact with a second electrode 109, at least an area of the first contact layer 151 adjacent to a portion thereof that comes in contact with a third electrode 154, at least an area of the second contact layer 153 adjacent to a portion thereof that comes in contact with a fourth electrode 150, at least an area of the third contact layer 111 adjacent to a portion thereof that comes in contact with a fifth electrode 114, and at least an area of the fourth contact layer 113 adjacent to a portion thereof that comes in contact with a sixth electrode 110 may be made to have a high carrier density such that they can readily make ohmic contact.

The temperature at which the epitaxial growth is conducted is appropriately decided depending on the growth method, the kind of raw material, the type of the substrate 101, and the kind, thickness and carrier density of the semiconductor multilayer film 170 to be formed, and in general may preferably be 450° C.–800° C. Also, the time required for conducting the epitaxial growth is appropriately decided just like the temperature. Furthermore, a metal-organic vapor phase growth (MOVPE: metal-organic vapor phase epitaxy) method, a molecular beam epitaxy (MBE) method or a liquid phase epitaxy (LPE) method can be used as a method for the epitaxial growth.

Figure 4:
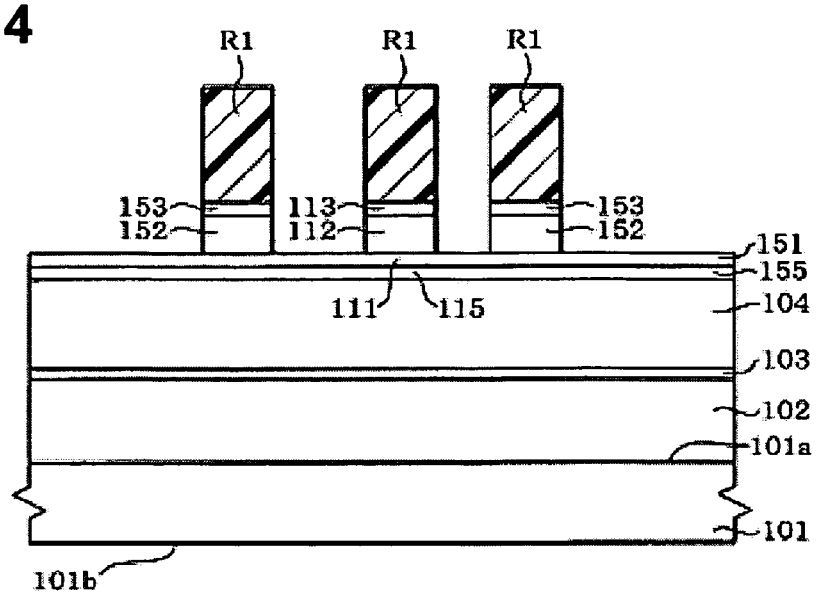
FIG. 4 is a cross-sectional view schematically showing the method for manufacturing the optical element in accordance with the first embodiment.

(2) Next, as shown in FIG. 4, the second contact layer 153, the fourth contact layer 113, the first photoabsorption layer 152 and the second photoabsorption layer 112 are patterned in a specified configuration.

First, resist (not shown) is coated on the semiconductor multilayer film 170, and then the resist is patterned by a lithography method, thereby forming a resist layer R1 having a specified pattern.

Then, by using the resist layer R1 as a mask, the second contact layer 153, the fourth contact layer 113, the first photoabsorption layer 152 and the second photoabsorption layer 112 are etched by, for example, a dry etching method. By this, the second contact layer 153, the fourth contact layer 113, the first photoabsorption layer 152 having the same plane configuration as that of the second contact layer 153, and the second photoabsorption layer 112 having the same plane configuration as that of the fourth contact layer 113 are formed. The second contact layer 153 and the first photoabsorption layer 152, and the fourth contact layer 113 and the second photoabsorption layer 112 form columnar semiconductor deposited bodies, respectively. Then, the resist layer R1 is removed.

Figure 5:
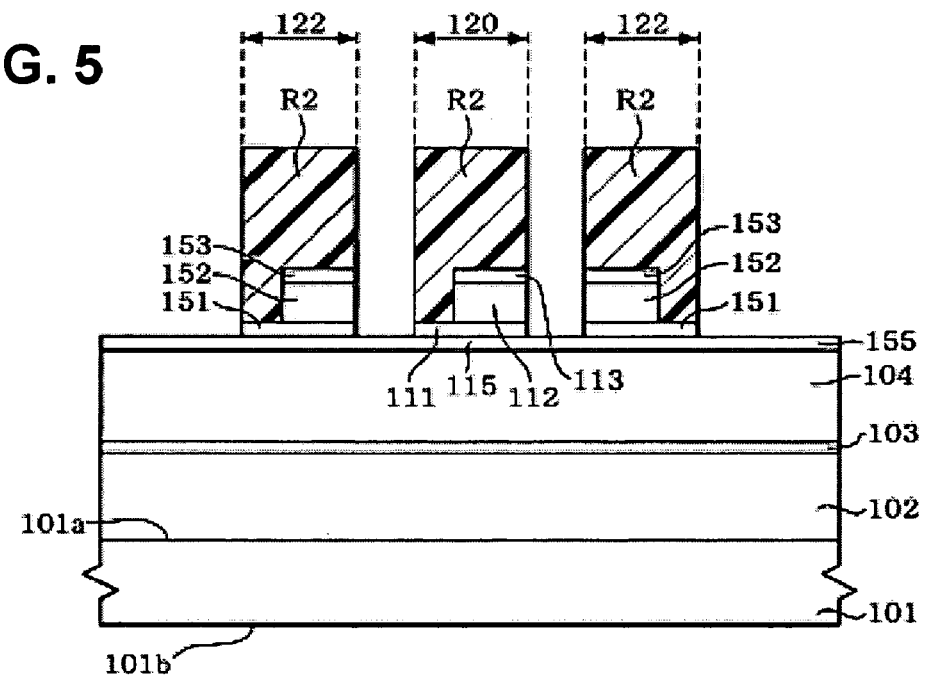
FIG. 5 is a cross-sectional view schematically showing the method for manufacturing the optical element in accordance with the first embodiment.

(3) Next, as shown in FIG. 5, the first contact layer 151 and the third contact layer 111 are patterned in a specified configuration. More concretely, first, resist (not shown) is coated on the first contact layer 151 and the third contact layer 111, and then the resist is patterned by a lithography method, whereby a resist layer R2 having the specified configuration is formed.

Next, by using the resist layer R2 as a mask, the first contact layer 151 and the third contact layer 111 are etched with a first etchant. By this, as shown in FIG. 5, a first optical detection section 122 and a second optical detection section 120 are formed. As the first isolation layer 155 is disposed below the first contact layer 151, and the second isolation layer 115 is disposed below the third contact layer 111, the first isolation layer 155 and the second isolation layer 115 function as etching stopper layers in this etching step. For this reason, etching of the first contact layer 151 and the third contact layer 111 can be accurately and readily stopped with high precision at the time when the first isolation layer 155 and the second isolation layer 115 are exposed.

It is noted that, in the example described above, after the second contact layer 153, the fourth contact layer 113, the first photoabsorption layer 152 and the second photoabsorption layer 112 are patterned, and then the first contact layer 151 and the third contact layer 111 are patterned. However, the order of patterning these layers is not particularly limited.

Figure 6:
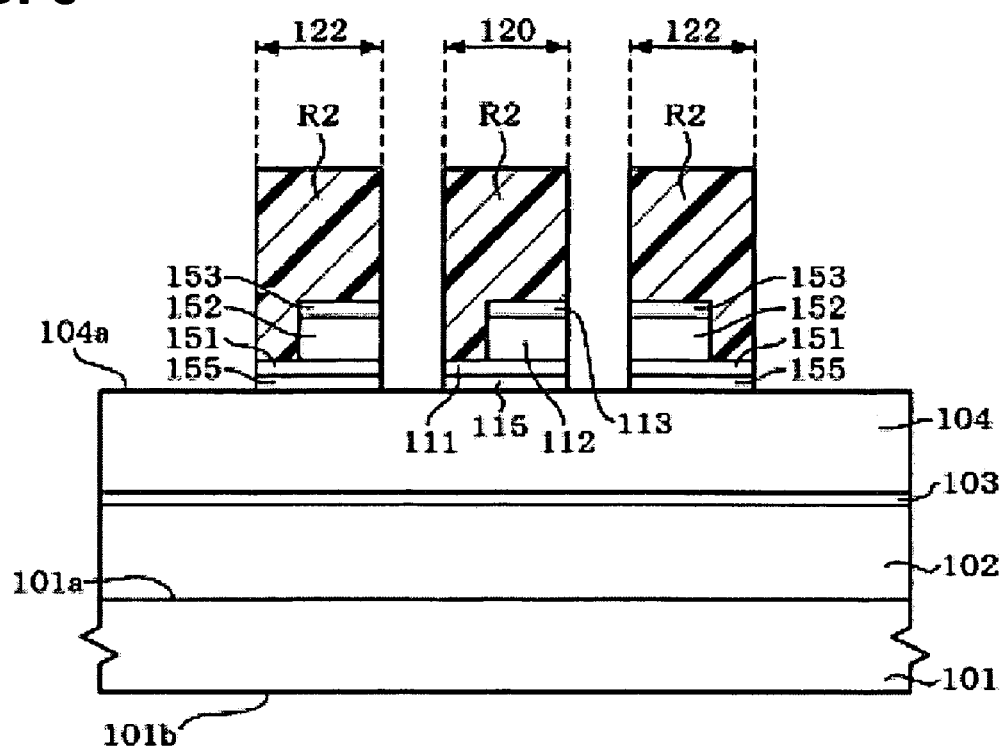
FIG. 6 is a cross-sectional view schematically showing the method for manufacturing the optical element in accordance with the first embodiment.

(4) Next, as shown in FIG. 6, the first isolation layer 155 and the second isolation layer 115 and the second isolation layer 115 are patterned in a specified configuration. More concretely, by using the resist layer R2 described above as a mask, the first isolation layer 155 and the second isolation layer 115 are etched with a second etchant. By this, as shown in FIG. 6, the first isolation layer 155 and the second isolation layer 115 that are patterned are formed. Then, the resist layer R2 is removed. In this etching step, the uppermost layer of the second mirror 104 functions as an etching stopper layer because the uppermost layer of the second mirror 104 is disposed below the first isolation layer 155 and the second isolation layer 115. For this reason, etching of the first isolation layer 155 and the second isolation layer 115 can be accurately and readily stopped with high precision at the time when the uppermost layer of the second mirror 104 is exposed.

It is noted that, in the illustrated example, the first isolation layer 155 is formed to have the same plane configuration as that of the first contact layer 151. However, the plane configuration of the first isolation layer 155 can be formed to be greater than the plane configuration of the first contact layer 151. More concretely, instead of the resist layer R2 used for patterning the first isolation layer 155 described above, another resist layer having a greater plane configuration than that of the resist layer R2 can be used to pattern the first isolation layer 155. Similarly, the plane configuration of the second isolation layer 115 can be formed to be greater than that of the third contact layer 111.

Figure 7:
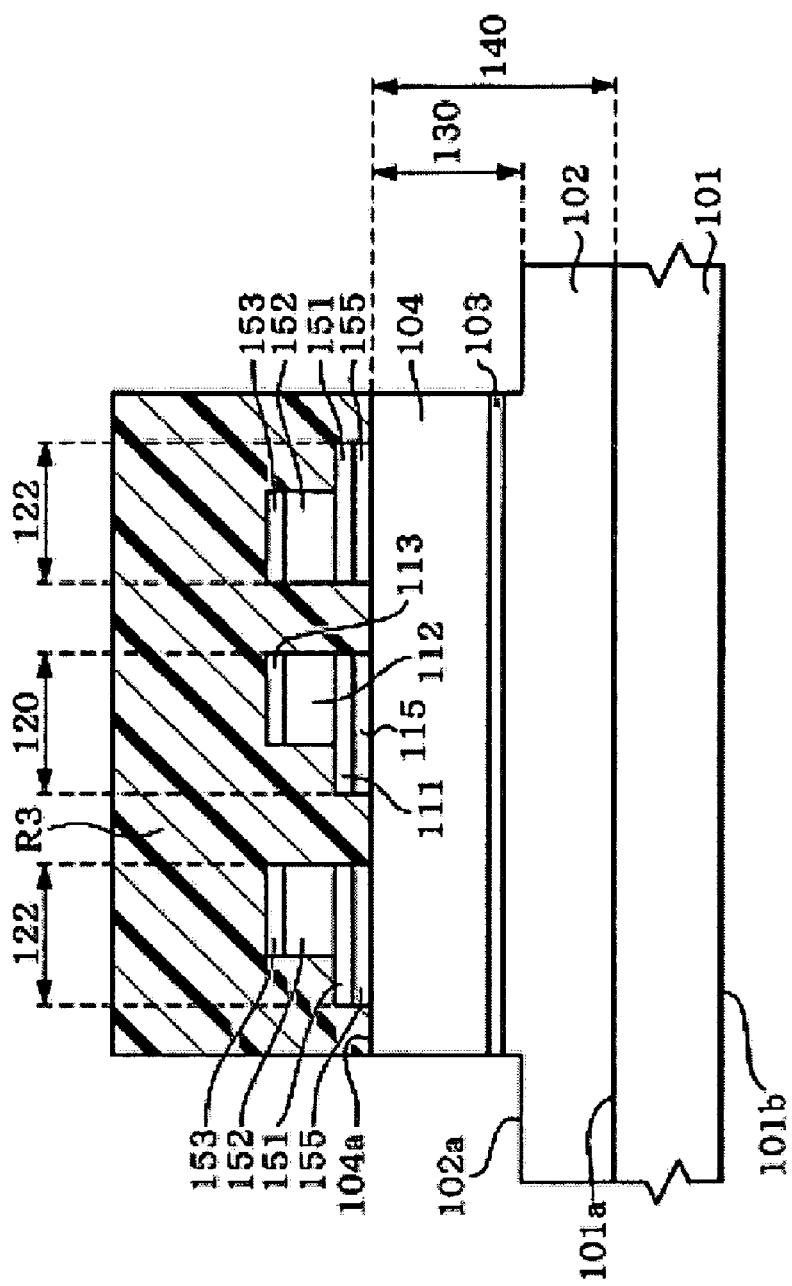
FIG. 7 is a cross-sectional view schematically showing the method for manufacturing the optical element in accordance with the first embodiment.

(5) Next, as shown in FIG. 7, a surface-emitting laser 140 including a columnar section 130 is formed by patterning. More concretely, first, resist (not shown) is coated on the second mirror 104, and then the resist is patterned by a lithography method, whereby a resist layer R3 having a specified pattern is formed. Next, by using the resist layer R3 as a mask, the second mirror 104, the active layer 103 and a part of the first mirror 102 are etched by, for example, a dry etching method. As a result, the columnar section 130 is formed, as shown in FIG. 7.

By the steps described above, a vertical resonator (surface-emitting laser 140) including the columnar section 130 is formed on the substrate 101. More specifically, a laminated body of the surface-emitting laser 140, the first isolation layer 155, the second isolation layer 115, the first optical detection section 122 and the second optical detection section 120 is formed. Then, the resist layer R3 is removed.

As described above, the present embodiment is described as to the case in which the first optical detection section 122, the second optical detection section 120, the first isolation layer 155 and the second isolation layer 115 are first formed, and then the columnar section 130 is formed. However, the columnar section 130 may be formed first, and then the first optical detection section 122, the second optical detection section 120, the first isolation layer 155 and the second isolation layer 115 may be formed.

Figure 8:
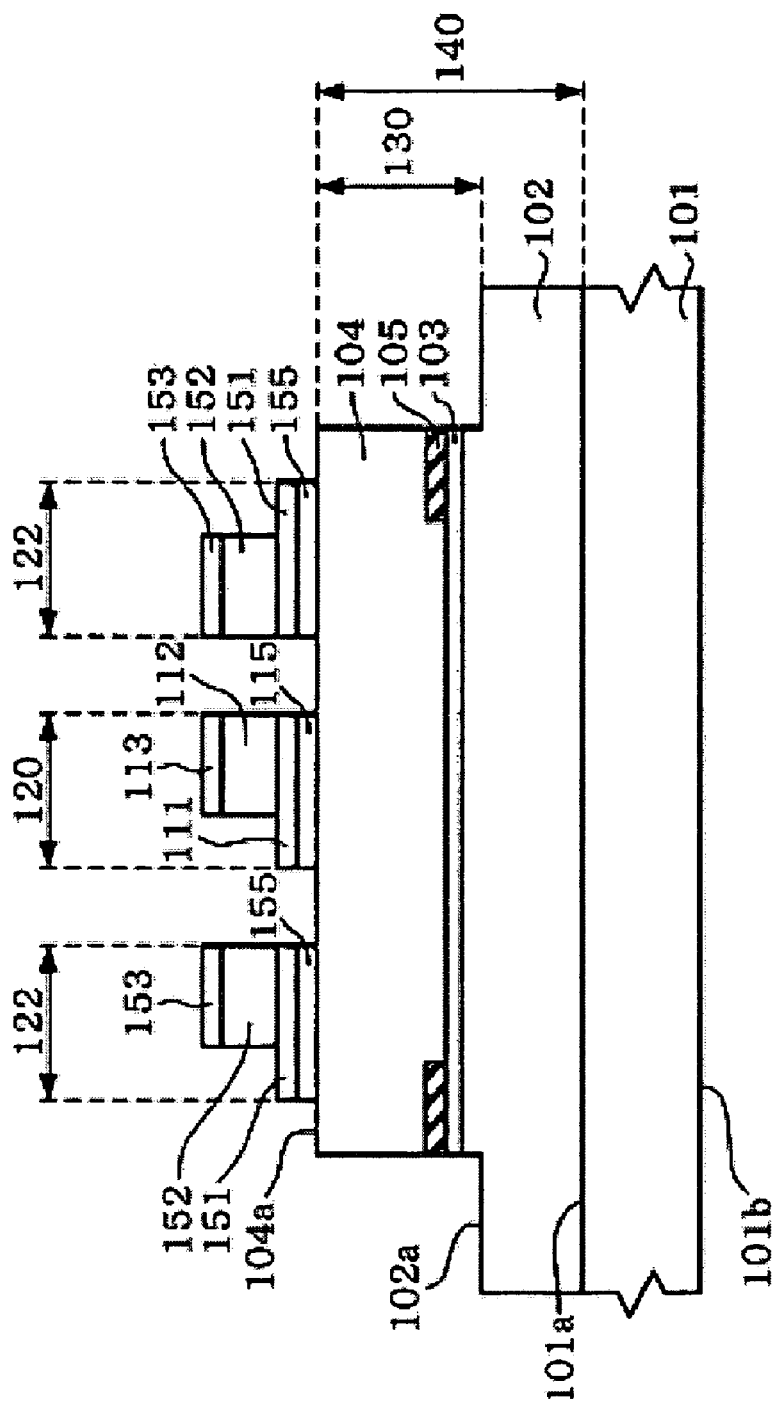
FIG. 8 is a cross-sectional view schematically showing the method for manufacturing the optical element in accordance with the first embodiment.

(6) Next, as shown in FIG. 8, by placing the substrate 101 on which the columnar section 130 is formed through the aforementioned steps in a water vapor atmosphere at about 400° C., for example, a layer having a high Al composition in the above-described second mirror 104 is oxidized from its side surface, thereby forming an oxidized constricting layer 105. As described above, the first isolation layer 155 and the second isolation layer 115 can be made not to be oxidized in this step.

The oxidation rate depends on the furnace temperature, the amount of water vapor that is supplied, and the Al composition and the film thickness of the layer to be oxidized. In the surface-emitting laser equipped with the oxidized constricting layer 105 that is formed by oxidation, electric current flows only in a portion where the oxidized constricting layer 105 is not formed (a portion that is not oxidized). Accordingly, by controlling the range of the oxidized constricting layer 105 to be formed, in the step of forming the oxidized constricting layer 105 by oxidation, the current density can be controlled.

Figure 9:
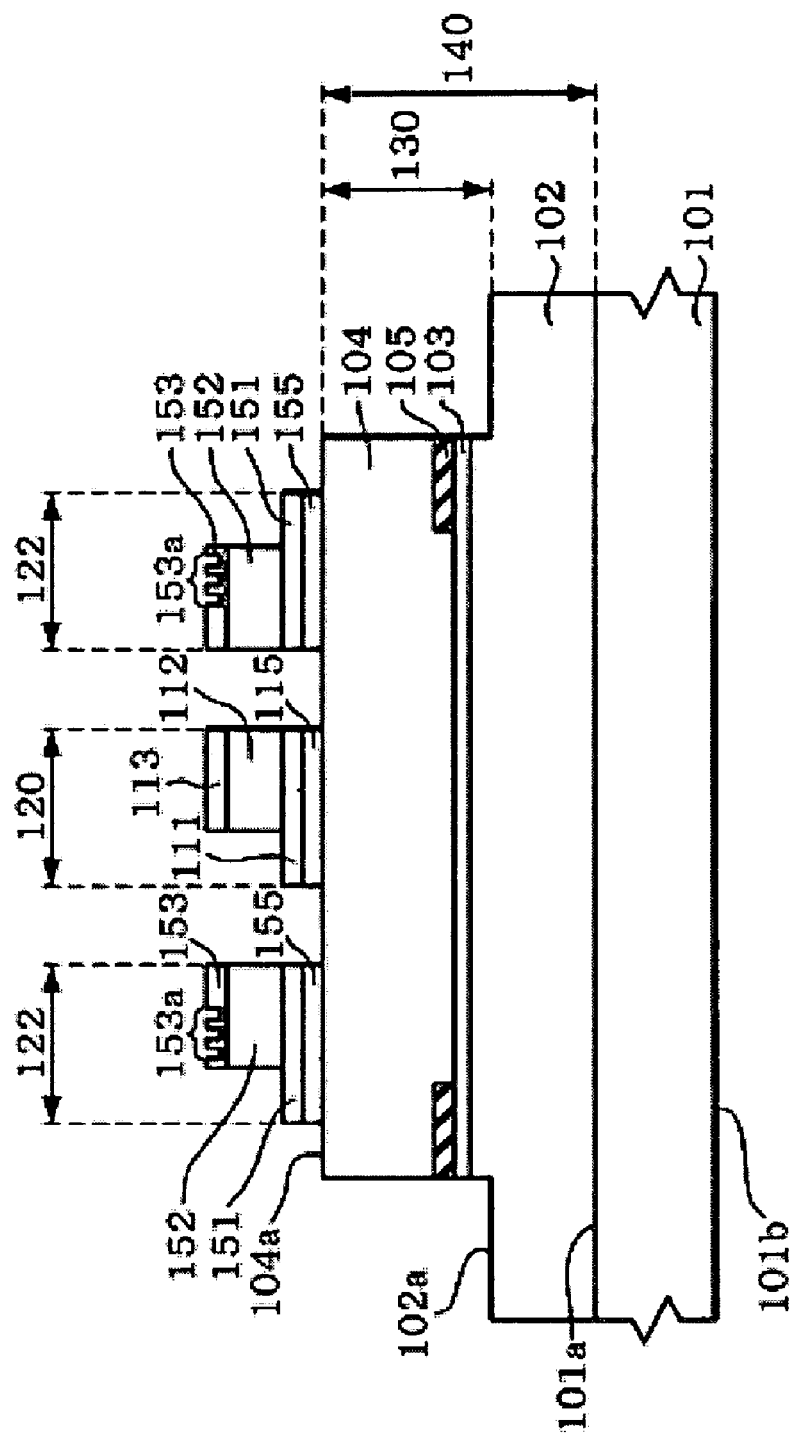
FIG. 9 is a cross-sectional view schematically showing the method for manufacturing the optical element in accordance with the first embodiment.

(7) Next, as shown in FIG. 9, a photonic crystal section 153a is formed in an upper portion of the second contact layer 153. More concretely, holes 153b (see FIG. 2) that are periodically arranged are formed in the upper portion of the second contact layer 153. The holes 153b can be formed by using a combination of a lithography technique and an etching technique, or an EB (Electron Beam) processing technique.

Figure 10:
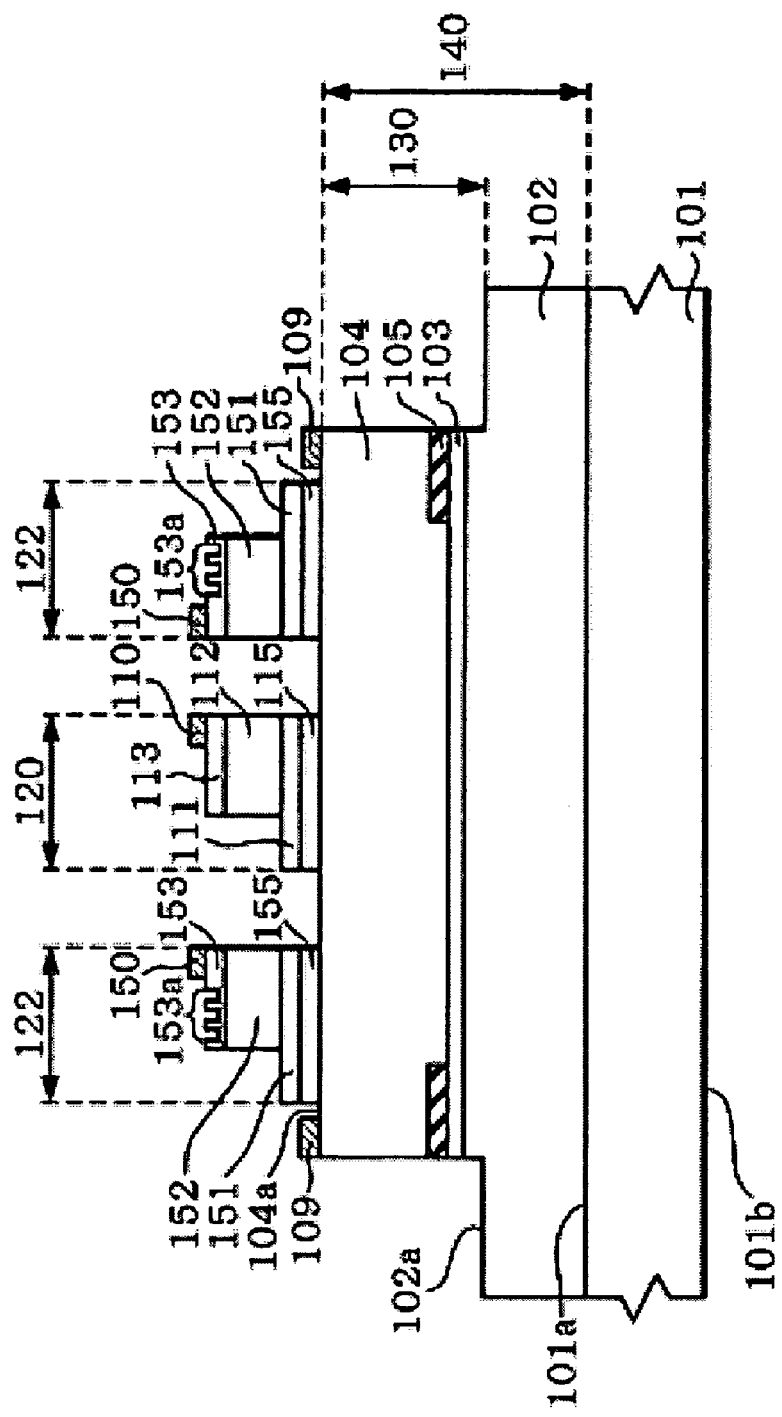
FIG. 10 is a cross-sectional view schematically showing the method for manufacturing the optical element in accordance with the first embodiment.

(8) Then, as shown in FIG. 10, a second electrode 109 is formed on an upper surface 104a of the second mirror 104, a fourth electrode 150 is formed on an upper surface of the first optical detection section 122 (on an upper surface of the second contact layer 153), and a sixth electrode 110 is formed on an upper surface of the second optical detection section 120 (on an upper surface of the fourth contact layer 113).

Prior to forming the second electrode 109, the fourth electrode 150 and the sixth electrode 110, the upper surface 104a of the second mirror 104, the upper surface of the second contact layer 153 and the upper surface of the fourth contact layer 113 may be washed by using a plasma treatment method or the like depending on the requirements. As a result, a device with more stable characteristics can be formed.

Then, a multilayer film (not shown) of, for example, platinum (Pt), titanium (Ti) and gold (Au) is formed by, for example, a vacuum deposition method. Then the multilayer film other than specified positions is removed by a lift-off method, whereby the second electrode 109, the fourth electrode 150 and the sixth electrode 110 are formed.

It is noted that, in the above-described step, a dry etching method or a wet etching method can be used instead of the lift-off method. Also, in the above-described step, a sputter method can be used instead of a vacuum deposition method. Also, in the above-described step, although the second electrode 109, the fourth electrode 150 and the sixth electrode 110 are patterned at the same time, the second electrode 109, the fourth electrode 150 and the sixth electrode 110 may be individually formed.

(9) Next, by a method similar to the above, a multilayer film of, for example, gold (Au) and an alloy of gold (Au) and germanium (Ge) is formed and patterned, whereby a first electrode 107 is formed on the first mirror 102 of the surface-emitting laser 140, a third electrode 154 is formed on the first contact layer 151 of the first optical detection section 122, and a fifth electrode 114 is formed on the third contact layer 111 of the second optical detection section 120. The first electrode 107, the third electrode 154 and the fifth electrode 114 may be patterned at the same time. Alternatively, the first electrode 107, the third electrode 154 and the fifth electrode 114 may be individually formed.

(10) Next, an annealing treatment is conducted. The temperature of the annealing treatment depends on the electrode material. The annealing treatment may be conducted normally at temperatures of about 400° C. for the electrode material used in the present embodiment. By the steps described above, the first electrode 107, the second electrode 109, the third electrode 154, the fourth electrode 150, the fifth electrode 114, and the sixth electrode 110 are formed.

By the steps described above, the optical element 100 in accordance with the present embodiment shown in FIG. 1 and FIG. 2 is obtained.

1-4. Action and Effect

According to the optical element 100 in accordance with the present embodiment, in the photonic crystal section 153a formed in the second contact layer 153, at least a part of incident light with a predetermined wavelength, which is to be absorbed by the first photoabsorption layer 152, propagates while being distributed in a plane thereof. This causes a state in which the incident light spreads in a plane of the first photoabsorption layer 152. As a result, the first photoabsorption layer 152 can effectively absorb light. To achieve a low voltage operation and high speed operation of the first optical detection section 122, the first photoabsorption layer 152 may preferably be made into a thinner film. In this case, however, the photoabsorption coefficient at the first photoabsorption layer 152 may be lowered. However, according to the optical element 100 in accordance with the present embodiment, high photosensitivity in detecting received light can be maintained even when the first photoabsorption layer 152 is made into a thinner film.

Also, according to the optical element 100 in accordance with the present embodiment, the second contact layer 153 of the first optical detection section 122 has the photonic crystal section 153a, such that light that is distributed in a plane of the first photoabsorption layer 152 and propagates therein can be set to a desired wavelength. In other words, a wavelength of light that is to be absorbed most by the first photoabsorption layer 152 can be selected. By this, for example, when the first photoabsorption layer 152 of the first optical detection section 122 and the second photoabsorption layer 112 of the second optical detection section 120 are formed from the same material, the wavelength of light that is absorbed most by the first photoabsorption layer 152 and the wavelength of light that is absorbed most by the second photoabsorption layer 112 can be made different from each other. Accordingly, for example, when the optical element 100 in accordance with the present embodiment is used for two-way optical communications, the wavelength (or wavelength band) for transmission and the wavelength (or wavelength band) for reception can be made different from each other, and therefore the degree of freedom in designing devices can be improved. It is noted that, in the present embodiment, the wavelength of light that is absorbed most is a wavelength of light with the maximum absorption intensity among light that is absorbed by a photoabsorption layer.

Furthermore, according to the optical element 100 in accordance with the present embodiment, the first optical detection section 122 that functions as an optical detection element for reception for two-way optical communications and the second optical detection section 120 that functions as an optical detection section for monitoring for the surface-emitting laser 140 are individually formed. By this, the circuit of the circuit can be readily designed, and the algorithm can be simplified.

Also, according to the optical element 100 in accordance with the present embodiment, a part of light output of the surface-emitting laser 140 is monitored by the second optical detection section 120 and the result is fed back to the drive circuit, such that changes in the output caused by changes in the temperature can be corrected, and a stable optical output can be obtained.

1-5. Modified Examples

Figure 11:
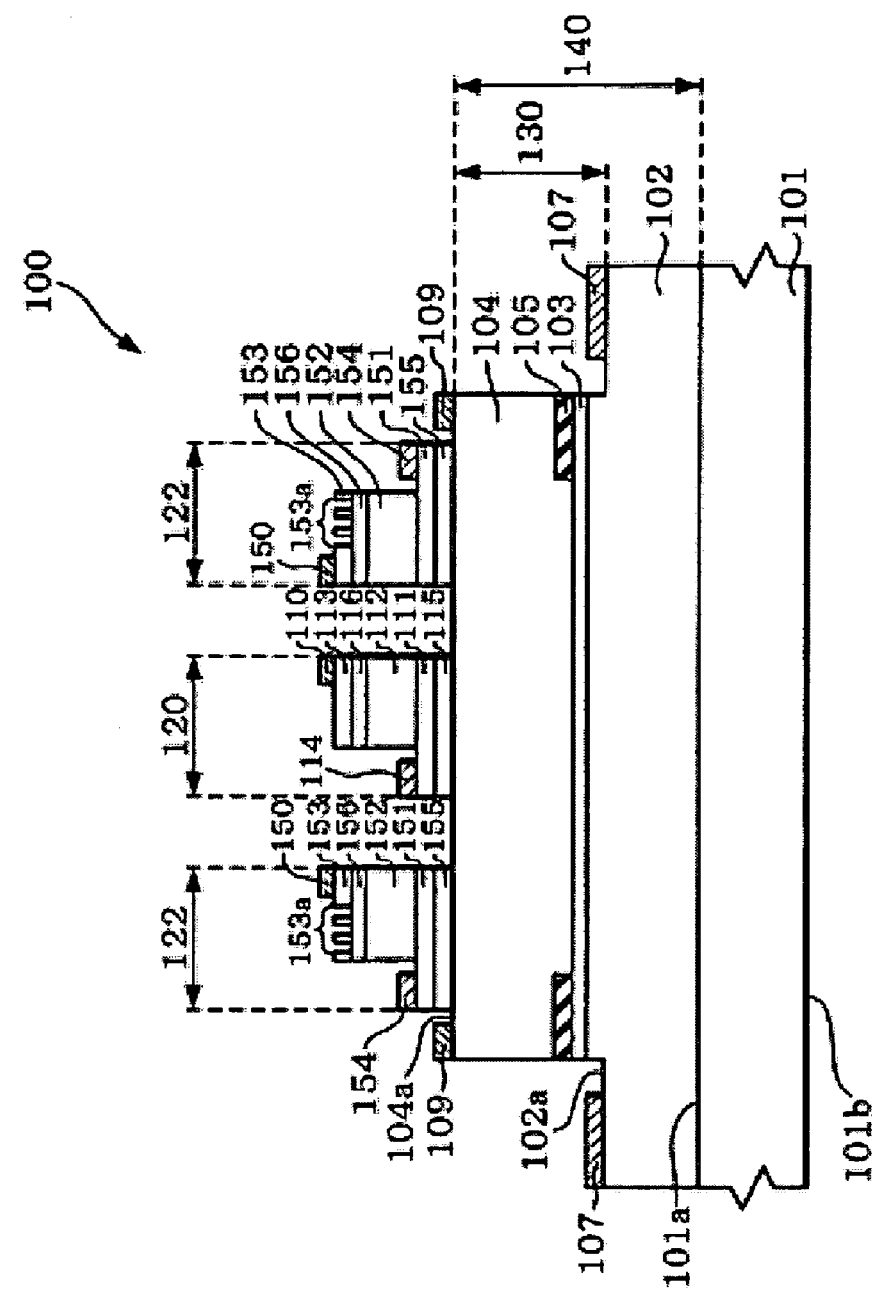
FIG. 11 is a cross-sectional view schematically showing a modified example of the optical element in accordance with the first embodiment of the invention.
Figure 12:
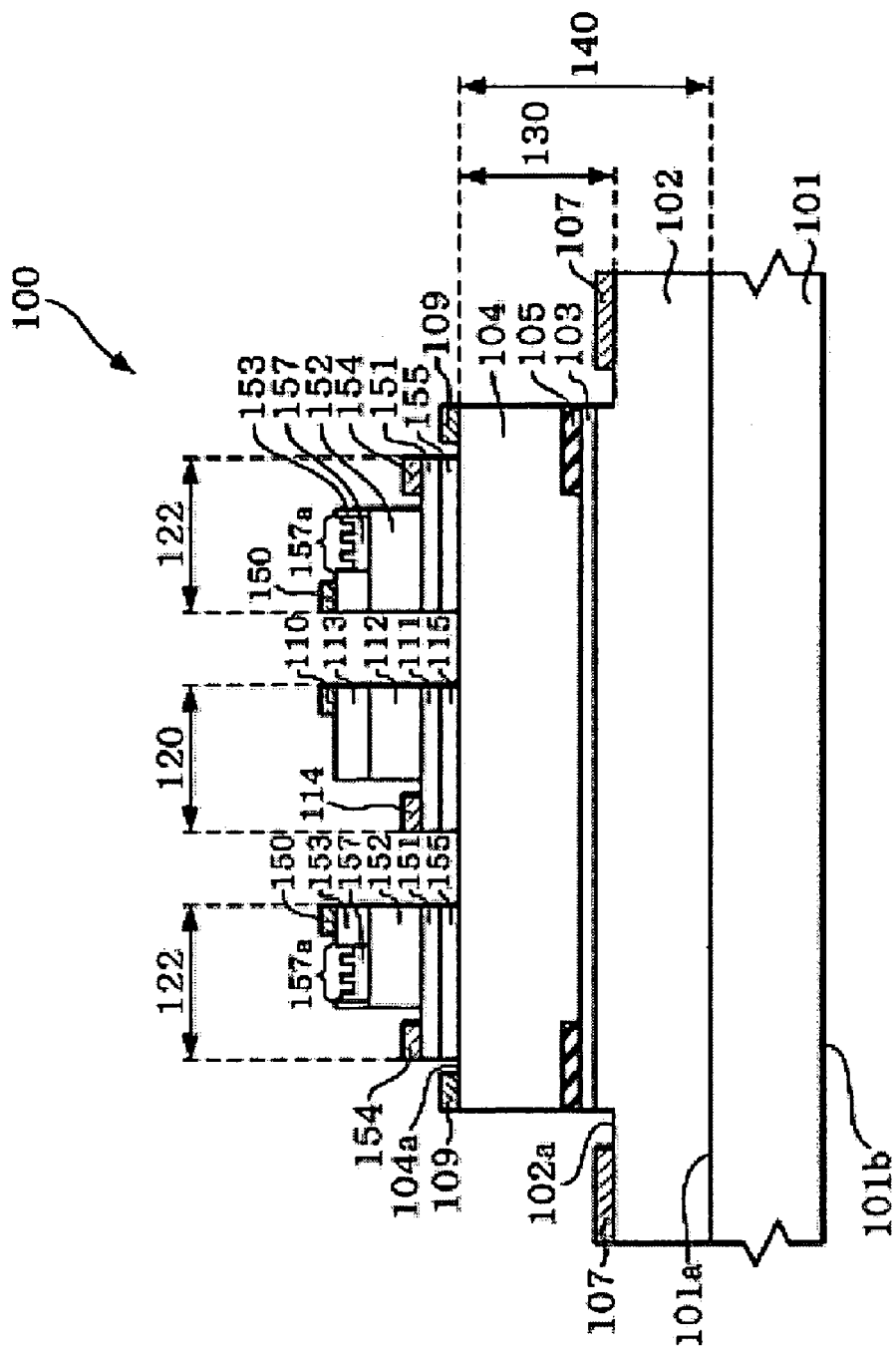
FIG. 12 is a cross-sectional view schematically showing a modified example of the optical element in accordance with the first embodiment of the invention.
Figure 13:
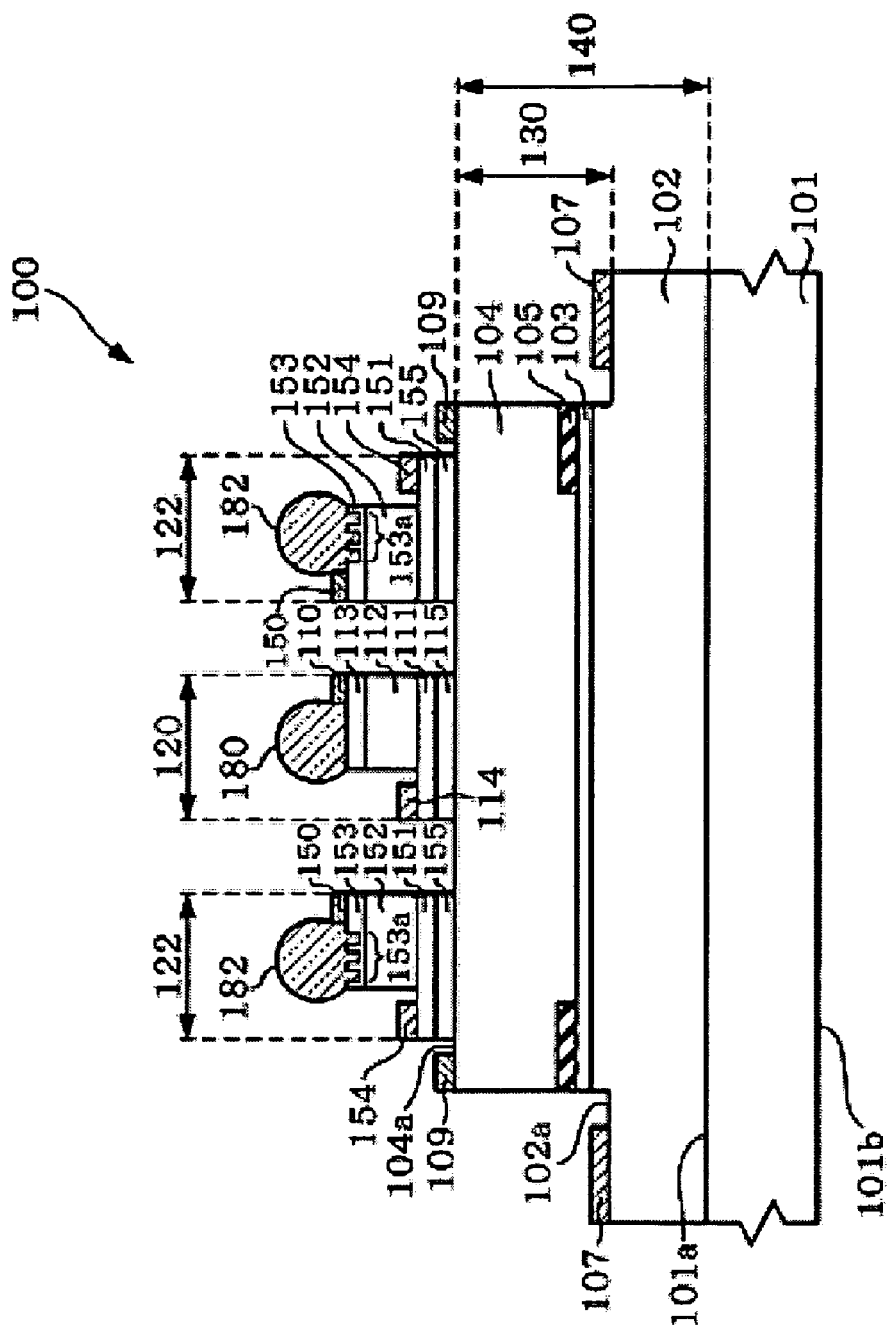
FIG. 13 is a cross-sectional view schematically showing a modified example of the optical element in accordance with the first embodiment of the invention.

Next, modified examples of the optical element 100 in accordance with the first embodiment are described. FIG. 11–FIG. 13 are cross-sectional views showing modified examples of the optical element 100 in accordance with the present embodiment. Members having functions substantially similar to those of the optical element 100 shown in FIG. 1 and FIG. 2 are appended with the same signs and their detailed description is omitted, and main differences are described.

First, in accordance with an embodiment shown in FIG. 11, a first intermediate layer 156 is formed between a first photoabsorption layer 152 and a second contact layer 153, and a second intermediate layer 116 is formed between a second photoabsorption layer 112 and a fourth contact layer 113. The first intermediate layer 156 and the second intermediate layer 116 may preferably have a substantially small film thickness compared to other epitaxial layers. Also, the first intermediate layer 156 and the second intermediate layer 116 can be semiconductor layers with an impurity being doped. Further, the first intermediate layer 156 may preferably be composed of a material with an etching selection ratio smaller than that of the second contact layer 153. By so doing, when a photonic crystal structure is formed in the second contact layer 153 by periodically forming open holes therein, the first intermediate layer 156 functions as an etching stopper, such that a wet etching technique or the like can be readily applied. Also, by forming the first intermediate layer 156 into a thin film, and providing a photonic crystal section 153*a* with open holes, the first photoabsorption layer 152 and the photonic crystal section 153*a* can be brought much closer to each other.

Next, in accordance with an embodiment shown in FIG. 12, a photonic crystal structure is not provided in a second contact layer 153. Instead, a region of the second contact layer 152 on which light is incident is removed by etching, a protection layer 157 is formed in the removed region, and a photonic crystal section 157*a* is formed in the protection layer 157. By so doing, the range for selecting materials that compose the photonic crystal structure can be broadened. For this reason, for example, by selecting a resin material with an excellent moldability, the working process can be facilitated. For example, a polyimide resin can be used as the protection layer 157.

Next, in accordance with an embodiment shown in FIG. 13, a first lens section 182 is formed above a first optical detection section 122 and a second lens section 180 is formed above a second optical detection section 120. More concretely, the first lens section 182 is formed on a second contact layer 153, and the second lens section 180 is formed on a fourth contact layer 113. The first lens section 182 and the second lens section 180 can have a function to focus, polarize or spectrally split light incident upon the first lens section 182 and the second lens section 180, respectively. The first lens section 182 and the second lens section 180 each have a three-dimensional configuration according to their specific usage and function. The first lens section 182 and the second lens section 180 can be formed through making a solution of lens material, discharging droplets of the solution on the second contact layer 153 and the fourth contact layer 113 by a droplet discharge method, and then hardening the material in the liquid state. For example, an ink jet apparatus or a dispenser can be used for the droplet discharge method. As the method for hardening the lens material, a method for irradiating ultraviolet rays, a method for applying heat or the like can be enumerated depending on the characteristics of the material.

Because the first lens section 182 is formed above the first optical detection section 122, the light incident efficiency to the first photoabsorption layer 152 can be improved. Also, because the second lens section 180 is formed above the second optical detection section 120, the radiation angle of a laser beam that is emitted from the optical element 100 can be narrowed. Also, because the optical element 100 has the first lens section 182 and the second lens section 180, an allowable range of optical axis deviations is broadened (in other words, the tolerance is improved), when, for example, an optical waveguide and the optical element 100 are optically connected to each other.

Although not illustrated, a lens section can be formed over the entire upper surface of the columnar section 130. In other words, the first optical detection section 122 and the second optical detection section 120 can be covered by a single lens section. Alternatively, the first lens section 182 alone can be formed without forming the second lens section 180, or vice versa.

Although not illustrated, on the second contact layer 153*a* may be formed a protection layer, or a non-reflection coat layer that is set to lower the reflection coefficient to light that is incident upon the first optical detection section 122, if necessary. The non-reflection coat layer may be formed from a known material that is used on, for example, a light emission surface of a semiconductor photoamplifier. By so doing, the total reflection of incident light on the upper surface of the second contact layer 153 can be reduced, such that more light can be taken in the interior of the first optical detection section 122. It is noted that, when another material is to be filled in the holes 153*b*, a material having a large difference in refractive index from that of the material of the second contact layer 153 may preferably be selected.

Also, although not illustrated, in accordance with another modified example, a first optical reflection layer may be provided between the first isolation layer 155 and the first contact layer 151, if necessary. The first optical reflection layer can reflect light that has not been absorbed by and passed through the first photoabsorption layer 152, and return the light toward the first photoabsorption layer 152 again. By this, the photoresponse of the first optical detection section 122 in detecting received light can be improved. The first optical reflection layer may be formed from a laminated layer of alternately laminating plural kinds of semiconductor layers with different refractive indexes, such as, for example, GaAs and AlGaAs. The first optical reflection layer is not particularly limited as long as it has reflectivity to incident light, and for example, a metal layer, a dielectric multilayer film or the like can be used. Similarly, a second optical reflection layer may be provided on the fourth contact layer 113. The second optical reflection layer can reflect light that has not been absorbed by and passed through the second photoabsorption layer 112, and return the light toward the second photoabsorption layer 112 again. By this, the photoresponse of the second optical detection section 120 in detecting received light can be improved. The second optical reflection layer is not particularly limited as long as it has reflectivity to incident light, and for example, a material similar to that of the first optical reflection layer can be used.

Also, although not illustrated, in accordance with another modified example, a photonic crystal section can be formed in the second optical detection section 120, if necessary. More concretely, for example, a photonic crystal structure can be formed in the third contact layer 111. By this, at least a part of incident light with a specified wavelength that is to be absorbed by the second photoabsorption layer 112 is distributed in a plane of the second photoabsorption layer 112 and propagates therein. In other words, this places the incident light in a state spread in a plane of the second photoabsorption layer 112. As a result, the second photoabsorption layer 112 can effectively absorb light. Also, to achieve a low voltage operation of the second optical detection section 120, the second photoabsorption layer 112 is desired to be made into a thinner film. In this case, however, the photoabsorption coefficient at the second photoabsorption layer 112 may be lowered. However, according to the modified example, a high photoresponse level in detecting received light can be maintained even when the second photoabsorption layer 112 is made into a thinner film.

Also, according to this modified example, the third contact layer 111 of the second optical detection section 120 has the photonic crystal section, such that light that is distributed in a plane of the second photoabsorption layer 112 and propagates therein can be set to a desired wavelength. In other words, a wavelength of light that is to be absorbed most by the second photoabsorption layer 112 can be selected. By this, for example, when the first photoabsorption layer 152 of the first optical detection section 122 and the second photoabsorption layer 112 of the second optical detection section 120 are formed from the same material, the wavelength of light that is absorbed most by the first photoabsorption layer 152 and the wavelength of light that is absorbed most by the second photoabsorption layer 112 can be made different from each other. Accordingly, for example, when the optical element 100 is used for two-way optical communications, the wavelength (or wavelength band) for transmission and the wavelength (or wavelength band) for reception can be made different from each other, and therefore the degree of freedom in designing devices can be improved.

The examples above are described as to the case where common semiconductor layers are patterned to form the first optical detection section 122 and the second optical device 120 (see FIG. 3 through FIG. 5). However, the first optical detection section 122 and the second optical detection section 120 can be formed by patterning independent semiconductor layers. In other words, a semiconductor multilayer film that becomes the first optical detection section 122 and a semiconductor multilayer film that becomes the second optical detection section 120 can be laminated on the substrate 101 in independent steps, respectively.

It is noted that all of the modified examples described above are similarly applied to optical elements in accordance with second-fourth embodiments to be described below.

2. Second Embodiment 2-1. Structure of Optical Element

Figure 14:
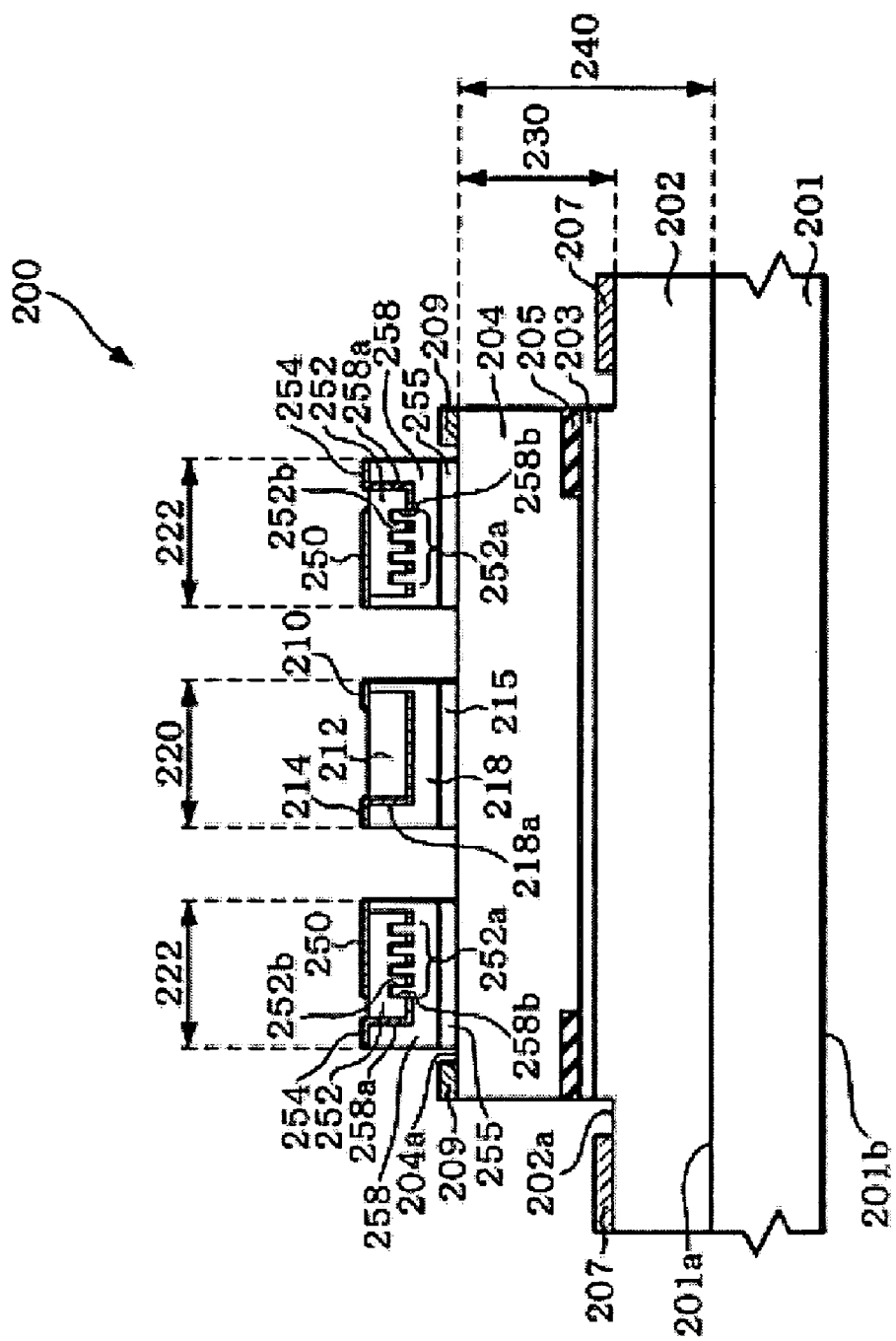
FIG. 14 is a cross-sectional view schematically showing an optical element in accordance with a second embodiment of the invention.
Figure 15:
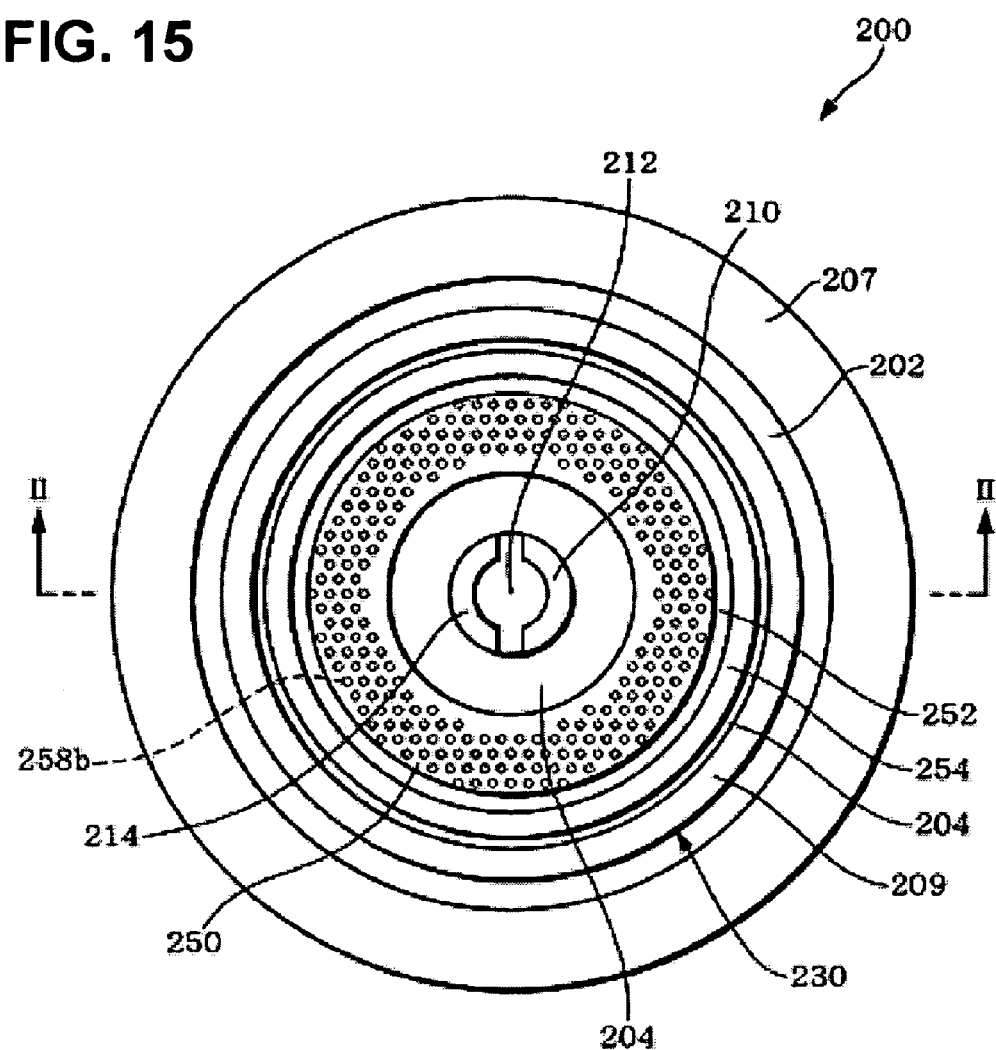
FIG. 15 is a plan view schematically showing the optical element in accordance with the second embodiment of the invention.

FIG. 14 schematically shows a cross-sectional view of an optical element 200 in accordance with a second embodiment of the invention. FIG. 15 schematically shows a plan view of the optical element 200 shown in FIG. 14. It is noted that FIG. 14 is a view showing a cross section taken along a line II—II of FIG. 14. In the optical element 200 in accordance with the present embodiment, a first optical detection section 222 and a second optical detection section 220 are different from those of the optical element 100 in accordance with the first embodiment. In the optical element 200 in accordance with the present embodiment, constituting elements similar to the constituting elements "1xx" of the optical element 100 in accordance with the first embodiment are indicated as "2xx." In other words, because the reference numerals "2xx" refer to constituting elements similar to those indicated by "1xx" of the optical element 100 in accordance with the first embodiment, and the corresponding elements are basically made of the same materials, their detailed description is omitted.

The first optical detection section 222 is formed from a first base section 258 having a first concave section 258*a*, a third electrode (cathode) 254 formed extending from a main surface of the first base section 258 to the interior of the first concave section 258*a*, a first photoabsorption layer 252 formed in a manner to cover protruded sections 258*b* at a bottom surface of the first concave section 258*a* of the first base section 258, and a fourth electrode (anode) 250 that is formed on the first photoabsorption layer 252. The second optical detection section 220 is formed from a second base section 218 having a second concave section 218*a*, a fifth electrode (cathode) 214 formed extending from a main surface of the second base section 218 to the interior of the second concave section 218*a*, a second photoabsorption layer 212 formed on a bottom surface of the second concave section 218*a* of the second base section 212, and a sixth electrode (anode) 210 that is formed on the second photoabsorption layer 212.

The first base section 258 and the second base section 218 may be formed from an appropriate material such as glass, resin or semiconductor depending on their usage. For example, when light is to be introduced from back sides (surfaces on the opposite side of the main surface) of the first base section 258 and the second base section 218, a transparent material, such as, for example, quartz glass, polycarbonate, polyimide, a transparent plastic material such as PET, or the like can be used. Also, the first optical detection section 222 of the present embodiment uses a structure provided with a photonic crystal section 252*a* formed by providing protruded sections 258*b* at the first base section 258 to thereby pattern the first photoabsorption layer 252 that covers the protruded sections 258*b*. For this reason, a material having a sufficient difference in refractive index from that of the material of the first photoabsorption layer 252 may preferably be selected as the material of the first base section 258.

The third electrode 254 and the fifth electrode 214 may be formed from a metal, an alloy, an electrically conductive compound, or a mixture of the above having a small work function. For example, materials described in JP-A-8-248276 may be used as such electrode materials.

The fourth electrode 250 and the sixth electrode 210 may be formed from a metal, an alloy, an electrically conductive compound, or a mixture of the above having a large work function. For example, when an optically transparent material is used as the fourth electrode 250 and the sixth electrode 210, an electrically conductive compound, such as, CuI, ITO, $SnO_2$, ZnO or the like can be used. When transparency is not required, a metal such as gold can be used.

The first photoabsorption layer 252 and the second photoabsorption layer 212 are formed from an organic material having photoabsorption property (or photoelectric conversion property), and may be formed from any of the organic materials described in, for example, JP-A-2001-297874 or JP-A-2003-101060. Also, the first photoabsorption layer 252 has a plurality of holes 252*b* that are periodically arranged. In other words, the protruded sections 258*b* of the first base section 258 are formed inside the holes 252*b* of the first photoabsorption layer 252. In the first optical detection section 222 of the present embodiment, a refractive index difference is present between the first photoabsorption layer 252 and the protruded sections 258*b* of the first base section 258 formed inside the holes 252*b* of the first photoabsorption layer 252, such that a periodic refractive index distribution is created in a plane that intersects the direction of light incident upon the first optical detection section 222. Further, the photonic crystal section 252*a* having a photonic crystal structure is formed in the first photoabsorption layer 252. The photonic crystal section 252*a* may have a two-dimensional photonic crystal structure by providing the protruded sections 258*b* of the first base section 258 in a manner that the plane configuration of each of the holes 252*b* becomes to be a circular shape or a polygonal shape. Alternatively, each of the protruded sections 258*b* may be formed with an asymmetrical cross-sectional shape, such-that each of the holes 252b of the first photoabsorption layer 252 has an asymmetrical cross-sectional shape. Also, the photonic crystal section 252a may be made to have a one-dimensional photonic crystal structure by providing the protruded sections 258b of the first base section 258 in a manner to form a plurality of grooves instead of the plurality of holes 252b. In this case, the photonic crystal section 252a functions as a diffraction grating. Thus, the photonic crystal section 252a is formed such that at least a part of light incident upon the first optical detection section 222 becomes diffracted light, which is distributed in a plane of the first photoabsorption layer 252 and propagates in the first optical detection section 222.

2-2. Method for Manufacturing Optical Element

Next, an example of a method for manufacturing the optical element 200 in accordance with the second embodiment of the invention is described with reference to FIG. 3–FIG. 8, and FIG. 14–FIG. 19. FIG. 16–FIG. 19 are cross-sectional views schematically showing an example of a method for manufacturing the optical element 200 shown in FIG. 14 and FIG. 15, and correspond to the cross-sectional view shown in FIG. 14, respectively.

(1) First, the steps up to forming an oxidized constricting layer 205 are conducted in a manner similar to the process conducted in manufacturing the optical element 100 in accordance with the first embodiment described above (see FIG. 3–FIG. 8).

Figure 16:
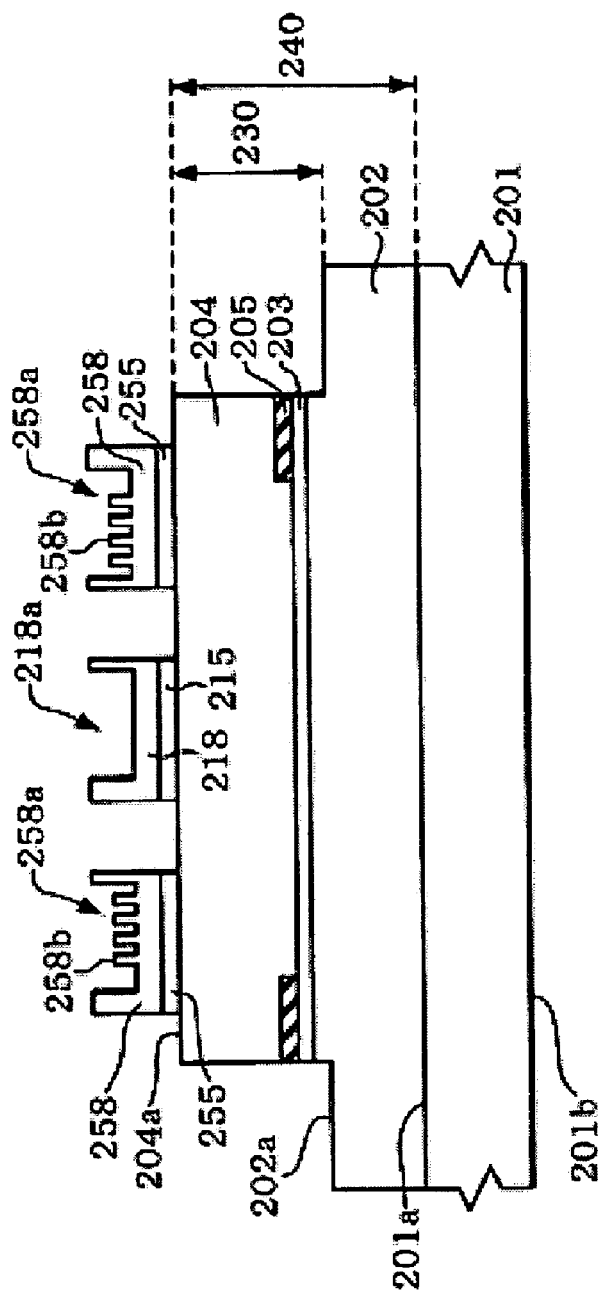
FIG. 16 is a cross-sectional view schematically showing a method for manufacturing the optical element in accordance with the second embodiment.

(2) As shown in FIG. 16, a first concave section 258a is formed in a first base section 258 of a first optical detection section 222, and a second concave section 218a is formed in a second base section 218 of a second optical detection section 220. At this time, patterning is conducted so that plural protruded sections 258b are periodically arranged at a bottom surface of the first concave section 258a. The patterning may be conducted by using, for example, a reactive ion etching (RIE) method or an electron beam drawing method. When a two-dimensional photonic crystal structure is to be formed in a first photoabsorption layer 252, the patterning may be conducted in a manner that the protruded sections 258b each have a circular shaped or polygonal shaped plane configuration, and are arranged in a square lattice configuration or a triangular lattice configuration. When a one-dimensional photonic crystal structure is to be formed in the first photoabsorption layer 252, the patterning may be conducted in a manner that the protruded sections 258b are formed be in stripes.

Figure 17:
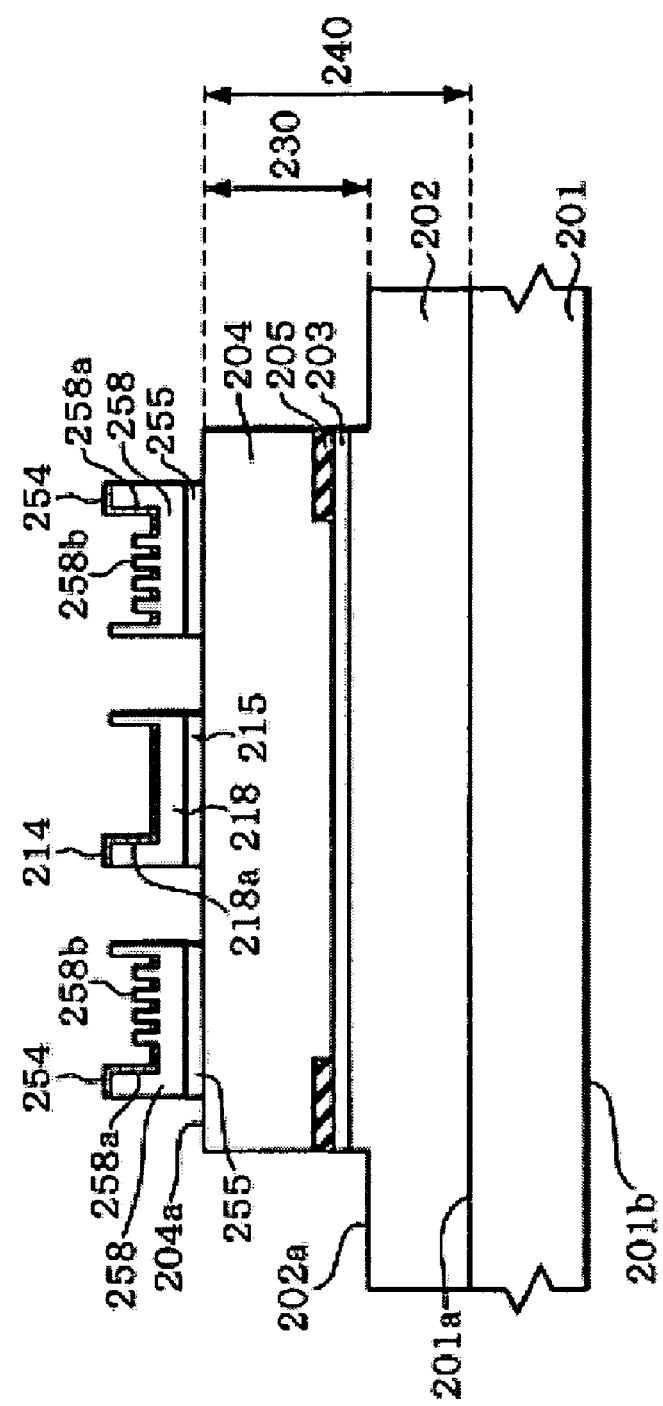
FIG. 17 is a cross-sectional view schematically showing the method for manufacturing the optical element in accordance with the second embodiment.

(3) Next, as shown in FIG. 17, a third electrode 254 is formed in a manner to extend from the main surface of the first base section 258 of the first optical detection section 222 to the interior of the first concave section 258a, and a fifth electrode 214 is formed in a manner to extend from the main surface of the second base section 218 of the second optical detection section 220 to the interior of the second concave section 218a. The third electrode 254 and the fifth electrode 214 can be formed by using, for example, a vapor deposition method or a sputter method. To increase the accuracy in patterning dimension of the photonic crystal structure that is to be formed in the first photoabsorption layer 252, the third electrode 254 may be formed by using, for example, a mask vapor deposition method or a mask sputter method, when it is desired that the material of the third electrode 254 would not adhere to the protruded sections 258b.

Figure 18:
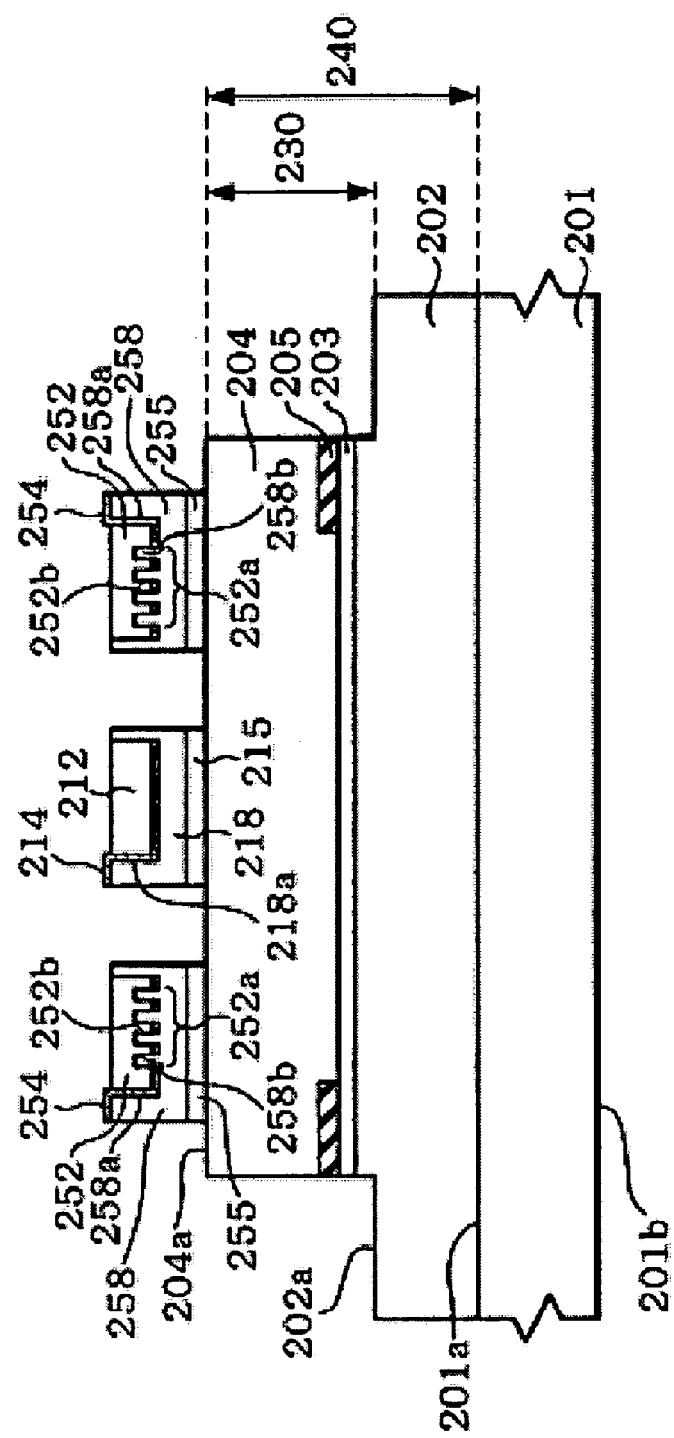
FIG. 18 is a cross-sectional view schematically showing the method for manufacturing the optical element in accordance with the second embodiment.

(4) Next, as shown in FIG. 18, the first photoabsorption layer 252 is formed in a manner to cover the protruded sections 258b at the first concave section 258a of the first base section 258 and a second photoabsorption layer 212 is formed in the second concave section 218a of the second base section 218, with the organic material described above. The first photoabsorption layer 252 and the second photoabsorption layer 212 can be formed by, for example, a vapor deposition method, as described in JP-A-2003-101060. The first photoabsorption layer 252 and the second photoabsorption layer 212 can be formed through preparing an organic material in a solution, filling the solution organic material in the first concave section 258a and the second concave section 218a by a droplet discharge method, and then hardening the solution organic material. For example, an ink jet apparatus or a dispenser can be used for the droplet discharge method. As the method for hardening the organic material, a method for irradiating ultraviolet light, a method for applying heat and the like can be enumerated. By this step, the first photoabsorption layer 252 is also patterned according to the pattern configuration of the protruded sections 258b whereby the holes 252b that are periodically arranged are formed. By this, the photonic crystal section 252a is formed in the first photoabsorption layer 252.

Figure 19:
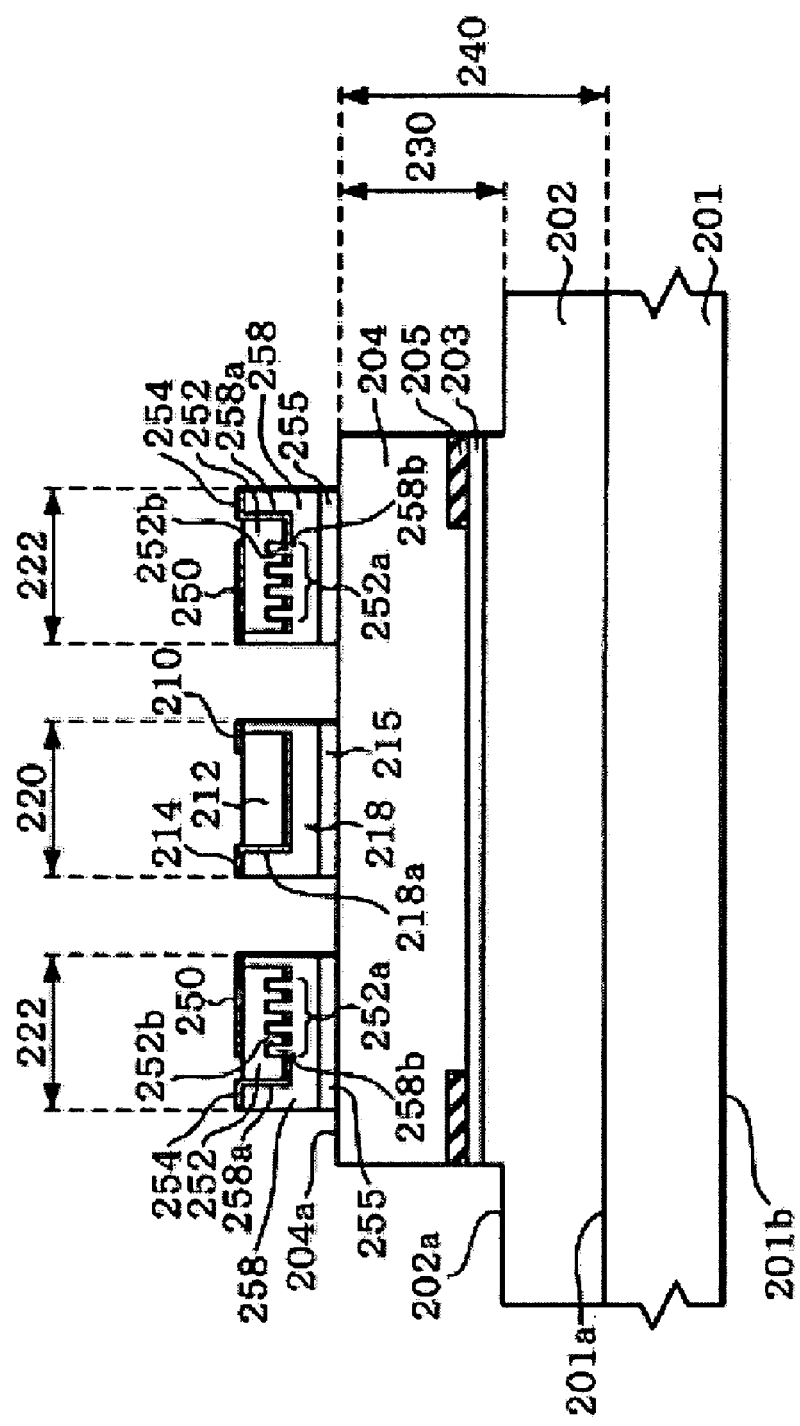
FIG. 19 is a cross-sectional view schematically showing the method for manufacturing the optical element in accordance with the second embodiment.

(5) Next, as shown in FIG. 19, a fourth electrode 250 is formed on the first photoabsorption layer 252, and a sixth electrode 210 is formed on the second photoabsorption layer 212. The fourth electrode 250 and the sixth electrode 210 can be formed by a film forming method similar to the method used for forming the third electrode 254 and the fifth electrode 214. By the steps described above, the first optical detection section 222 and the third optical detection section 220 are formed.

(6) Next, as shown in FIG. 14 and FIG. 15, a first electrode 207 and a second electrode 209 are formed in a manner similar to the process conducted in manufacturing the optical element 100 in accordance with the first embodiment described above.

By the steps described above, the optical element 200 in accordance with the present embodiment is obtained, as shown in FIGS. 14 and 15.

2-3. Action and Effect

The optical element 200 of the present embodiment achieves substantially the same actions and effects as the actions and effects described above in conjunction with the first embodiment.

Further, the optical element 200 in accordance with the present embodiment uses an organic material as the material of the first photoabsorption layer 252. When the organic material has a high level of insulation property, the first photoabsorption layer 252 is desired to be made into a thin film. However, when the first photoabsorption layer 252 is made into a thin film, its photoabsorption region may be reduced, and therefore its photoabsorption efficiency may be lowered. However, according to the optical element in accordance with the present embodiment, because light that is incident upon the first optical detection section 222 is distributed in a plane of the first photoabsorption layer 252 and propagates therein, the photo-response for detecting received light can be maintained at a high level even when the first photoabsorption layer 252 is made into a thin film.

2-4. Modified Examples

The example above is described as to the case in which the third electrode 254 is formed inside the first concave section 258a of the first base section 258, and the fifth electrode 214 is formed inside the second concave section 218a of the second base section 218. However, for example, when the first base section 258 and the second base section 218 have conductivity, a third electrode 254 may be formed between the first base section 258 and the first isolation layer 255, and a fifth electrode 214 may be formed between the second base section 218 and the second isolation layer 215.

Figure 20:
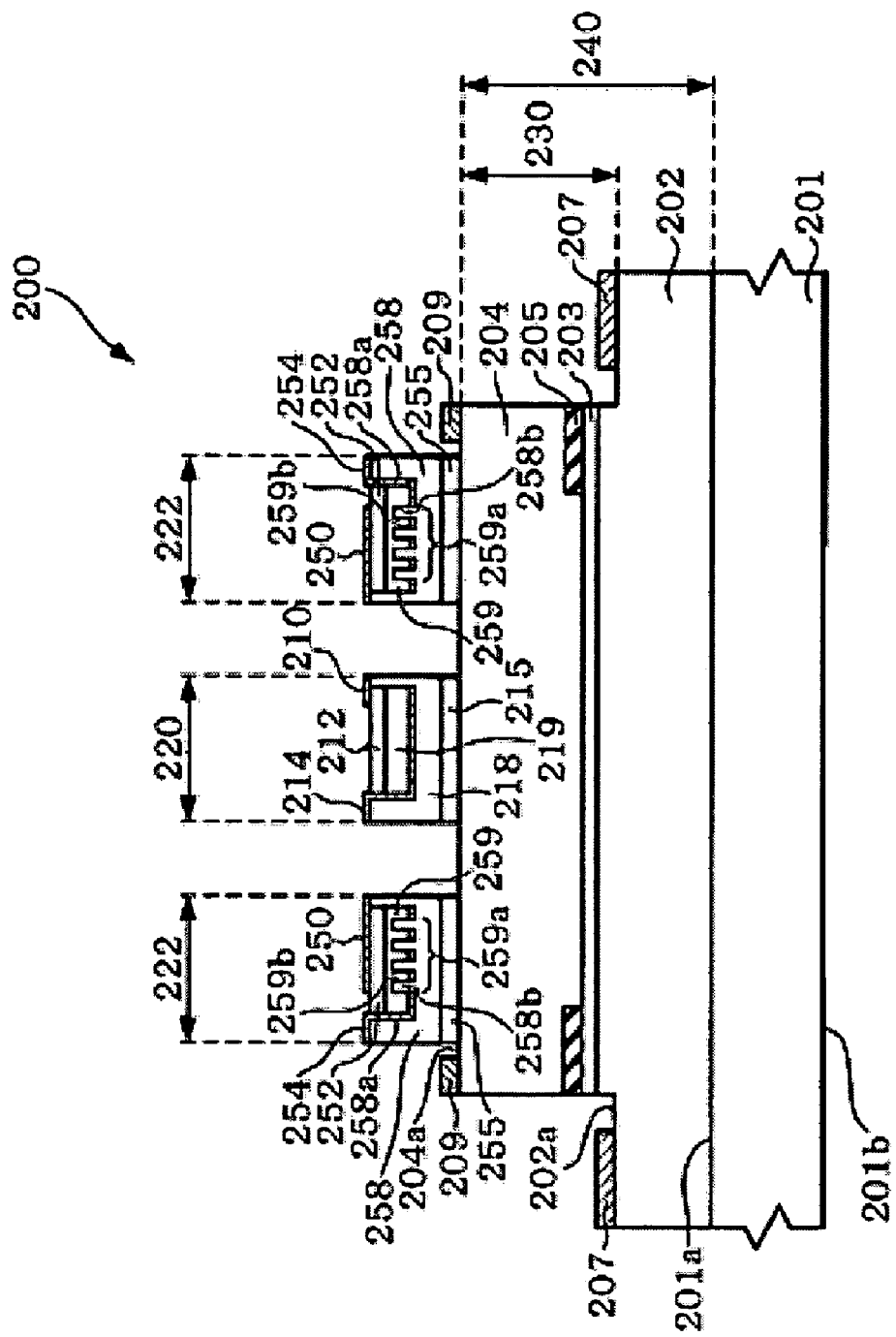
FIG. 20 is a cross-sectional view schematically showing a modified example of the optical element in accordance with the second embodiment of the invention.

Next, another modified example of the optical element 200 of the present embodiment is described. FIG. 20 is a cross-sectional view showing a modified example of the optical element 200 of the present embodiment. In its first optical detection section 222, a first charge transfer layer 259 is formed between the first photoabsorption layer 252 and the third electrode 254. The first charge transfer layer 259 is provided for transferring carriers generated in the photoabsorption action in the first photoabsorption layer 252 to the third electrode 254, when the carrier transfer capability is low in the first photoabsorption layer 252. Similarly, at the second optical detection section 220, a second charge transfer layer 219 is formed between the second photoabsorption layer 212 and the fifth electrode 214. As the material for the first charge transfer layer 259 and the second charge transfer layer 219, any of the materials described in JP-A-8-248276 or JP-A-2003-101060 may be used. Also, periodically arranged plural holes 259b are formed in the first charge transfer layer 259. By this, a photonic crystal section 259a can be formed in the first charge transfer layer 259, for distributing light incident upon the first optical detection section 222 in a plane of the first photoabsorption layer 252. It is noted that the first charge transfer layer 259 can also be formed between the first photoabsorption layer 252 and the fourth electrode 250, and the second charge transfer layer 219 can also be formed between the second photoabsorption layer 212 and the sixth electrode 210.

3. Third Embodiment 3-1. Structure of Optical Element

Figure 21:
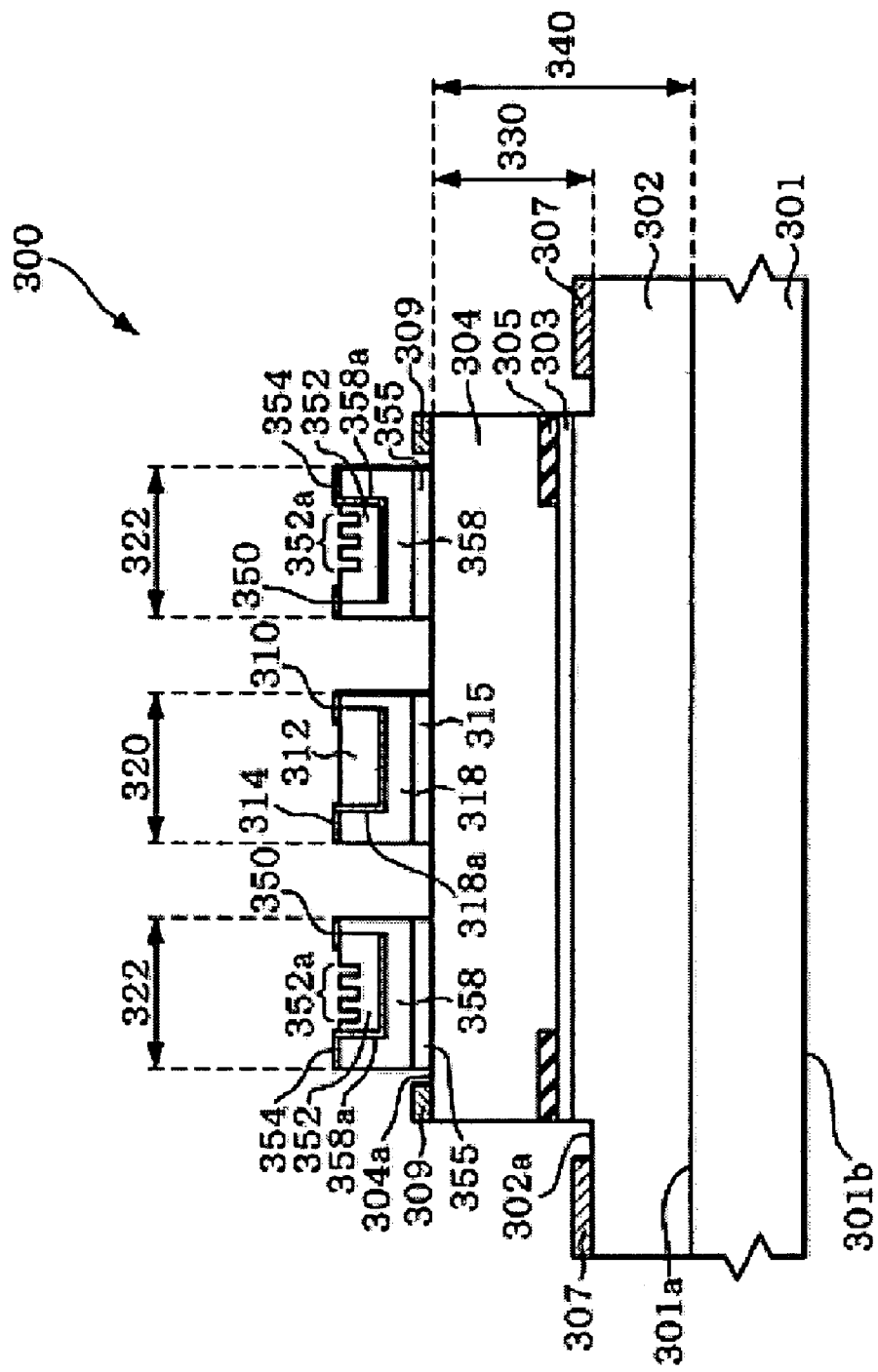
FIG. 21 is a cross-sectional view schematically showing an optical element in accordance with a third embodiment of the invention.
Figure 22:
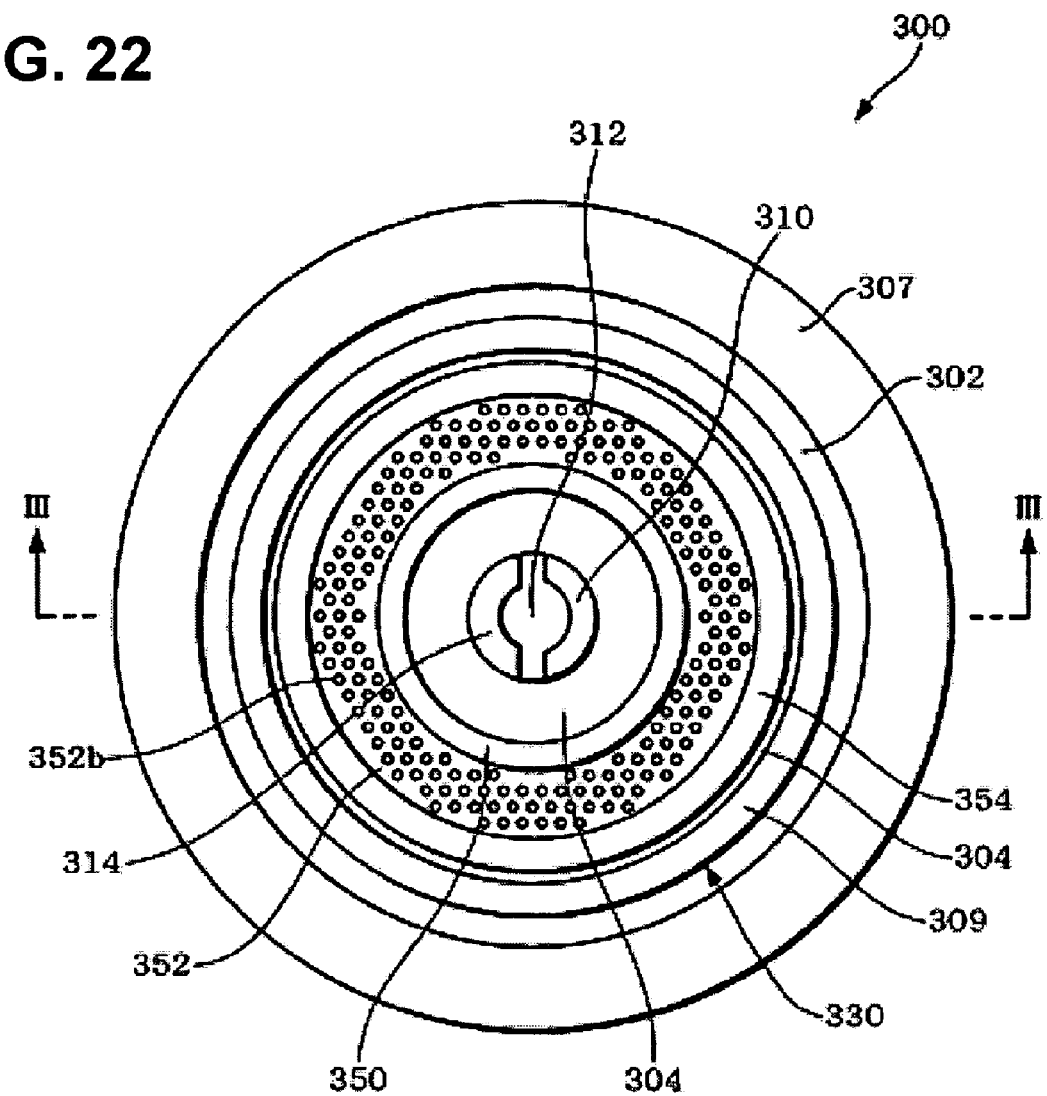
FIG. 22 is a plan view schematically showing the optical element in accordance with the third embodiment of the invention.

FIG. 21 is a cross-sectional view schematically showing an optical element 300 in accordance with a third embodiment of the invention. FIG. 22 is a plan view schematically showing the optical element 300 shown in FIG. 21. It is noted that FIG. 21 is a view showing a cross section taken along a line III—III of FIG. 22. In the optical element 300 in accordance with the present embodiment, its first optical detection section 322 and second optical detection section 320 are different from those of the optical element 200 of the second embodiment. In the optical element 300 in accordance with the present embodiment, constituting elements similar to the constituting elements "2xx" of the optical element 200 in accordance with the second embodiment are indicated as "3xx." In other words, because the reference numerals "3xx" refer to constituting elements similar to those indicated by "2xx" of the optical element 200 in accordance with the second embodiment, and the corresponding elements are basically made of the same materials, their detailed description is omitted.

In the second embodiment described above, the photonic crystal section 252a is formed in the first photoabsorption layer 252 by using the protruded sections 258b provided at the first base section 258. In contrast, in accordance with the present embodiment, the photonic crystal section 352a is formed in the first photoabsorption layer 352 by forming the plural holes 352b periodically arranged in the upper portion of the first photoabsorption layer 352.

In the first optical detection section 322, a refractive index difference occurs between the medium (air or the like) in the holes 352b and the organic material composing the first photoabsorption layer 252, whereby the photonic crystal section 352a composes a two-dimensional photonic crystal structure. Also, by patterning the first photoabsorption layer 252 in stripes to thereby form grooves instead of the plural holes 352b, the photonic crystal section 352a can function as a diffraction grating, which defines a one-dimensional photonic crystal structure. The photonic crystal section 352a is formed in a manner that at least a part of light incident upon the first optical detection section 322 becomes diffracted light, which is distributed in a plane of the first photoabsorption layer 252 and propagates in the first optical detection section 322.

3-2 Method for Manufacturing Optical Element

Next, an example of a method for manufacturing the optical element 300 in accordance with the third embodiment of the invention is described with reference to FIG. 3–FIG. 8, and FIG. 21–FIG. 26. FIG. 23–FIG. 26 are cross-sectional views schematically showing a method for manufacturing the optical element 300 shown in FIG. 21 and FIG. 22.

(1) First, the steps up to forming an oxidized constricting layer 305 are conducted in a manner similar to the process conducted in manufacturing the optical element 100 in accordance with the first embodiment described above (see FIG. 3–FIG. 8).

Figure 23:
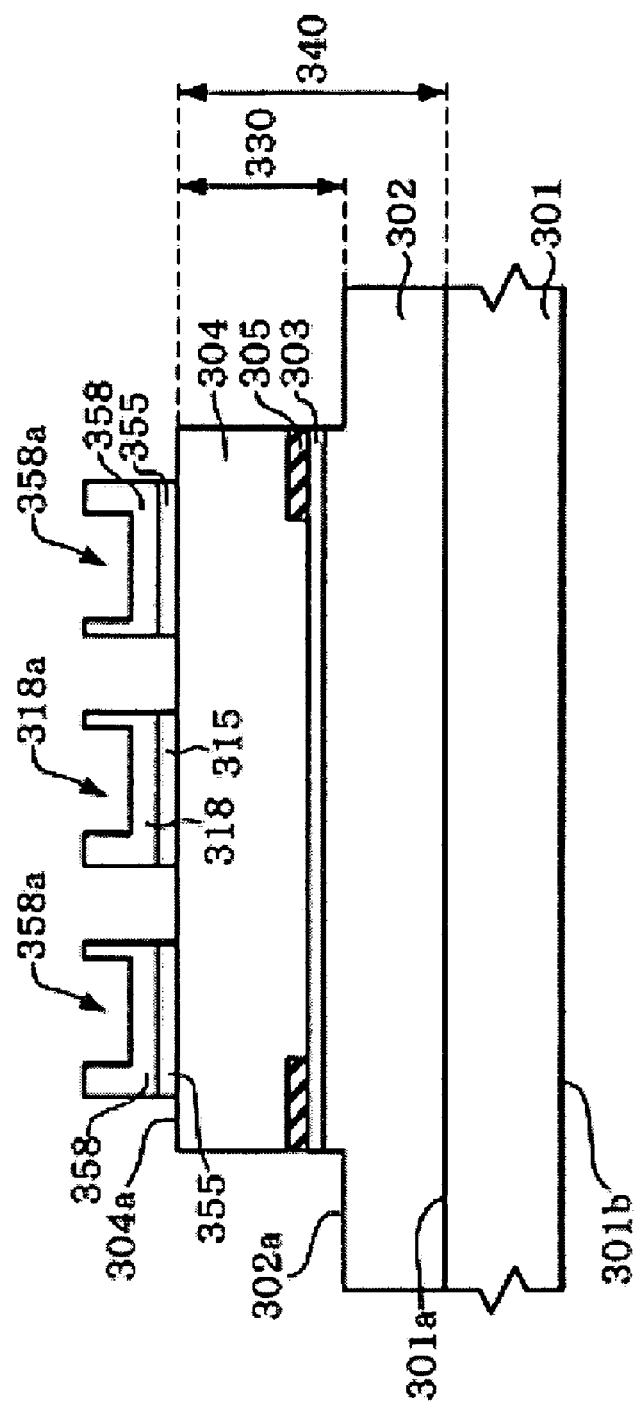
FIG. 23 is a cross-sectional view schematically showing a method for manufacturing the optical element in accordance with the third embodiment.

(2) Next, as shown in FIG. 23, a first concave section 358a is formed in a first base section 358 of a first optical detection section 322, and a second concave section 318a is formed at a second base section 318 of a second optical detection section 320. The first concave section 358a and the second concave section 318a may be formed by using, for example, a reactive ion etching (RIE) method or an electron beam drawing method.

Figure 24:
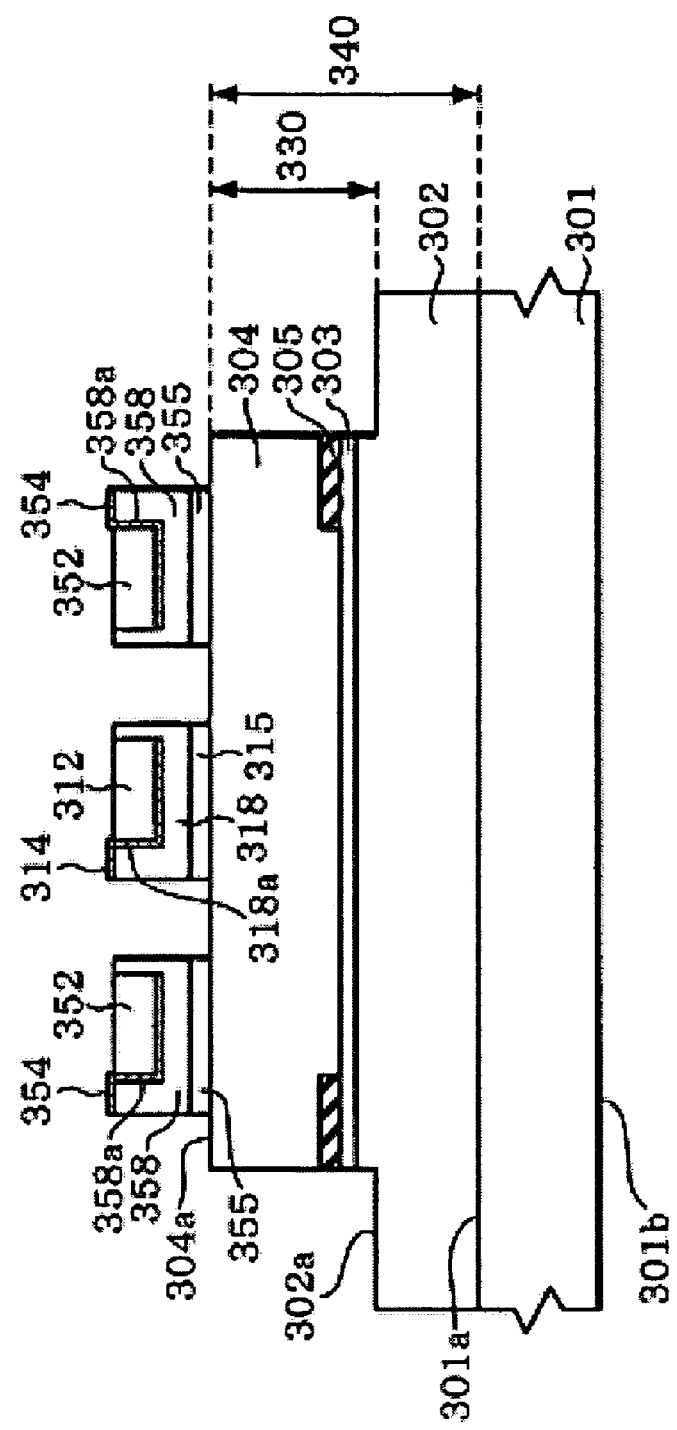
FIG. 24 is a cross-sectional view schematically showing the method for manufacturing the optical element in accordance with the third embodiment.

(3) Next, as shown in FIG. 24, a third electrode 354 is formed in a manner to extend from a main surface of the first base section 358 of the first optical detection section 322 to the interior of the first concave section 358a, and a fifth electrode 314 is formed in a manner to extend from a main surface of the second base section 318 of the second optical detection section 320 to the interior of the second concave section 318a. The third electrode 354 and the fifth electrode 314 can be formed by using, for example, a vapor deposition method or a sputter method. Next, a first photoabsorption layer 352 is formed in the first concave section 358a of the first base section 358 and a second photoabsorption layer 312 is formed in the second concave section 318a of the second base section 318, with the organic material described above. The first photoabsorption layer 352 and the second photoabsorption layer 312 can be formed by, for example, a vapor deposition method. The first photoabsorption layer 352 and the second photoabsorption layer 312 can be formed through preparing an organic material in a solution, filling the solution organic material in the first concave section 358a and the second concave section 318a by a droplet discharge method, and then hardening the solution organic material. For example, an ink jet apparatus or a dispenser can be used for the droplet discharge method. As the method for hardening the organic material, a method for irradiating ultraviolet light, a method for applying heat and the like can be enumerated.

Figure 25:
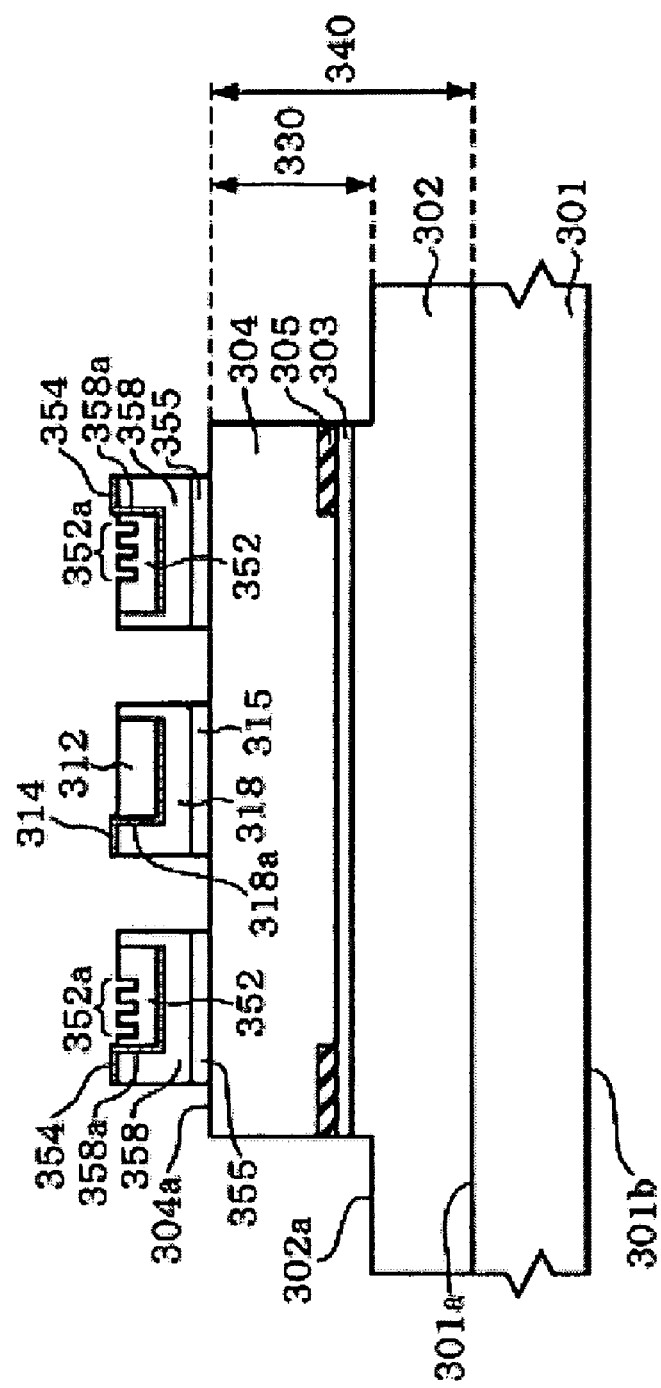
FIG. 25 is a cross-sectional view schematically showing the method for manufacturing the optical element in accordance with the third embodiment.

(4) Next, as shown in FIG. 25, an upper portion of the first photoabsorption layer 352 is patterned, thereby forming holes 352b that are periodically arranged. As a result, a photonic crystal section 352a is formed in the first photoabsorption layer 352. When a two-dimensional photonic crystal structure is to be formed in the first photoabsorption layer 352, the patterning may be conducted in a manner that the holes 352b each have a circular shaped or polygonal shaped plane configuration, and are arranged in a square lattice configuration or a triangular lattice configuration. When a one-dimensional photonic crystal structure is to be formed in the first photoabsorption layer 352, the patterning may be conducted in a manner that grooves are formed in stripes instead of the holes 352b.

It is noted that, when the first photoabsorption layer 352 is formed from a curable resin, the steps shown in FIG. 24 and FIG. 25 can be successively conducted. More concretely, for example, an organic material in a solution is dripped inside the first concave section 358a, and the resin is hardened while being pressed by a stamper or the like with a pattern for forming the holes 352b formed therein. By using such a method, the reproducibility in patterning can be made excellent, and the manufacturing cost can be controlled.

Figure 26:
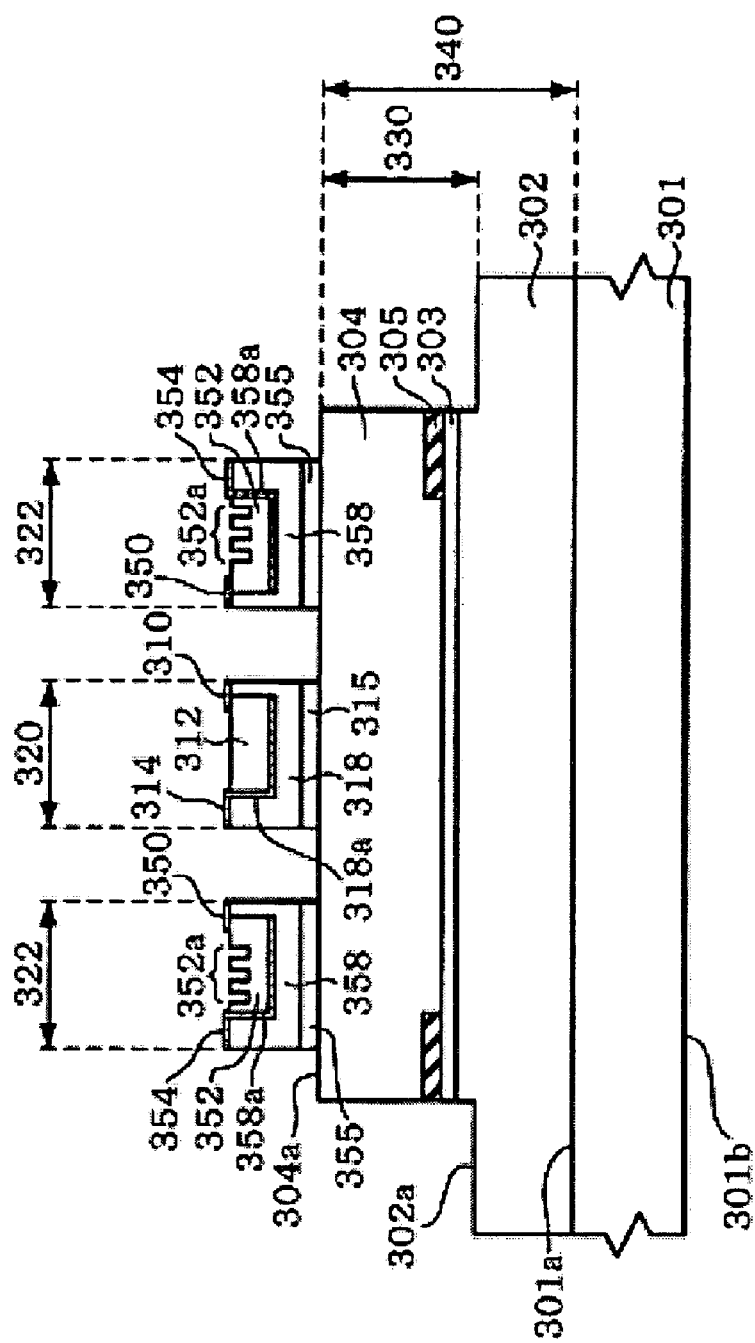
FIG. 26 is a cross-sectional view schematically showing the method for manufacturing the optical element in accordance with the third embodiment.

(5) Next, as shown in FIG. 26, a fourth electrode 350 is formed on the first photoabsorption layer 352, and a sixth electrode 310 is formed on the second photoabsorption layer 312. The fourth electrode 350 and the sixth electrode 310 may be formed by a film forming method similar to the method conducted for forming the third electrode 354 and the fifth electrode 314. By the steps described above, the first optical detection section 322 and the second optical detection section 320 are formed.

(6) Next, as shown in FIG. 21 and FIG. 22, a first electrode 307 and a second electrode 309 are formed in a manner similar to the process conducted in manufacturing the optical element 100 in accordance with the first embodiment described above.

By the steps described above, as shown in FIG. 21 and FIG. 22, the optical element 300 in accordance with the present embodiment can be obtained.

3-3. Action and Effect

The optical element 300 in accordance with the present embodiment achieves substantially the same actions and effects as the actions and effects described above in conjunction with the second embodiment.

3-4. Modified Examples

In the example described above, the third electrode 354 is formed inside the first concave section 358a of the first base section 358, and the fifth electrode 314 is formed inside the second concave section 318a of the second base section 318. However, for example, when the first base section 358 and the second base section 318 have conductivity, a third electrode 354 may be formed between the first base section 358 and the first isolation layer 355, and a fifth electrode 314 may be formed between the second base section 318 and the second isolation layer 315.

Figure 27:
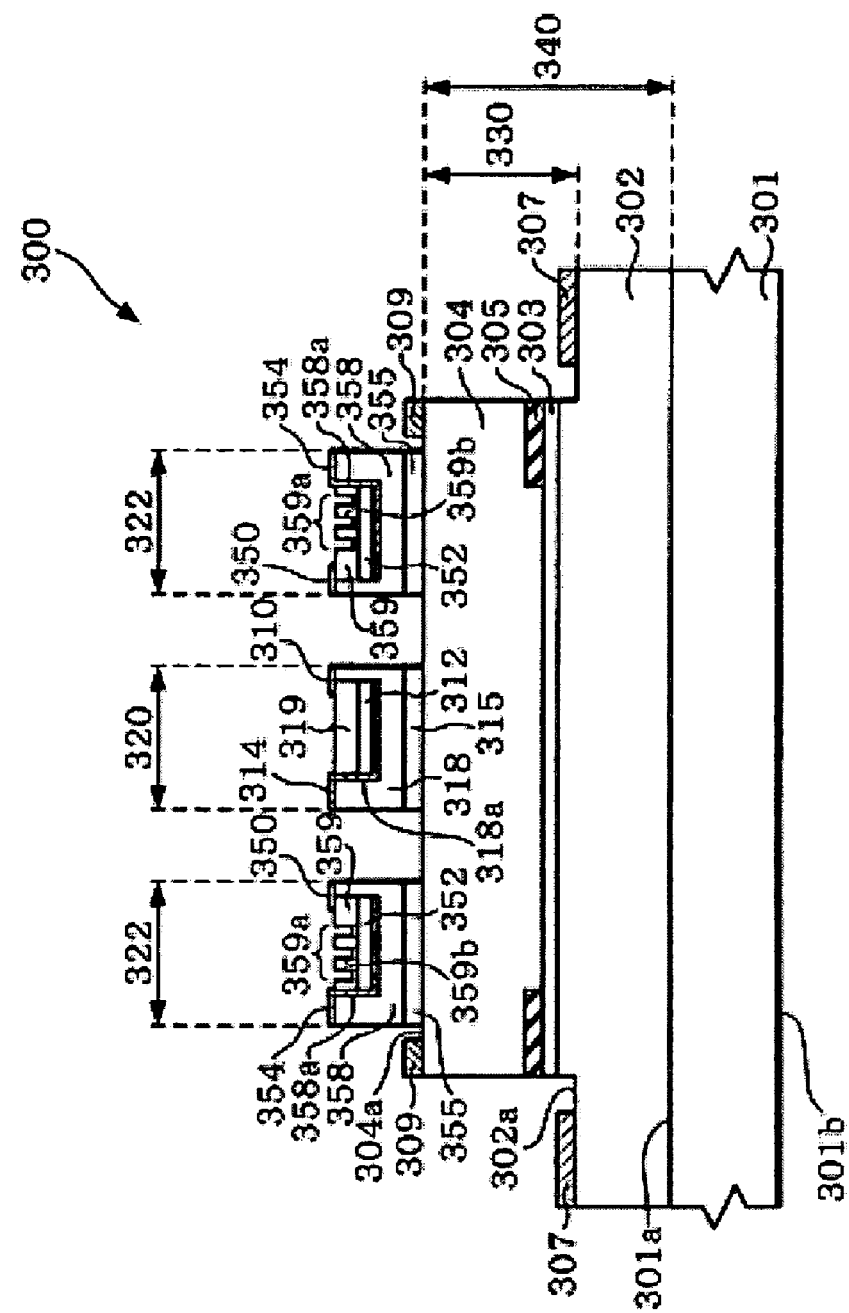
FIG. 27 is a cross-sectional view schematically showing a modified example of the optical element in accordance with the third embodiment of the invention.

Next, another modified example of the optical element 300 in accordance with the present embodiment is described. FIG. 27 is a cross-sectional view showing a modified example of the optical element 300 in accordance with the present embodiment. In its first optical detection section 322, a first charge transfer layer 359 is formed between the first photoabsorption layer 352 and the fourth electrode 350. The first charge transfer layer 359 is provided for transferring carriers generated in the photoabsorption action in the first photoabsorption layer 352 to the fourth electrode 350, when the carrier transfer capability is low in the first photoabsorption layer 352. Similarly, at the second optical detection section 320, a second charge transfer layer 319 is formed between the second photoabsorption layer 312 and the sixth electrode 310. Also, periodically arranged plural holes 359b are formed in the first charge transfer layer 359. By this, a photonic crystal section 359a can be formed in the first charge transfer layer 359, for distributing light incident upon the first optical detection section 322 in a plane of the first photoabsorption layer 352. It is noted that the first charge transfer layer 359 can also be formed between the first photoabsorption layer 352 and the third electrode 354, and the second charge transfer layer 319 can also be formed between the second photoabsorption layer 312 and the fifth electrode 314.

4. Fourth Embodiment 4-1. Structure of Optical Element

Figure 28:
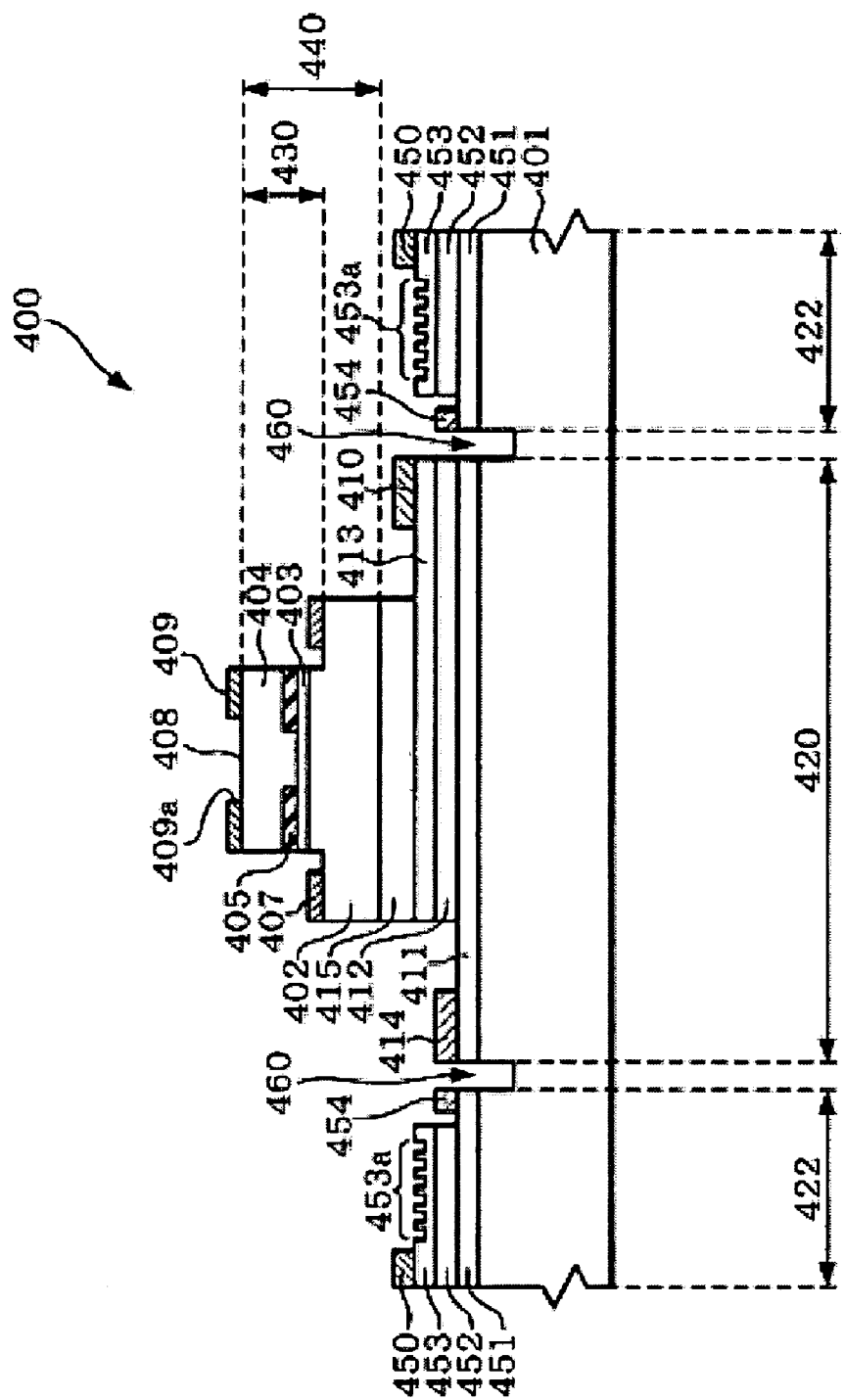
FIG. 28 is a cross-sectional view schematically showing an optical element in accordance with a fourth embodiment of the invention.
Figure 29:
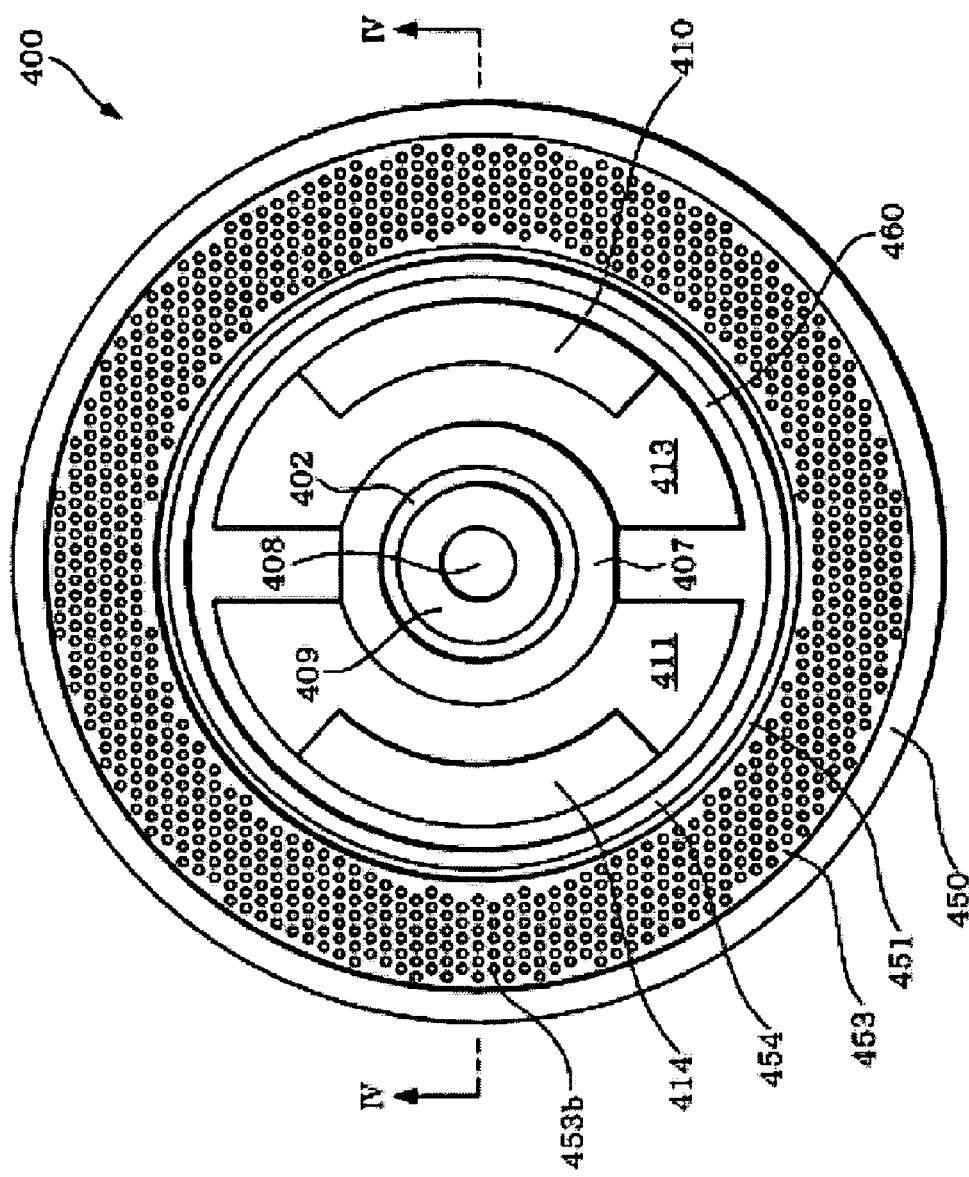
FIG. 29 is a plan view schematically showing the optical element in accordance with the fourth embodiment of the invention.

FIG. 28 is a cross-sectional view schematically showing an optical element 400 in accordance with a fourth embodiment of the invention. FIG. 29 is a plan view schematically showing the optical element 400 shown in FIG. 28. It is noted that FIG. 28 is a view showing a cross section taken along a line IV—IV of FIG. 29. In the optical element 400 in accordance with the present embodiment, a surface-emitting laser 440, a first optical detection section 422 and a second optical detection section 420 are formed at positions different from those of the optical element 100 in accordance with the first embodiment. In the optical element 400 in accordance with the present embodiment, constituting elements similar to the constituting elements "1xx" of the optical element 100 in accordance with the first embodiment are indicated as "4xx." In other words, because the reference numerals "4xx" refer to constituting elements similar to those indicated by "1xx" of the optical element 100 in accordance with the first embodiment, and the corresponding elements are basically made of similar materials, their detailed description is omitted.

The optical element 400 in accordance with the present embodiment includes, as shown in FIG. 28, a substrate 401, a surface-emitting laser 440, an isolation region 460, a second isolation layer 415, a first optical detection section 422, and a second optical detection section 420.

As the substrate 401, an insulating or semi-insulating substrate may be used. In the present embodiment, a semi-insulating undoped GaAs substrate is used.

In the optical element 400 in accordance with the present embodiment, the first optical detection section 422 and the second optical detection section 420 are formed on the substrate 401. As shown in FIG. 28 and FIG. 29, the isolation region 460 is formed between the first optical detection section 422 and the second optical detection section 420. More concretely, the isolation region 460 is a groove that is formed between the first optical detection section 422 and the second optical detection section 420 to the extent that it does not penetrate the substrate 401. The isolation region 460 electrically isolates the first optical detection section 422 from the second optical detection section 420.

In the optical element 400 in accordance with the present embodiment, the second isolation layer 415 is formed over the second optical detection section 420. The second isolation layer 415 is provided between the second optical detection section 420 and the surface-emitting laser 440. More concretely, as shown in FIG. 28, the second isolation layer 415 is provided between a fourth contact layer 413 and a first mirror 402.

The second isolation layer 415 has a plane configuration in a circular shape. In the illustrated example, the plane configuration of the second isolation layer 415 is the same as that of the first mirror 402. The plane configuration of the second isolation layer 415 can be formed larger than the plane configuration of the first mirror 402. The second isolation layer 415 is not particularly limited to any material as long as the material can electrically isolate the fourth contact layer 413 from the first mirror 402.

In the optical element 400 in accordance with the present embodiment, the surface-emitting laser 440 is provided on the second isolation layer 415. An aperture section 409a is provided in a second electrode 409. An upper surface of a second mirror 404 which is exposed through the aperture section 409a defines an emission surface 408 of a laser light. Accordingly, by appropriately setting the plane configuration and the size of the aperture section 409a, the configuration and the size of the emission surface 408 can be appropriately set. In the present embodiment, as shown in FIG. 29, a case in which the emission surface 408 is in a circular shape is presented.

In the optical element 400 in accordance with the present embodiment, an n-type third contact layer 411 and the p-type fourth contact layer 413 of the second optical detection section 420, and the n-type first mirror 402 and the p-type second mirror 404 of the surface-emitting laser 440 compose as a whole an npnp structure.

4-2 Operations of Optical Element

General operations of the optical element 400 in accordance with the present embodiment are described below. It is noted that the method of driving the optical element 400 described below is an example, and many modifications can be made without departing from the subject matter of the invention. Also, with respect to the aspects similar to those in the operations of the optical element 100 in accordance with the first embodiment, their description is basically omitted.

First, when a voltage is applied in a forward direction to the pin diode by the first electrode 407 and the second electrode 409, recombinations of electrons and holes occur in the active layer 403 of the surface-emitting laser 440, thereby causing emission of light due to the recombinations. Stimulated emission occurs during the period the generated light reciprocates between the second mirror 404 and the first mirror 402, whereby the light intensity is amplified. When the optical gain exceeds the optical loss, laser oscillation occurs, whereby laser light is emitted externally from the emission surface 408, and laser light enters the second isolation layer 415. A desired ratio between the laser light emitted from the emission surface 408 and the laser light incident upon the second isolation layer 415 can be obtained by appropriately setting, for example, the composition of each of the layers and the number of the layers composing the first mirror 402 and the second mirror 404. The laser light that is incident upon the second isolation layer 415 then enters the fourth contact layer 413 of the second optical detection section 420.

The light that has entered the fourth contact layer 413 is then incident upon the second photoabsorption layer 412 in the second optical detection section 420. A part of the incident light is absorbed by the second photoabsorption layer 412. As a result, photoexcitation occurs in the second photoabsorption layer 412, whereby electrons and holes are generated. Then, by an electric field applied externally of the element, the electrons migrate to the fifth electrode 414, and the holes migrate to the sixth electrode 410. As a result, at the second optical detection section 420, a current (a photoelectric current) occurs in a direction from the third contact layer 411 to the fourth contact layer 413. By measuring the value of the current, an optical output of the surface-emitting laser 440 can be detected.

4-3. Method for Manufacturing Optical Element

Next, an example of a method for manufacturing the optical element 400 in accordance with the fourth embodiment of the invention is described with reference to FIG. 28–FIG. 33. FIG. 30–FIG. 33 are cross-sectional views schematically showing a process for manufacturing the optical element 400 shown in FIG. 28 and FIG. 29, and correspond to the cross-sectional view shown in FIG. 28, respectively. It is noted that, as to the aspects similar to those of the first embodiment, their description is basically omitted.

Figure 30:
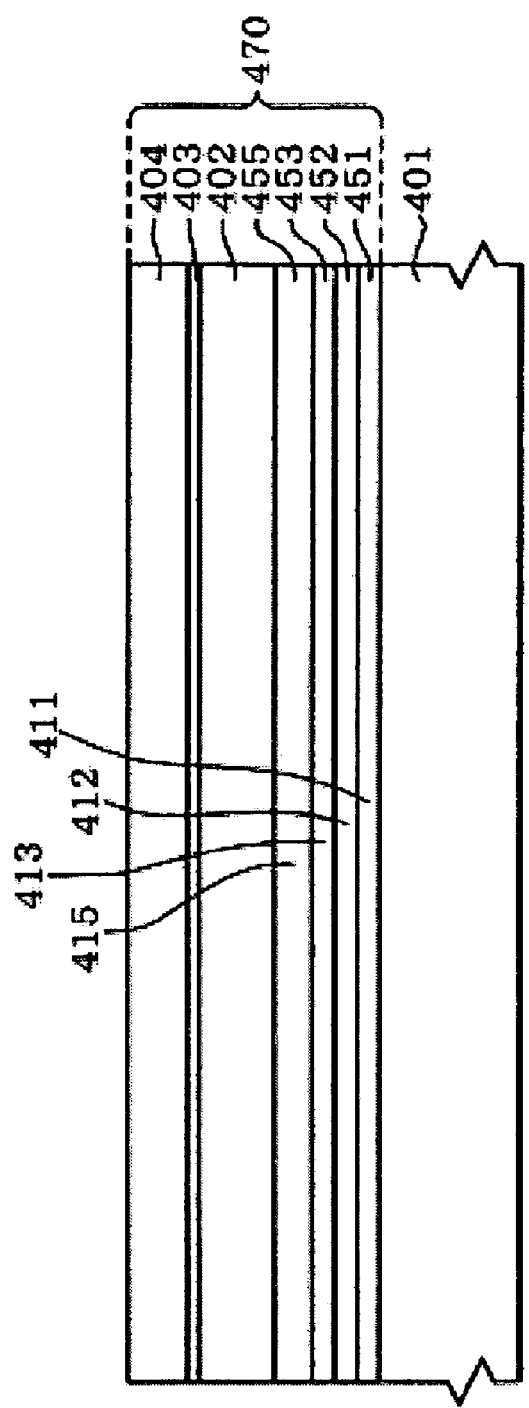
FIG. 30 is a cross-sectional view schematically showing a method for manufacturing the optical element in accordance with the fourth embodiment.

(1) First, on a surface 101a of a substrate 101 composed of an undoped GaAs layer, a semiconductor multilayer film 470 is formed by epitaxial growth while modifying its composition, as shown in FIG. 30. It is noted here that the semiconductor multilayer film 470 may be formed from, for example, a first contact layer 451 and a third contact layer 411, each composed of an n-type GaAs layer, a first photoabsorption layer 452 and a second photoabsorption layer 412, each composed of a GaAs layer without an impurity doped, a second contact layer 453 and a fourth contact layer 413, each composed of a p-type GaAs layer, a second isolation layer 415 composed of an AlGaAs layer without an impurity doped, a first mirror 402 of 40 pairs of alternately laminated n-type $Al_{0.9}Ga_{0.1}As$ layers and n-type $Al_{0.15}Ga_{0.85}As$ layers, an active layer 403 composed of GaAs well layers and $Al_{0.3}Ga_{0.7}As$ barrier layers in which the well layers include a quantum well structure composed of three layers, and a second mirror 404 of 25 pairs of alternately laminated p-type $Al_{0.9}Ga_{0.1}As$ layers and p-type $Al_{0.15}Ga_{0.8}As$ layers. These layers are successively laminated on the substrate 401 to thereby form the semiconductor multilayer film 470.

As the second isolation layer 415, a layer with an etching rate to an etchant used for etching the second contact layer 453 and the fourth contact layer 413 that is smaller than the etching rate of the second contact layer 453 and the fourth contact layer 413 to the etchant can be used. More concretely, for example, the second isolation layer 415 can be composed of an AlGaAs layer with an Al composition greater than the Al composition of the second contact layer 453 and the fourth contact layer 413. In this case, the Al composition of the second contact layer 453 and the fourth contact layer 413 can be made smaller, such that ohmic contact between the second contact layer 453 and a fourth electrode 450 and ohmic contact between the fourth contact layer 413 and a sixth electrode 410 can be readily made.

Figure 31:
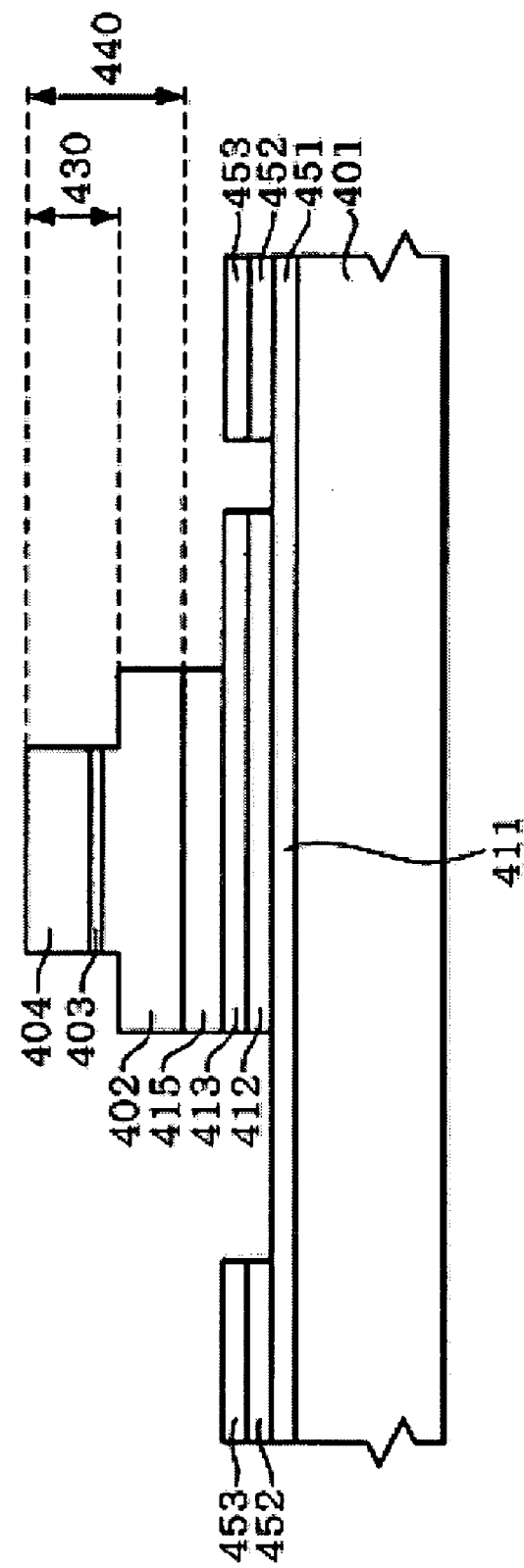
FIG. 31 is a cross-sectional view schematically showing the method for manufacturing the optical element in accordance with the fourth embodiment.

As the second isolation layer 415, a layer with an etching rate to an etchant used for etching the second isolation layer 415 that is greater than the etching rate of the first contact layer 451 and the third contact layer 411 to the etchant can be used. More concretely, for example, the second isolation layer 415 can be composed of an AlGaAs layer with an Al composition greater than the Al composition of the first contact layer 451 and the third contact layer 411. In this case, the Al composition of the first contact layer 451 and the third contact layer 411 can be made smaller, such that ohmic contact between the first contact layer 451 and a third electrode 454, and ohmic contact between the third contact layer 411 and a fifth electrode 414 be readily obtained. (2) Next, as shown in FIG. 31, the second mirror 404, the active layer 403, the first mirror 402, the second isolation layer 415, the second contact layer 453, the fourth contact layer 413, the first photoabsorption layer 452 and the second photoabsorption layer 412 are patterned. The patterning can be conducted in a manner similar to the process conducted in manufacturing the optical element 100 in accordance with the first embodiment described above.

Figure 32:
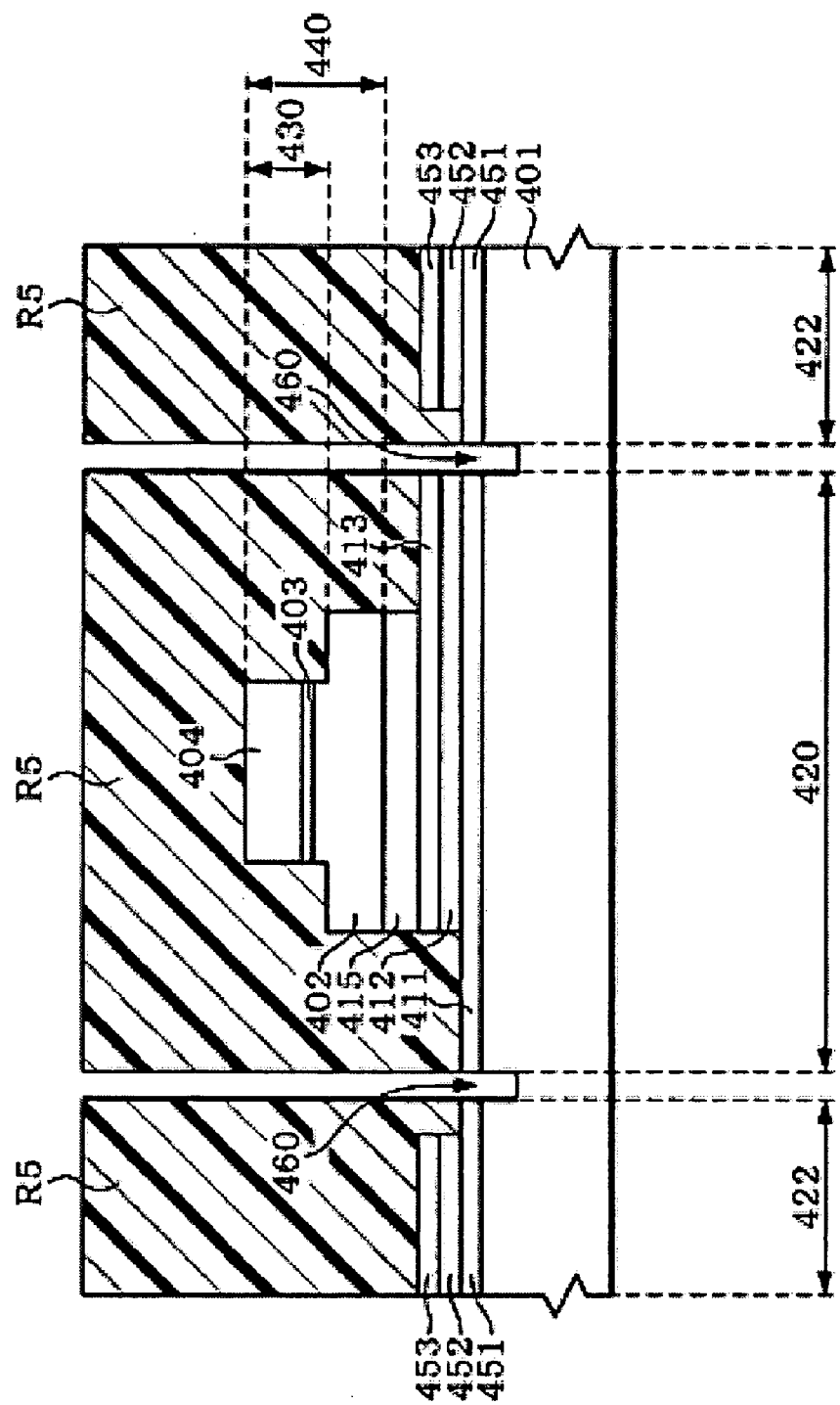
FIG. 32 is a cross-sectional view schematically showing the method for manufacturing the optical element in accordance with the fourth embodiment.

(3) Next, as shown in FIG. 32, a resist layer R5 is formed in areas other than the forming region of the isolation region 460 (see FIG. 28 and FIG. 29). Next, by using the resist layer R5 as a mask, the first contact layer 451 and the third contact layer 411 are etched. By this, the first contact layer 451 and the third contact layer 411 are patterned. Further, by using the resist layer R5 as a mask, the substrate 401 is etched by, for example, a dry etching method. By this, the isolation region 460 is formed. Then, the resist layer R5 is removed.

Figure 33:
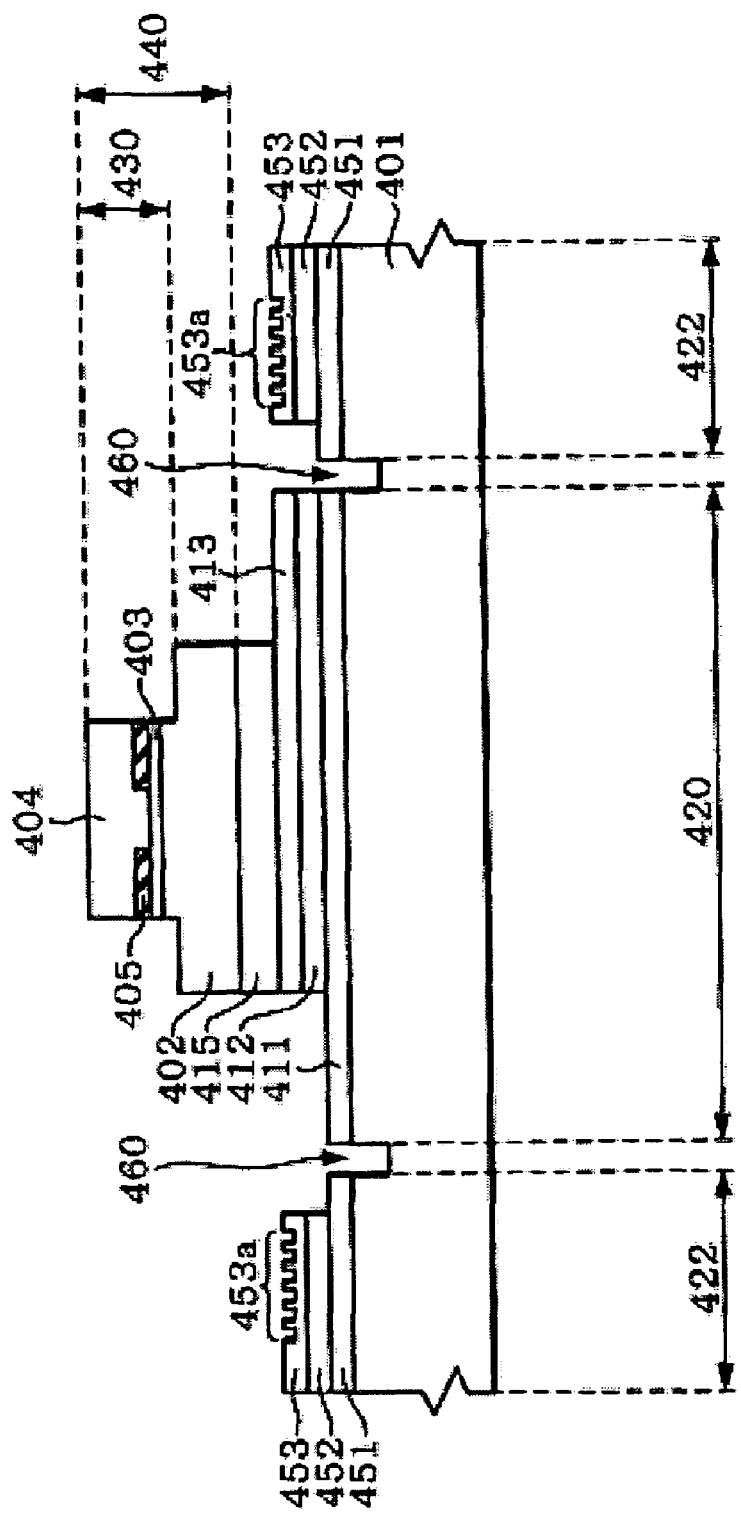
FIG. 33 is a cross-sectional view schematically showing the method for manufacturing the optical element in accordance with the fourth embodiment.

(4) Next, as shown in FIG. 33, an oxidized constricting layer 405 and a photonic crystal section 453a in an upper section of the second contact layer 453 are formed.

(5) Next, as shown in FIG. 28 and FIG. 29, a first electrode 407, a second electrode 409, a third electrode 454, a fourth electrode 450, a fifth electrode 414 and a sixth electrode 410 are formed.

By the steps described above, as shown in FIG. 28 and FIG. 29, the optical element 400 in accordance with the present embodiment is obtained.

4-4. Action and Effect

The optical element 400 of the present embodiment achieves substantially the same actions and effects as the actions and effects described above in conjunction with the first embodiment.

Furthermore, according to the optical element 400 of the present embodiment, the first optical detection section 422 or the second optical detection section 420 is not formed above the emission surface 408 of laser light. Accordingly, the output of laser light emitted from the emission surface 408 is not reduced by the first optical detection section 422 and the second optical detection section 420. In other words, according to the optical element 400 in accordance with the present embodiment, laser light can be effectively emitted outside.

5. Fifth Embodiment

Figure 34:
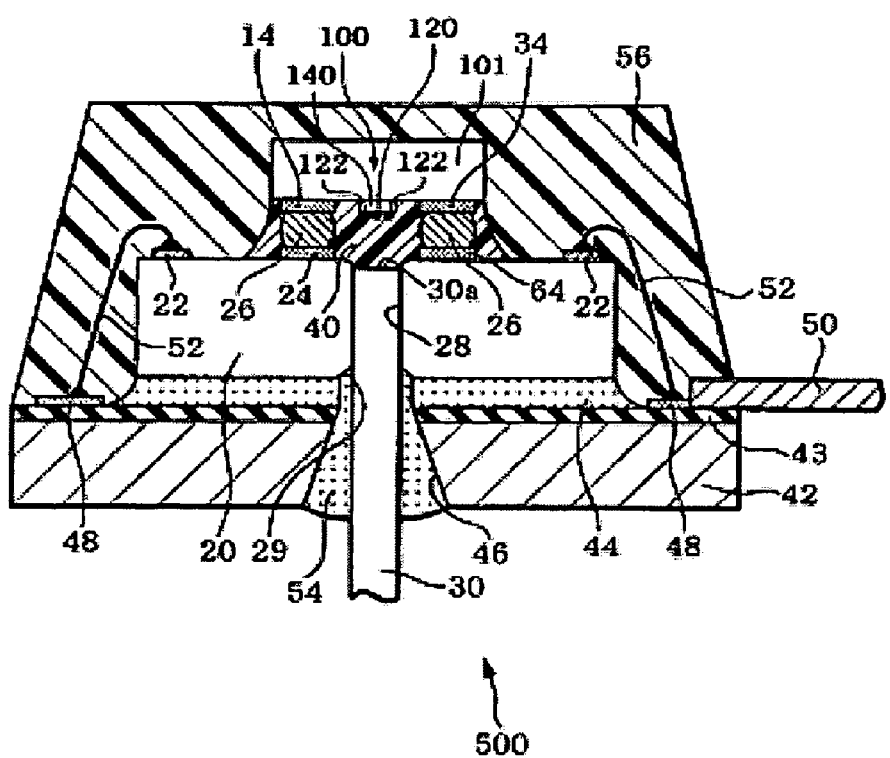
FIG. 34 is a view schematically showing an optical module in accordance with a fifth embodiment of the invention.

FIG. 34 is a cross-sectional view schematically showing an optical module 500 in accordance with a fifth embodiment of the invention. The optical module 500 includes an optical element 100 in accordance with the first embodiment (see FIG. 1 and FIG. 2), a semiconductor chip 20, and an optical waveguide (i.e., an optical fiber) 30. It is noted that the illustration of the optical element 100 is simplified in FIG. 34. It is noted that, in the optical module 500 of the present embodiment, similar actions and effects can be achieved, even when any one of the other optical elements according to the other embodiments described above is used instead of the optical element 100 of the first embodiment. This similarly applies to sixth and seventh embodiments to be described below.

5-1. Structure of Optical Module

The optical element 100 is in a state in which its position relative to an end face 30a of the optical fiber 30 is fixed. More specifically, the upper surface of the second contact layer 153 of the first optical detection section. 122 and the upper surface of the fourth contact layer 113 of the second optical detection section 120 oppose to the end face 30a of the optical fiber 30.

The semiconductor chip 20 is provided for driving the optical element 100. In other words, the semiconductor chip 20 is provided with a built-in circuit for driving the optical element 100. The semiconductor chip 20 includes a plurality of electrodes (or pads) 22 formed therein that are electrically connected to the internal circuit. Wiring patterns 24 and 64, which are electrically connected to at least one of the electrodes 22, may preferably be formed on a surface where the electrodes 22 are formed.

The semiconductor chip 20 and the optical element 100 are electrically connected with each other. For example, a wiring pattern 14 and the wiring pattern 24 formed on the semiconductor chip 20 are electrically connected with one another through solder 26. The wiring pattern 14 is electrically connected to the first electrode 107 of the optical element 100 (not shown in FIG. 34). Also, the wiring pattern 34 is electrically connected to the wiring pattern 64 formed on the semiconductor chip 20 through solder 26. The wiring pattern 34 is electrically connected to the second electrode 109 (not shown in FIG. 34) of the optical element 100. Also, the third electrode 154, the fourth electrode 150, the fifth electrode 114 and the sixth electrode 110 (not shown in FIG. 34) of the optical element 100 are electrically connected to wiring patterns (not shown).

The optical element 100 can be face-down mounted on the semiconductor chip 20. By so doing, the solder 26 not only provides electrical connection, but also fixes the optical element 100 and the semiconductor chip 20 together. It is noted that, for connection between the wiring patterns 14 and the wiring patterns 24, and between the wiring patterns 34 and the wiring patterns 64, wires or conductive paste may be used.

An underfill material 40 may be provided between the optical element 100 and the semiconductor chip 20. When the underfill material 40 covers the upper surface of the optical element 100, the underfill material 40 may preferably be transparent. The underfill material 40 covers and protects electrical connection sections between the optical element 100 and the semiconductor chip 20, and also protects the surfaces of the optical element 100 and the semiconductor chip 20. Furthermore, the underfill material 40 maintains the connected state between the optical element 100 and the semiconductor chip 20.

An aperture (for example, a through hole) 28 may be formed in the semiconductor chip 20. The optical fiber 30 is inserted in the aperture 28. The aperture 28 is formed extending from the surface where the electrodes 22 are formed to the opposite surface, while avoiding the internal circuit. A taper 29 may preferably be formed at an edge section of at least one of openings of the aperture 28. By forming the taper 29, the optical fiber 30 can be readily inserted in the aperture 28.

The semiconductor chip 20 may be attached to a supporting substrate 42. More concretely, the semiconductor chip 20 may be attached to the supporting substrate 42 through adhesive 44. An aperture 46 is formed in the supporting substrate 42. The aperture 46 in the supporting substrate 42 is formed at a position that connects to the aperture 28 of the semiconductor chip 20. The adhesive 44 that bonds the semiconductor chip 20 and the supporting substrate 42 is provided in a manner not to disturb the continuation of the two apertures 28 and 46 and not to block them. The aperture 46 in the supporting substrate 42 has a tapered configuration such that its inner diameter becomes greater in an opposite direction to the semiconductor chip 20. By this, the optical fiber 30 can be readily inserted.

The supporting substrate 42 may be formed from a material that is nonconductive, such as, resin, glass, ceramics or the like, but may be formed from a material that is conductive, such as, metal or the like. When the supporting substrate 42 is formed from a conductive material, a dielectric film 43 may preferably be formed at least on the surface of the supporting substrate 42 to which the semiconductor chip 20 is attached. It is noted that a material similar to that of the supporting substrate 42 can also be used in embodiments to be described below.

Also, the supporting substrate 42 may preferably have a high thermal conductivity. By this, the supporting substrate 42 promotes emanation of heat of at least one of the optical element 100 and the semiconductor chip 20. In this case, the supporting substrate 42 functions as a heat sink or a heat spreader. In the present embodiment, the supporting substrate 42 is adhered to the semiconductor chip 20, and therefore can directly cool the semiconductor chip 20. It is noted that the adhesive 44 that bonds the semiconductor chip 20 and the supporting substrate 42 may preferably have a high thermal conductivity. Furthermore, as the semiconductor chip 20 is cooled, the optical element 100 connected to the semiconductor chip 20 is also cooled.

The supporting substrate 42 is provided with wiring patterns 48. Also, the supporting substrate 42 is provided with external terminals 50. In the present embodiment, the external terminals 50 are leads. The wiring patterns 48 that are formed on the supporting substrate 42 are electrically connected, for example, through wires 52, to the electrodes 22 of the semiconductor chip 20 and at least one of the wiring patterns 24 and 64 formed on the semiconductor chip 20. Also, the wiring patterns 48 may be electrically connected to the external terminals 50.

The optical fiber 30 is inserted in the aperture 28 of the semiconductor chip 20. Also, the optical fiber 30 is passed through the aperture 46 of the supporting substrate 42. The inner diameter of the aperture 46 gradually reduces toward the aperture 28 of the semiconductor chip 20, and the inner diameter of the aperture 46 is greater than that of the optical fiber 30 on the surface opposite to the semiconductor chip 20. A gap between the optical fiber 30 and the inner surface of the aperture 46 may preferably be filled with a filler material 54 such as resin. The filler material 54 also has a function to fix and prevent the optical fiber 30 from slipping out.

The optical fiber 30 may be a single mode fiber, or a multiple mode fiber. When the optical element 100 emits light of a multiple mode, a multiple mode fiber may be used as the optical fiber 30, such that light emitted from the optical element 100 can be securely introduced into the optical fiber 30.

Also, in the optical module 500 of the present embodiment, the optical element 100 and the semiconductor chip 20 are sealed with resin 56. The resin 56 also seals electrically connected sections between the optical element 100 and the semiconductor chip 20 and electrically connected sections between the semiconductor chip 20 and the wiring patterns 48 formed on the supporting substrate 42.

As described above in the first embodiment, the first optical detection section 122 of the optical element 100 functions as an optical detection element for reception in two-way communications. In other words, the first optical detection section 122 detects light that is emitted from the end face 30a of the optical fiber 30. More concretely, light emitted from the end face 30a of the optical fiber 30 enters the first photoabsorption layer 152 of the first optical detection section 122, and is converted to electric current. By the electrical signals thus obtained, optical signals from an external device (hereafter also referred to as an "external device") optically connected to the optical element 100 through the optical fiber 30 can be detected. The external device may be any one of the optical elements in accordance with the first-fourth embodiments.

Also, laser light emitted from the surface-emitting laser 140 of the optical element 100 enters the end face 30a of the optical fiber 30. Then, the laser light propagates within the optical fiber 30, and reaches the external device. In other words, optical signals outputted from the optical element 100 can be inputted in the external device.

Accordingly, two-way optical communications can be conducted by the first optical detection section 122 and the surface-emitting laser 140 of the optical element 100. It is noted that the second optical detection section 120 of the optical element 100 functions as an optical detection element for monitoring for the surface-emitting laser 140, which is described above in the first embodiment.

6. Sixth Embodiment

Figure 35:
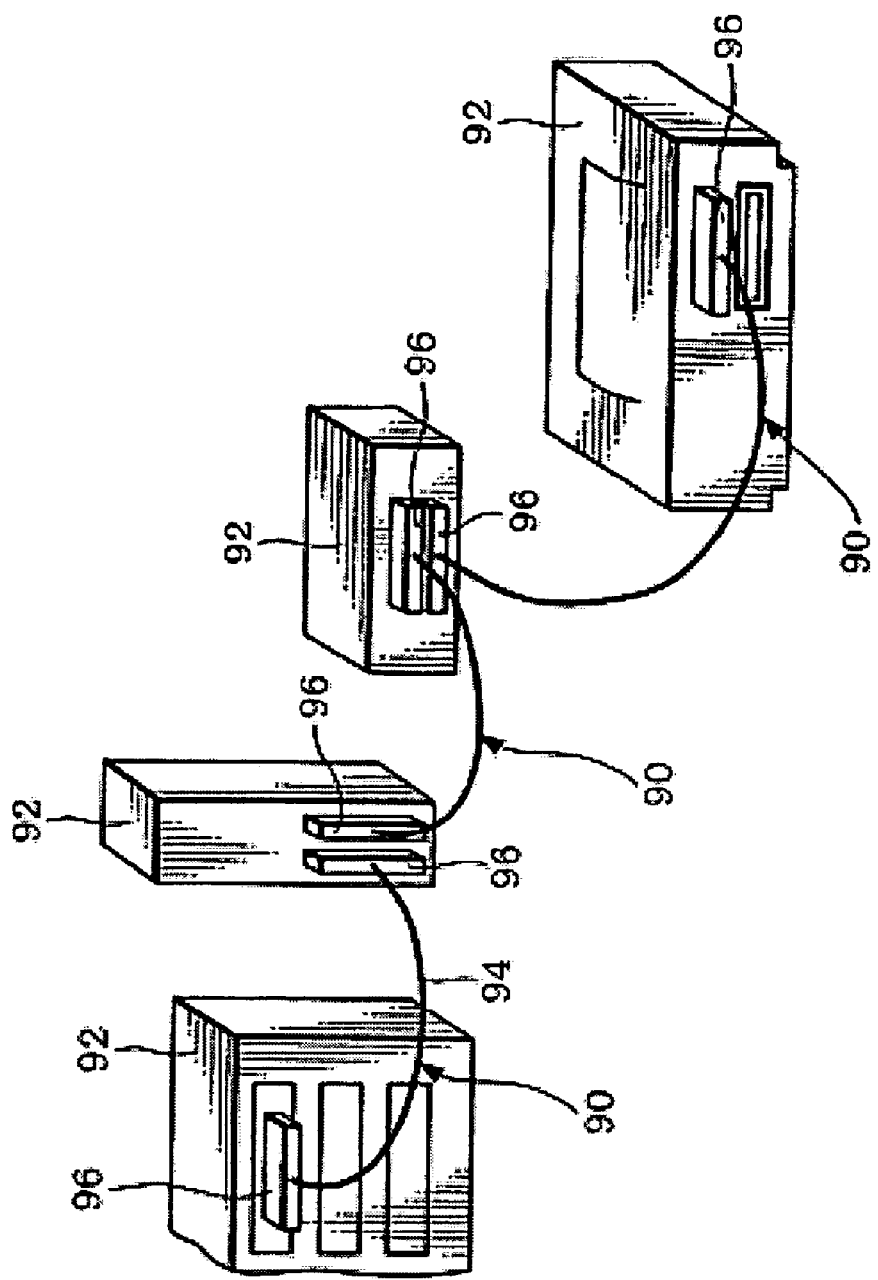
FIG. 35 is a view schematically showing an optical transmission device in accordance with a sixth embodiment of the invention.

FIG. 35 is a diagram showing optical transmission devices in accordance with a sixth embodiment of the present invention. The optical transmission devices 90 mutually connect electronic devices 92, such as, computers, display devices, storage devices, printers and the like. The electronic devices 92 may be information communication devices. Each of the optical transmission devices 90 may include a cable 94 and plugs 96 provided on both sides of the cable 94. The cable 94 includes an optical fiber 30 (see FIG. 34) of an optical module 500. The plug 96 includes the optical fiber 30 of the optical module 500 and an optical coupling section built therein to be connected to the optical element 100. It is noted that the optical fiber 30 is provided inside the cable 94, and the optical element 100 is provided inside the plug 96, and therefore they are not shown in the figure. The optical fiber 30 and the optical element 100 are attached in a manner described in the fifth embodiment.

An optical element 100 of the first embodiment is provided at one end of the optical fiber 30, and another optical element 100 of the first embodiment (hereafter referred to as the "other optical element 100") is provided at the other end of the optical fiber 30. Electrical signals outputted from the electronic device 92 on one end are converted by the surface-emitting laser 140 of the optical element 100 into optical signals. The optical signals are transmitted through the optical fiber 30 and inputted in the other optical element 100. The first optical detection section 122 of the other optical element 100 converts the inputted optical signals into electrical signals, and then provides the electrical signals to the electronic device 92 on the other end.

As described above, with the optical transmission device 90 of the present embodiment, data can be transmitted among the electronic devices 92 by optical signals.

7. Seventh Embodiment

Figure 36:
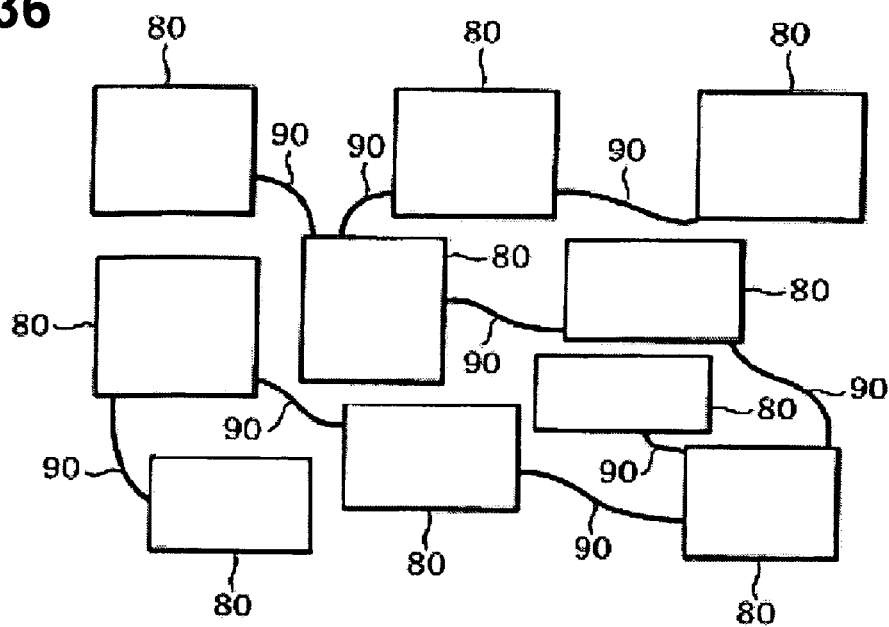
FIG. 36 is a view schematically showing a usage configuration of an optical transmission device in accordance with a seventh embodiment of the invention.

FIG. 36 is a diagram showing a usage configuration of optical transmission devices in accordance with a seventh embodiment of the present invention. Optical transmission devices 90 connect electronic devices 80. The electronic devices 80 include liquid crystal display monitors, digital CRTs (which may be used in the fields of finance, mail order, medical treatment, and education), liquid crystal projectors, plasma display panels (PDP), digital TVs, cash registers of retail stores (for POS (Point of Sale) scanning), videos, tuners, gaming devices, printers and the like.

The embodiments of the invention are described above in detail. However, those skilled in the art should readily understand that many modifications can be made without substantially departing from the novel matter and effects of the invention. Accordingly, those modified examples are also included in the scope of the invention.

For example, in the embodiments described above, the photonic crystal section is formed from periodically arranged holes or grooves. However, without being limited to this, for example, a photonic crystal section may be realized by causing a refractive index distribution by periodic arrangement of columnar protrusions.

Also, for example, depending on the layer structure adopted for each optical element, the electrodes may be interchanged.

Also, for example, in the optical element 100 in accordance with any one of the embodiments described above, a surface-emitting laser 140 having a single columnar section 130 is described. However, the embodiments of the present invention would not be harmed if a surface-emitting laser 140 has plural columnar sections 130 or no columnar section 130. Also, similar functions and effects are obtained even when plural optical elements 100 are provided in an array.

Also, it should be noted that, for example, interchanging the p-type and n-type characteristics of each of the semiconductor layers in the above described embodiments does not deviate from the subject matter of the invention. For the surface-emitting lasers 140 according to the embodiments described above, the description is made as to an AlGaAs type. However, depending on the oscillation wavelength, other materials, such as, for example, AlGaP type, GaInP type, ZnSSe type, InGaN type, AlGaN type, InGaAs type, GaInNAs type, GaAsSb type, and like semiconductor materials can be used. Also, for the first optical detection section 122 and the second optical detection section 120 in accordance with the embodiments described above, the description is made as to a GaAs type. However, depending on the wavelength of incident light, other materials, such as, for example, Si type, Ge type, GaAs type, InGaAs type, HgCdTe type, and like semiconductor materials can be used.

What is claimed is:

1. An optical element comprising:
   a substrate;
   a surface-emitting type semiconductor laser that is provided above the substrate and includes a first mirror, an active layer and a second mirror formed in this order from the substrate;
   a first optical detection section that is formed above the substrate;
   a second optical detection section that is formed above the substrate and has a second photoabsorption layer; and
   an isolation layer formed between the surface-emitting type semiconductor laser and at least one of the first optical detection section and the second optical detection section, wherein
   the first optical detection section includes a first photoabsorption layer formed above the substrate and a photonic crystal section formed above or below the first photoabsorption layer,
   the photonic crystal section has one of a one-dimensional and a two-dimensional photonic crystal structure having a periodic refractive index distribution in a plane that intersects a direction of light incident upon the first optical detection section, wherein at least a part of the light incident upon the first optical detection section is distributed in a plane of the first photoabsorption layer and propagates therein.

2. An optical element according to claim 1, wherein the first optical detection section includes a first contact layer formed below the first photoabsorption layer, and a second contact layer formed above the photoabsorption layer, wherein the first photoabsorption layer is formed from a semiconductor and the second conductive layer has the photonic crystal section.

3. An optical element according to claim 1, wherein the first optical detection section includes a base section that is formed below the first photoabsorption layer and has a concave section, a first electrode formed at least inside the concave section, a second electrode formed above the first photoabsorption layer, and a charge transfer layer formed at least one of spaces between the first electrode and the first photoabsorption layer and between the second electrode and the first photoabsorption layer, wherein the first photoabsorption layer is formed from an organic material, and the charge transfer layer has the photonic crystal section.

4. An optical element according to claim 1, wherein the first optical detection section is formed above the second mirror, and the second optical detection section is formed above the second mirror.

5. An optical element according to claim 1, further comprising an isolation layer formed between the first optical detection section and the second optical detection section, wherein the surface-emitting type semiconductor laser is formed above the second optical detection section, the isolation layer is formed between the surface-emitting type semiconductor laser and the second optical detection section, the first optical detection section functions as a photodetecting element for reception for two-way communications, and the second optical detection section functions as a photodetecting element for monitoring for the surface-emitting type semiconductor laser.

6. An optical element according to claim 1, wherein the photonic crystal section has at least one of grooves, holes and columnar protrusions that are periodically arranged.

7. An optical element according to claim 1, wherein the second optical detection section includes another photonic crystal section that is formed above or below the second photoabsorption layer, wherein the other photonic crystal section has one of a one-dimensional and a two-dimensional photonic crystal structure having a periodic refractive index distribution in a plane that intersects a direction of light incident upon the second optical detection section, wherein at least a part of the light incident upon the second optical detection section is distributed in a plane of the second photoabsorption layer and propagates therein.

8. An optical element according to claim 7, wherein the second optical detection section includes a third contact layer formed below the second photoabsorption layer, and a fourth contact layer formed above the second photoabsorption layer, wherein the second photoabsorption layer is formed from a semiconductor, and the third contact layer has the other photonic crystal section.

9. An optical element according to claim 7, wherein the second optical detection section further include a base section that is formed below the second photoabsorption layer and has a concave section, a third electrode formed at least inside the concave section, a fourth electrode formed above the second photoabsorption layer, and a charge transfer layer formed in at least one of spaces between the third electrode and the second photoabsorption layer and between the fourth electrode and the second photoabsorption layer, wherein the second photoabsorption layer is formed from an organic material, and the charge transfer layer has the photonic crystal section.

10. An optical element according to claim 7, wherein the other photonic crystal section has at least one of grooves, holes and columnar protrusions that are periodically arranged.

11. An optical element according to claim 1, wherein the second photoabsorption layer has another photonic crystal section, the other photonic crystal section having one of a one-dimensional and a two-dimensional photonic crystal structure having a periodic refractive index distribution in a plane that intersects a direction of light incident upon the second optical detection section, wherein at least a part of the light incident upon the second optical detection section is distributed in a plane of the second photoabsorption layer and propagates therein.

12. An optical element according to claim 11, wherein the second optical detection section includes a base section that is formed below the second photoabsorption layer and has a concave section, a third electrode formed at least inside the concave section, and a fourth electrode formed above the second photoabsorption layer, wherein the concave section has a bottom surface with a plurality of protruded sections that are periodically arranged, and the second photoabsorption layer is formed from an organic material to cover the plurality of protruded sections.

13. An optical element according to claim 1, further comprising at least one of a first optical reflection layer that is formed above or below the first photoabsorption layer on a side opposite to a side in which light is incident upon the first photoabsorption layer and a second optical reflection layer that is formed above or below the second photoabsorption layer on a side opposite to a side in which light is incident upon the second photoabsorption layer, wherein the first optical reflection layer is a laminate layer that is composed of a plurality of semiconductor layers having different refractive indexes and can reflect light that passes through the first photoabsorption layer, and the second optical reflection layer is a laminate layer that is composed of a plurality of semiconductor layers having different refractive indexes and can reflect light that passes through the second photoabsorption layer.

14. An optical element according to claim 1, further comprising at least one of a first non-reflecting coat layer that is formed above or below the first photoabsorption layer on a side where light is incident upon the first photoabsorption layer, and a second non-reflecting coat layer that is formed above or below the second photoabsorption layer on a side where light is incident upon the second photoabsorption layer.

15. An optical element according to claim 1, further comprising a lens section formed by a droplet discharge method above at least one of the first optical detection section and the second optical detection section.

16. An optical module comprising the optical element according to claim 1, and an optical waveguide.

17. An optical transmission comprising the optical module according to claim 16.

18. An optical element comprising:

a substrate;

a surface-emitting type semiconductor laser that is provided above the substrate and includes a first mirror, an active layer and a second mirror formed in this order from the substrate;

a first optical detection section that is formed above the substrate and has a first photoabsorption layer;

a second optical detection section that is formed above the substrate and has a second photoabsorption layer; and an isolation layer formed between the surface-emitting type semiconductor laser and at least one of the first optical detection section and the second optical detection section, wherein the first optical detection section has a photonic crystal section, the photonic crystal section has one of a one-dimensional and a two-dimensional photonic crystal structure having a periodic refractive index distribution in a plane that intersects a direction of light incident upon the first optical detection section, wherein at least a part of the light incident upon the first optical detection section is distributed in a plane of the first photoabsorption layer and propagates therein.

19. An optical element according to claim 18, wherein the first optical detection section includes a base section that is formed below the first photoabsorption layer and has a concave section, a first electrode formed at least inside the concave section, and a second electrode formed above the first photoabsorption layer, wherein the concave section has a bottom surface with a plurality of protruded sections that are periodically arranged, and the first photoabsorption layer is formed from an organic material.

* * * * *